(12) United States Patent  
Lee et al.

(10) Patent No.: US 11,158,831 B2
(45) Date of Patent: Oct. 26, 2021

(54) ORGANIC LIGHT-EMITTING DEVICE

(71) Applicant: Samsung Display Co., Ltd., Yongin-si (KR)

(72) Inventors: Jaehyun Lee, Yongin-si (KR); Mikyung Kim, Yongin-si (KR); Seunggak Yang, Yongin-si (KR); Jiwon Kwak, Yongin-si (KR); Namwoo Kim, Yongin-si (KR); Byounghee Park, Yongin-si (KR); Hanbyul Jang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/560,272

(22) Filed: Sep. 4, 2019

(65) Prior Publication Data
US 2020/0274087 A1 Aug. 27, 2020

(30) Foreign Application Priority Data

Feb. 22, 2019 (KR) .................. 10-2019-0021338

(51) Int. Cl.
H01L 51/52 (2006.01)
H01L 51/50 (2006.01)

(52) U.S. Cl.
CPC ........ H01L 51/504 (2013.01); H01L 51/5056 (2013.01); H01L 51/5072 (2013.01);
(Continued)

(58) Field of Classification Search
CPC ........... H01L 2251/552; H01L 51/0072; H01L 51/0067; H01L 51/0058; H01L 51/5012; H01L 51/0059; H01L 2251/308; H01L 51/504; H01L 51/5092; H01L 51/5072; H01L 51/5221; H01L 51/5056; H01L 51/5206; H01L 51/5096; H01L 51/0061; H01L 51/0052; H01L 51/0085; H01L 51/5016; H01L 2251/5384; H01L 51/5004
See application file for complete search history.

(56) References Cited

U.S. PATENT DOCUMENTS 4,885,211 A * 12/1989 Tang ...................... C09K 11/06
428/457
5,151,629 A * 9/1992 VanSlyke ............... C07F 5/069
252/301.16

(Continued)

FOREIGN PATENT DOCUMENTS

KR 10-2007-0033390 A 3/2007
KR 10-2016-0074376 A 6/2016

(Continued)

Primary Examiner — Mary A Wilczewski
Assistant Examiner — Tsz K Chiu
(74) Attorney, Agent, or Firm — Lewis Roca Rothgerber Christie LLP

(57) ABSTRACT

An organic light-emitting device is provided. The organic light-emitting device includes: an anode; a cathode; and an organic layer between the anode and the cathode and including an emission layer, wherein the emission layer includes a first emission layer including a first host, a second host, and a first dopant, and a second emission layer including a third host, a fourth host, and a second dopant, and the organic light-emitting device satisfies Equations 1 and 2.

18 Claims, 4 Drawing Sheets

(52) U.S. Cl.
CPC ...... *H01L 51/5092* (2013.01); *H01L 51/5206* (2013.01); *H01L 51/5221* (2013.01)

(56) References Cited

U.S. PATENT DOCUMENTS

| | | | | |
|---|---|---|---|---|
| 5,955,836 | A * | 9/1999 | Boerner | C09K 11/06 313/503 |
| 6,285,039 | B1 * | 9/2001 | Kobori | C09K 11/06 257/103 |
| 6,824,895 | B1 * | 11/2004 | Sowinski | C09K 11/06 313/504 |
| 7,288,330 | B2 | 10/2007 | Hatwar et al. | |
| 8,247,804 | B2 * | 8/2012 | Seo | H01L 51/5076 257/40 |
| 8,330,351 | B2 * | 12/2012 | Adamovich | H01L 51/5016 313/504 |
| 8,344,365 | B2 * | 1/2013 | Kim | H01L 51/0067 257/40 |
| 8,384,070 | B2 * | 2/2013 | Kishino | H05B 33/14 257/40 |
| 8,461,572 | B2 * | 6/2013 | Katayama | H01L 51/5048 257/40 |
| 8,476,822 | B2 * | 7/2013 | D'Andrade | H01L 51/0085 313/504 |
| 8,486,543 | B2 * | 7/2013 | Seo | H01L 51/0052 428/690 |
| 8,790,795 | B2 * | 7/2014 | Iwawaki | H01L 51/0058 428/690 |
| 8,932,733 | B2 * | 1/2015 | Gao | C09B 6/00 428/690 |
| 9,028,978 | B2 * | 5/2015 | Kim | C07D 209/86 428/690 |
| 9,306,175 | B2 * | 4/2016 | Yokoyama | C07D 209/86 |
| 10,003,038 | B2 | 6/2018 | Han et al. | |
| 10,020,458 | B2 | 7/2018 | Cho et al. | |
| 2007/0046189 | A1 * | 3/2007 | Hatwar | H01L 51/5278 313/506 |
| 2008/0203406 | A1 * | 8/2008 | He | H01L 51/0062 257/94 |
| 2009/0166670 | A1 * | 7/2009 | Park | C07D 401/04 257/103 |
| 2010/0059741 | A1 * | 3/2010 | Ohsawa | H01L 51/5016 257/40 |
| 2010/0301383 | A1 * | 12/2010 | Shitagaki | H01L 51/506 257/103 |
| 2011/0114928 | A1 * | 5/2011 | Suzuki | H01L 51/0074 257/40 |
| 2014/0061601 | A1 * | 3/2014 | Kim | H01L 51/0067 257/40 |
| 2016/0141542 | A1 * | 5/2016 | Sun | H01L 51/5278 257/40 |
| 2019/0013490 | A1 | 1/2019 | Cho et al. | |

FOREIGN PATENT DOCUMENTS

| | | |
|---|---|---|
| KR | 10-2017-0038324 A | 4/2017 |
| KR | 10-2018-0055679 A | 5/2018 |
| KR | 10-2018-0099487 A | 9/2018 |

* cited by examiner

ORGANIC LIGHT-EMITTING DEVICE

CROSS-REFERENCE TO RELATED APPLICATION

This application claims priority to and the benefit of Korean Patent Application No. 10-2019-0021338, filed on Feb. 22, 2019, in the Korean Intellectual Property Office, the entire content of which is incorporated herein by reference.

BACKGROUND

1. Field

One or more embodiments relate to an organic light-emitting device.

2. Description of the Related Art

Organic light-emitting devices are self-emission devices that produce full-color images, and also have wide viewing angles, high contrast ratios, short response times, and excellent characteristics in terms of brightness, driving voltage, and response speed, as compared to other devices in the art.

An example of such organic light-emitting devices may include an anode on a substrate, and a hole transport region, an emission layer, an electron transport region, and a cathode, which are sequentially on the anode. Holes provided from the anode may move toward the emission layer through the hole transport region, and electrons provided from the cathode may move toward the emission layer through the electron transport region. Carriers, such as holes and electrons, recombine in the emission layer to produce excitons. These excitons transit (e.g., transition or relax) from an excited state to a ground state, thereby generating light.

SUMMARY

One or more embodiments include an organic light-emitting device having improved efficiency and lifespan.

Additional aspects of embodiments will be set forth in part in the description which follows and, in part, will be apparent from the description, or may be learned by practice of the presented embodiments.

An aspect of an embodiment of the present disclosure provides an organic light-emitting device including: an anode; a cathode; and an organic layer between the anode and the cathode and including an emission layer, wherein the emission layer includes a first emission layer including a first host, a second host, and a first dopant, and a second emission layer including a third host, a fourth host, and a second dopant, and the organic light-emitting device satisfies Equations 1 and 2:

$$E_{HOMO1} - E_{HOMO2} \leq 0.2 \text{ eV} \quad \text{Equation 1}$$

$$E_{HOMO3} - E_{HOMO4} \geq 0.3 \text{ eV}. \quad \text{Equation 2}$$

In Equations 1 and 2, $E_{HOMO1}$ is a highest occupied molecular orbital (HOMO) energy level of the first host,
$E_{HOMO2}$ is a HOMO energy level of the second host,
$E_{HOMO3}$ is a HOMO energy level of the third host, and
$E_{HOMO4}$ is a HOMO energy level of the fourth host.

BRIEF DESCRIPTION OF THE DRAWINGS

These and/or other aspects of embodiments will become apparent and more readily appreciated from the following description of the embodiments, taken in conjunction with the accompanying drawings in which.

DETAILED DESCRIPTION

Figure 1:
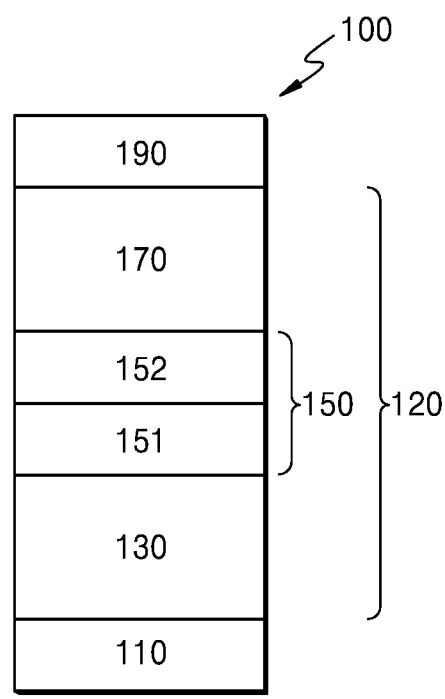
FIG. 1 is a schematic cross-sectional view of an organic light-emitting device according to an embodiment.

Hereinafter, exemplary embodiments of the present disclosure will be described in more detail with reference to the attached drawings. However, the subject matter of the present disclosure is not limited to the exemplary embodiments, and may be embodied in other forms. Rather, these embodiments are provided so that this disclosure will be thorough and complete, and will fully convey the scope of the present disclosure to one of ordinary skill in the art. In the drawings, thicknesses of layers and regions may be exaggerated for clarity. Throughout the specification, like reference numerals denote like elements.

The term "hole transport host," as used herein, refers to a host in which hole transport capability is higher than electron transport capability.

The term "electron transport host," as used herein, refers to a host in which electron transport capability is higher than hole transport capability.

The term "HOMO energy level," as used herein, refers to the energy level of a highest occupied molecular orbital (HOMO).

The term "organic layer," as used herein, refers to a single layer and/or a plurality of layers between the anode and the cathode of the organic light-emitting device. A material included in the "organic layer" is not limited to an organic material. For example, the organic layer may include an inorganic material.

FIG. 1 is a schematic view of an organic light-emitting device 100 according to an embodiment.

Referring to FIG. 1, the organic light-emitting device 100 may include an anode 110, a cathode 190, and an organic layer 120 between the anode 110 and the cathode 190 and including an emission layer 150. The emission layer 150 may include a first emission layer 151 including a first host, a second host, and a first dopant, and a second emission layer 152 including a third host, a fourth host, and a second dopant. The first emission layer 151 may contact (e.g., physically contact) the second emission layer 152. The first emission layer 151 may be located to be close to the anode 110, and the second emission layer 152 may be located to be close to the cathode 190. The first host and the second host may satisfy Equation 1, and the third host and the fourth host may satisfy Equation 2:

$$E_{HOMO1} - E_{HOMO2} \leq 0.2 \text{ eV} \quad \text{Equation 1}$$

$$E_{HOMO3} - E_{HOMO4} \geq 0.3 \text{ eV}. \quad \text{Equation 2}$$

In Equations 1 and 2, $E_{HOMO1}$ is a HOMO energy level of the first host,
$E_{HOMO2}$ is a HOMO energy level of the second host,
$E_{HOMO3}$ is a HOMO energy level of the third host, and
$E_{HOMO4}$ is a HOMO energy level of the fourth host.

Because the emission layer has a high resistance, as compared with other layers in the organic light-emitting device, the efficiency of the organic light-emitting device may depend on the resistance of the emission layer. In addition, when holes and electrons are supplied to the emission layer at a suitable or appropriate ratio, excitons are efficiently formed to achieve light emission.

The organic light-emitting device satisfying Equations 1 and 2 may reduce the resistance of the emission layer. In addition, the organic light-emitting device satisfying Equations 1 and 2 may suitably or appropriately maintain a ratio of holes to electrons by using a difference in HOMO energy level between the hosts in the emission layer. For example, the organic light-emitting device satisfying Equations 1 and 2 may improve the efficiency of the device and also improve the lifespan thereof by using a first emission layer having a long lifespan but a relatively low efficiency and a second emission layer having a high efficiency but a relatively short lifespan.

In some embodiments, when the first host and the second host in the first emission layer 151 satisfy Equation 1, the hole transport capability in the first emission layer may be improved. Because the hole transport capability of the first emission layer 151 is excellent, the hole transport in the direction from the anode 110 to the first emission layer 151 may be smoothly performed. For example, the first host and the second host of the first emission layer 151 may further satisfy Equation 1-1:

$$0 \text{ eV} \leq E_{HOMO\ 1-1} - E_{HOMO\ 1-2} \leq 0.2 \text{ eV}. \quad \text{Equation 1-1}$$

In addition, when the third host and the fourth host of the second emission layer 152 satisfy Equation 2, the hole transport capability of the second emission layer 152 may be lower than the hole transport capability of the first emission layer 151. Because the hole transport capability of the second emission layer 152 is low, movement of the holes in the emission layer 150 to the direction of the cathode 190 without forming excitons may be prevented or reduced, thereby improving the luminescent efficiency. For example, the third host and the fourth host of the second emission layer 152 may further satisfy Equation 2-1.

$$0.3 \text{ eV} \leq E_{HOMO\ 2-1} - E_{HOMO\ 2-2} \leq 0.8 \text{ eV}. \quad \text{Equation 2-1}$$

In one embodiment, in the organic layer 120, a hole transport region 130 may be between the anode 110 and the emission layer 150, and an electron transport region 170 may be between the emission layer 150 and the cathode 190. The hole transport region 130 may include a hole injection layer, a hole transport layer, an emission auxiliary layer, an electron blocking layer, or any combination thereof. The first emission layer 151 may contact (e.g., physically contact) the hole transport region 130. The electron transport region 170 may include a hole blocking layer, an electron transport layer, an electron injection layer, or any combination thereof. The second emission layer 152 may contact (e.g., physically contact) the electron transport region 170.

In one embodiment, the first host may be the same material as that of the hole transport region 130. For example, the first host may be the same material as that of the layer contacting (e.g., physically contacting) the first emission layer 151 in the hole transport region 130, for example, the hole transport layer. In one or more embodiments, the first host may be a material different from that of the hole transport region 130.

In one embodiment, the fourth host may be the same material as that of the electron transport region 170. For example, the fourth host may be the same material as that of the layer contacting (e.g., physically contacting) the second emission layer 152 in the electron transport region 170, for example, the electron transport layer. In one or more embodiments, the fourth host may be a material different from that of the electron transport region 170.

In one embodiment, the first host of the first emission layer 151 and the third host of the second emission layer 152 may be the same material. In one or more embodiments, the first host and the third host may be different materials.

A molar ratio of the first host to the second host in the first emission layer 151 may be in a range of about 3:7 to about 9:1. When the mixed molar ratio of the first host to the second host is within these ranges, a ratio of electrons to holes in the first emission layer is present in a balanced manner, thereby improving the efficiency of the device.

A molar ratio of the third host to the fourth host in the second emission layer 152 may be in a range of about 3:7 to about 9:1. When the mixed molar ratio of the third host to the fourth host is within these ranges, a ratio of electrons to holes in the second emission layer is present in a balanced manner, thereby improving the efficiency of the device.

In one embodiment, a thickness ($D_1$) of the first emission layer 151 may be equal to or greater than a thickness ($D_2$) of the second emission layer 152 ($D_1 \geq D_2$). For example, a ratio $D_1:D_2$ of the thickness ($D_1$) of the first emission layer 151 to the thickness ($D_2$) of the second emission layer 152 may be in a range of about 1:1 to about 5:1. For example, the ratio $D_1:D_2$ may be in a range of about 2:1 to about 4:1. When the ratio of the thickness of the first emission layer 151 to the thickness of the second emission layer 152 is within these ranges, the efficiency and lifespan of the organic light-emitting device 100 may be improved.

The thickness of the emission layer 150 may be in a range of about 100 Å to about 1,000 Å, for example, about 200 Å to about 600 Å. When the thickness of the emission layer 150 is within these ranges, excellent light-emission characteristics may be obtained without a substantial increase in driving voltage.

In one embodiment, the hole transport capability of the first emission layer 151 may be higher than the hole transport capability of the second emission layer 152. The electron transport capability of the second emission layer 152 may be higher than the electron transport capability of the first emission layer 151.

In one embodiment, the first host may be a hole transport host, and the second host may be an electron transport host. When the hole transport host and the electron transport host are mixed and distributed within the first emission layer 151 in the molar ratio discussed herein above, the lifespan of the organic light-emitting device may be improved.

In one embodiment, the third host may be a hole transport host, and the fourth host may be an electron transport host. When the hole transport host and the electron transport host are mixed and distributed within the second emission layer 152 in the molar ratio discussed above, the luminescent efficiency of the organic light-emitting device may be increased.

In one embodiment, the second host may be a bipolar material capable of transporting both electrons and holes. Because the second host has bipolarity, the second host may suitably or appropriately and stably move holes and electrons. The fourth host may be a unipolar material having electron transport properties. Because the fourth host has unipolarity with electron transport properties, the fourth host may suitably or appropriately and stably move electrons.

Because both the first emission layer and the second emission layer may become a recombination zone, a wide recombination zone may be secured.

In some embodiments, the first host and the third host may each independently be a fluorene-based compound, a carbazole-based compound, a triarylamine-based compound, a dibenzofuran-based compound, a dibenzothiophene-based compound, and/or a dibenzosilole-based compound. For example, the first host and the third host may each independently be 9,9-bis[4-(1-pyrenyl)phenyl]fluorine, 2,2": 7",2"-ter-9,9'-spirobi[9H-fluorene] (TSBF), 1,3-bis(N-carbazolyl)benzene (mCP), 4,4'-di(9H-carbazol-9-yl)-1,1'-biphenyl (CBP), 4,4'-di(9H-carbazol-9-yl)-2,2'-dimethyl-1,1'-biphenyl (CDBP), BCz1, BCz2, BCz3, tris(4-carbazol-9-ylphenyl)amine (TCTA), 2,8-bis(pyrido[2,3-b]indol-9-yl)dibenzofuran (DBFCb), 2,8-di(9-carbazolyl)dibenzothiophene (DCzDBT), and/or poly(9,9-dialkyl-3,6-dibenzosilole), but embodiments of the present disclosure are not limited thereto.

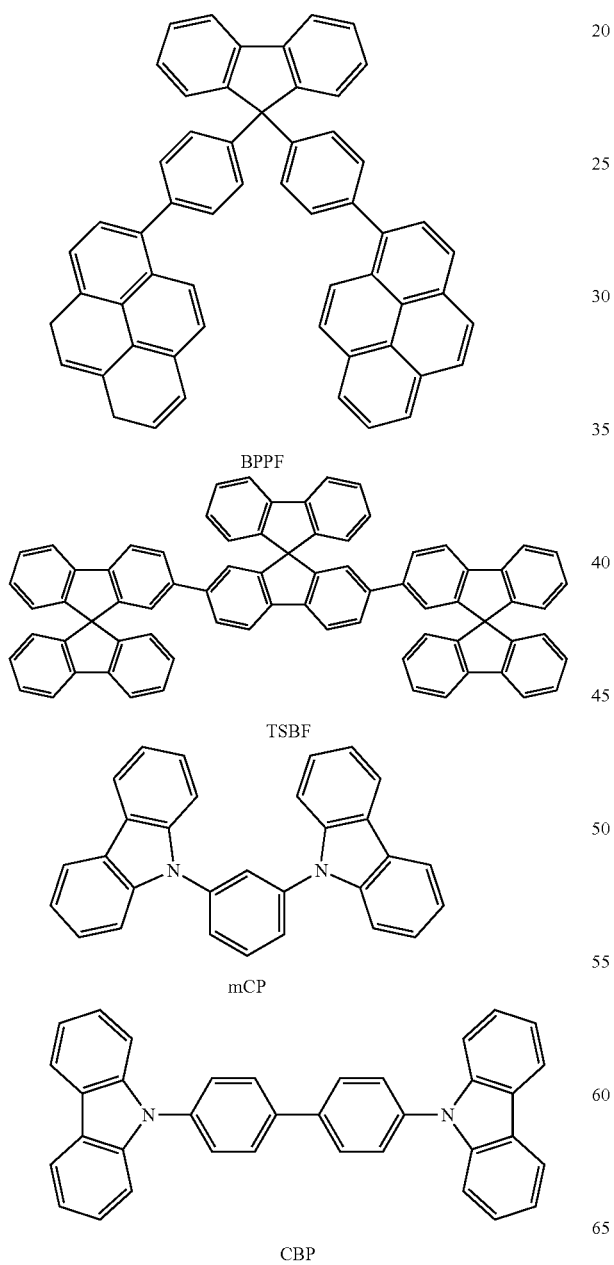

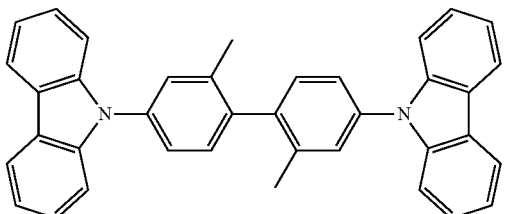

CDBP

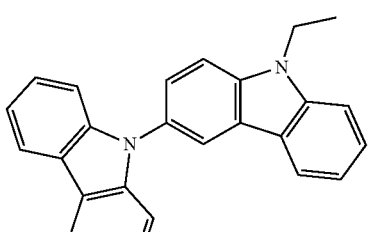

BCz1

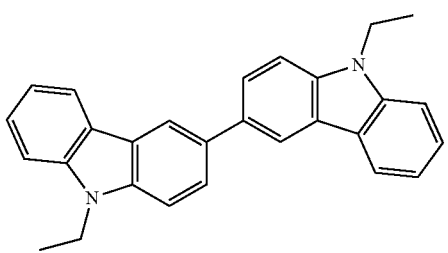

BCz3

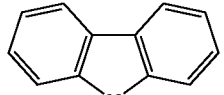

TCTA

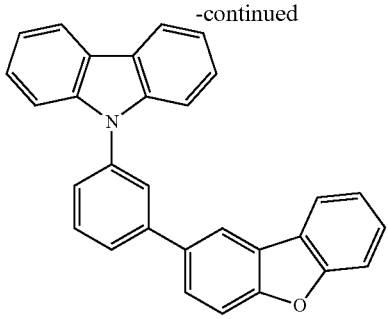

CzDBF

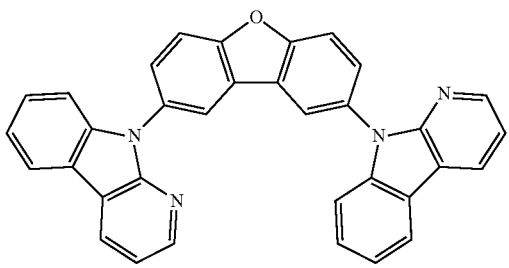

DBFCb

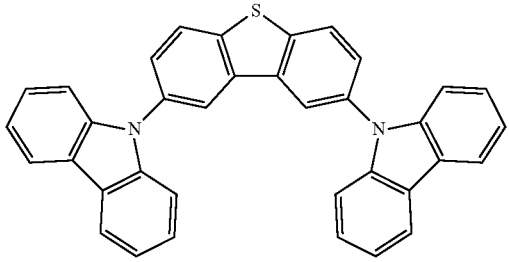

DCzDBT

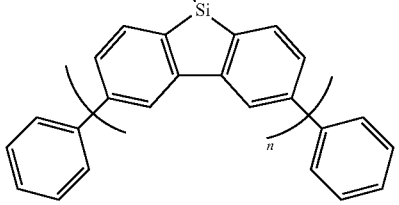

Poly(9,9-dialkyl-3,6-dibenzosilole)

In some embodiments, the second host and the fourth host may each independently be a triazine-based compound, a triazole-based compound, an imidazole-based compound, an oxazine-based compound, an oxadiazole-based compound, and/or a phosphoric acid-based compound. For example, the second host and the fourth host may each independently be 2,4-diphenyl-6-(9,9'-spirobi[9H-fluoren]-2-yl)-1,3,5-triazine, 4-(1-naphthyl)-3,5-diphenyl-1,2,4-triazole (NTAZ), 9-phenyl-3,6-bis[4-(1-phenylbenzimidazol-2-yl)phenyl]carbazole, 2,2',2''-(1,3,5-benzinetriyl)-tris(1-phenyl-1-H-benzimidazole (TPBi), 2-(diphenylphosphinyl)-spiro[9H-fluorene-9,9'-quino[3,2,1-kl]phenoxazine] (Tri-o-2PO), 2,20-bis(1,3,4-oxadiazol-2-yl)biphenyls (BOBP3), 4,4'-0-bis(diphenylphosphine oxide)biphenyl (PO1), bis[2-[(oxo)diphenylphosphino]phenyl]ether (DPEPO), 9,9-spirobifluoren-2-yl-diphenyl-phosphine oxide (SPPO1), p-CzOXD, p-TPA-o-OXD, BP1, BP2, CZBP, TRZ-3Cz, and/or a compound represented by Formula 301, but embodiments of the present disclosure are not limited thereto.

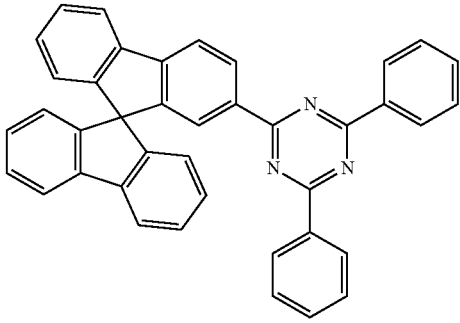

2,4-Diphenyl-6-(9,9'-spirobi[9H-fluoren]-2-yl)-1,3,5-triazine)

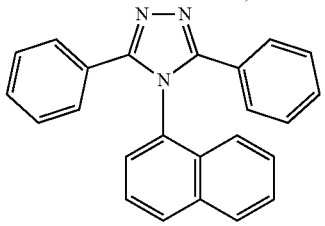

NTAZ

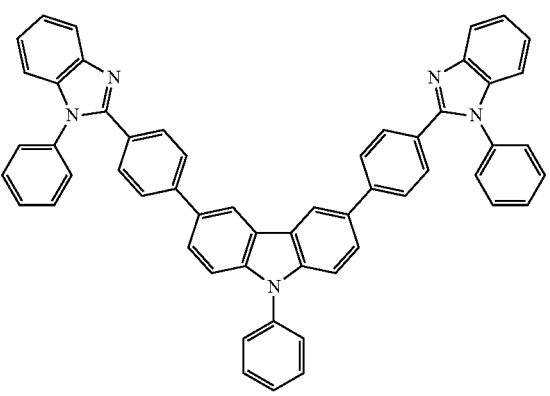

9-Phenyl-3,6-bis[4-(1-phenyl benzimidazol-2-yl)phenyl]carbazole

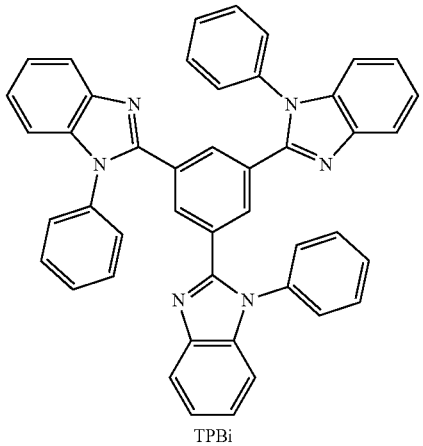

TPBi

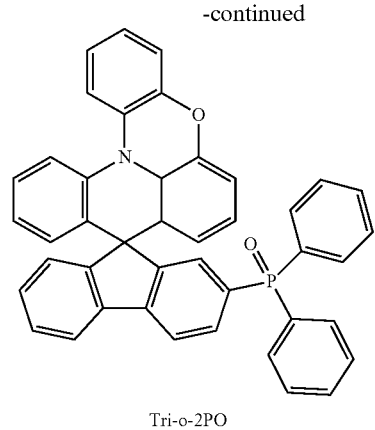
Tri-o-2PO
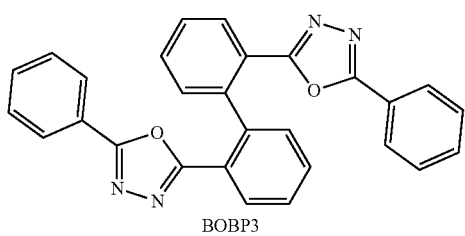
BOBP3
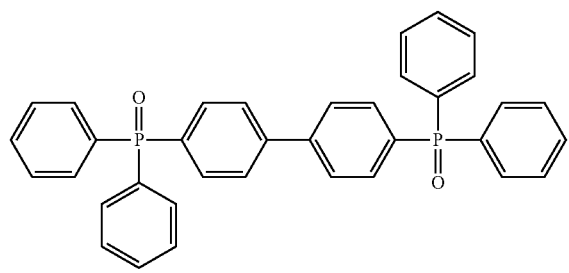
PO1
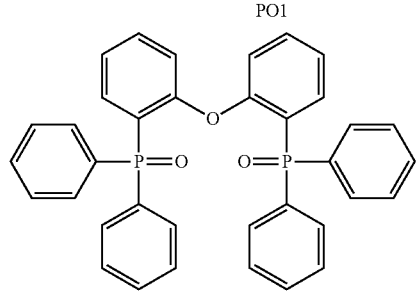
DPEPO
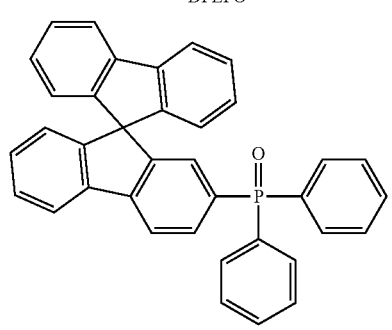
SPPO1
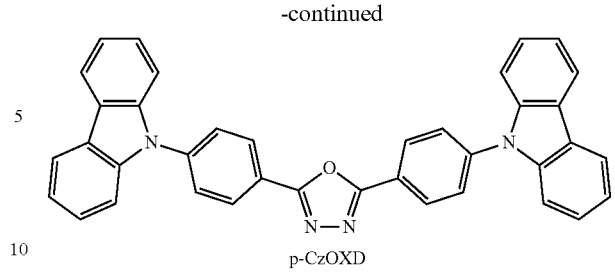
p-CzOXD
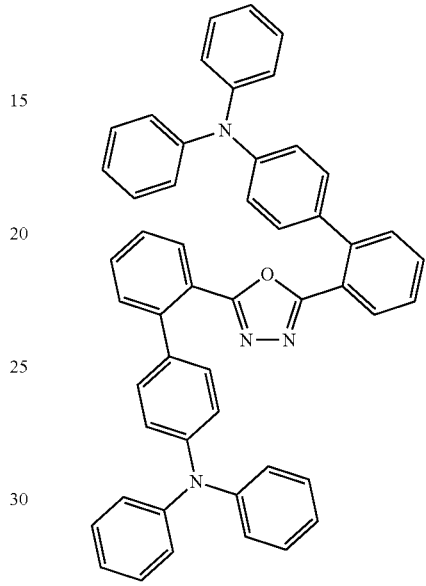
p-TPA-o-OXD
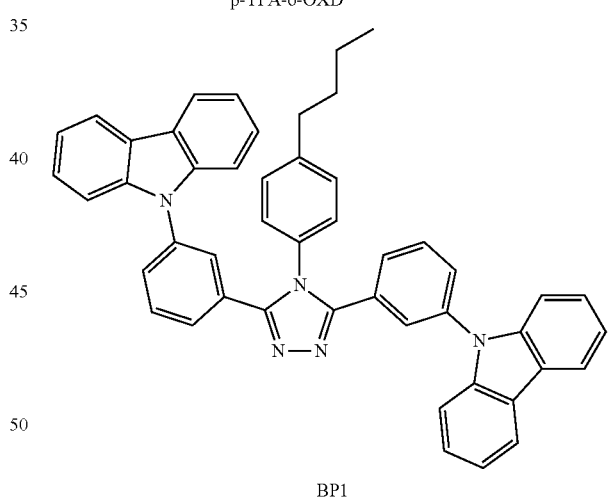
BP1
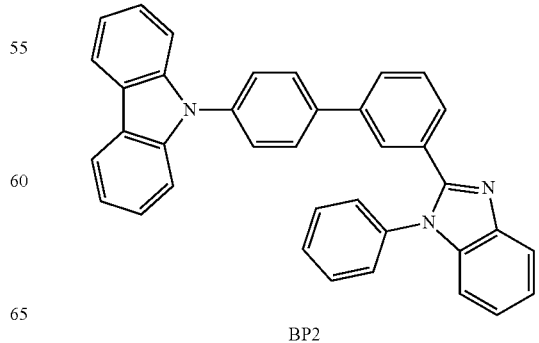
BP2

-continued

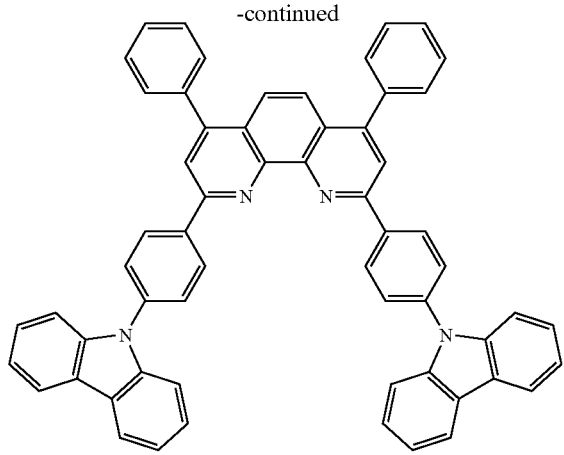

CZBP

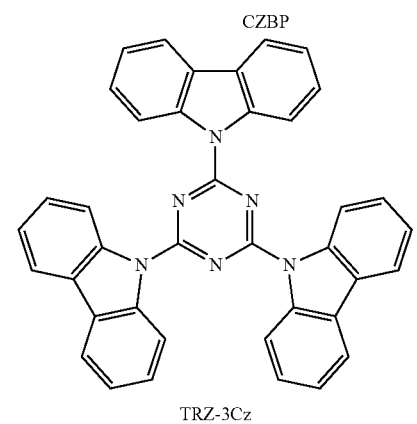

TRZ-3Cz

Formula 301

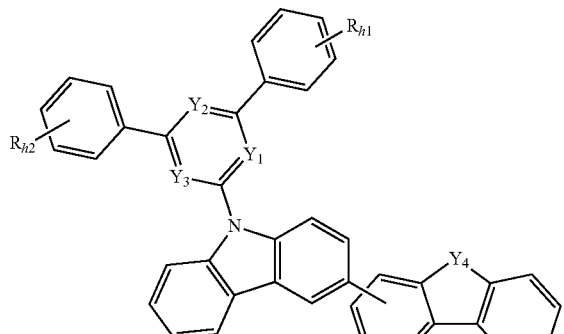

In Formula 301,

Y$_1$, Y$_2$, and Y$_3$ may each independently be N or CH,

Y$_4$ may be C(Q$_{301}$)(Q$_{302}$), S, or Si(Q$_{301}$)(Q$_{302}$),

Q$_{301}$ and Q$_{302}$ may each independently be selected from a C$_1$-C$_{10}$ alkyl group, a C$_1$-C$_{10}$ alkoxy group, a C$_6$-C$_{20}$ aryl group, and a C$_1$-C$_{20}$ heteroaryl group, R$_{h1}$ and R$_{h2}$ may each independently be selected from a substituted or unsubstituted C$_6$-C$_{60}$ aryl group, and a substituted or unsubstituted C$_1$-C$_{60}$ heteroaryl group.

In more detail, Q$_{301}$ and Q$_{302}$ may each independently be selected from hydrogen, deuterium, a methyl group, an ethyl group, a methoxy group, an ethoxy group, a phenyl group, a biphenyl group, a terphenyl group, a naphthyl group, a fluorenyl group, a carbazolyl group, a pyridyl group, a paramidyl group, a parazinyl group, a pyridazinyl group, and a triazinyl group.

In more detail, R$_{h1}$ and R$_{h2}$ may each independently be selected from:

hydrogen, deuterium, a methyl group, an ethyl group, a methoxy group, an ethoxy group, a phenyl group, a biphenyl group, a terphenyl group, a naphthyl group, a fluorenyl group, a carbazolyl group, a pyridyl group, a paramidyl group, a parazinyl group, a pyridazinyl group, and a triazinyl group; and a phenyl group substituted with a methyl group, an ethyl group, a methoxy group, an ethoxy group or a phenyl group, a biphenyl group, a terphenyl group, a naphthyl group, a fluorenyl group, a carbazolyl group, a pyridyl group, a paramidyl group, a parazinyl group, a pyridazinyl group, and a triazinyl group.

For example, the compound represented by Formula 301 may be selected from Compounds H1 to H6, but embodiments of the present disclosure are not limited thereto:

H1

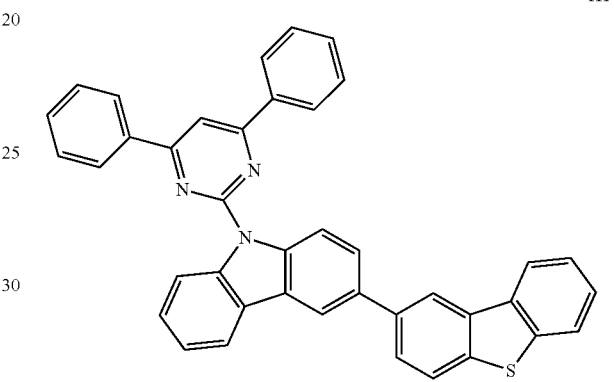

H2

H3

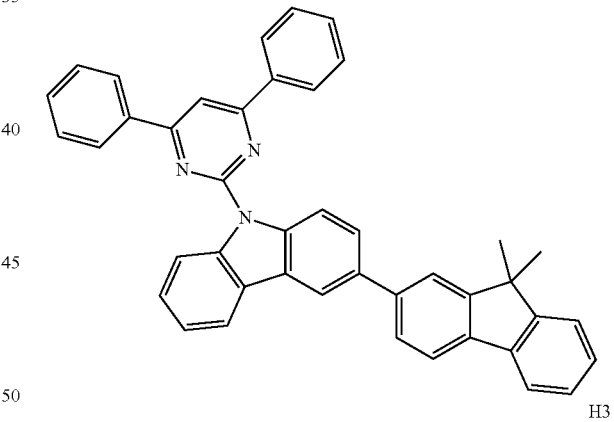

-continued

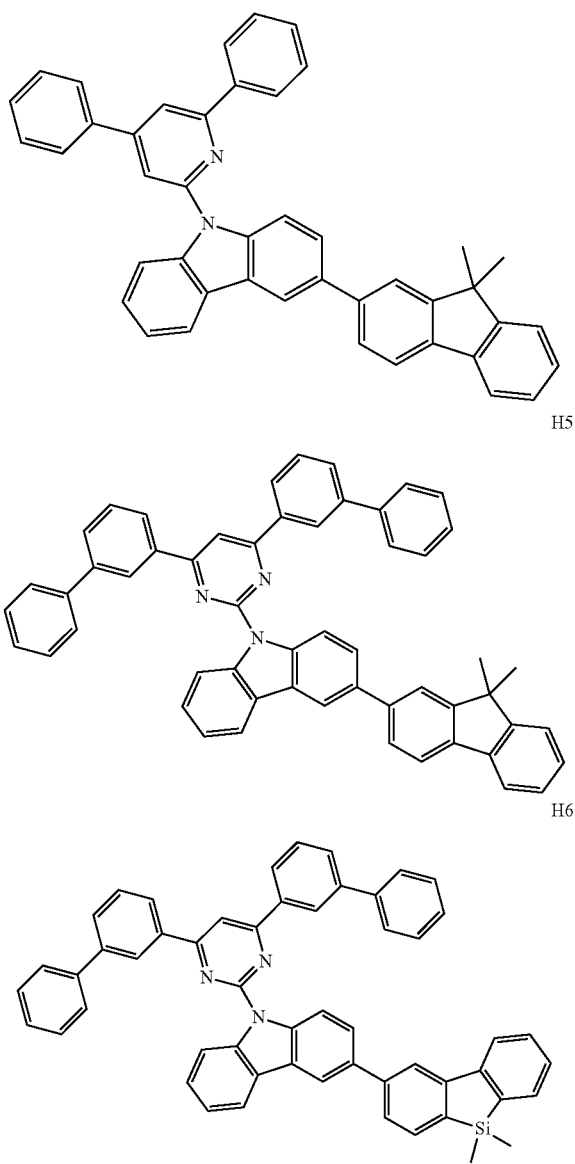

The first host, the second host, the third host, and the fourth host may have their respective HOMO energy levels adjusted by substitution of donor groups or acceptor groups.

In one embodiment, the first host and the third host may be identical to each other. In one or more embodiments, the first host and the third host may be different from each other.

The first dopant of the first emission layer 51 and the second dopant of the second emission layer 52 may be dopants which emit fluorescence, phosphorescence, or delayed fluorescence. The first emission layer 51 and the second emission layer 52 may emit the same (e.g., substantially the same) color light. In one embodiment, the first dopant and the second dopant may be the same material. In one or more embodiments, the first dopant and the second dopant may be different materials.

Anode 110

The anode 110 may be formed by depositing or sputtering a material for forming the anode 110 on the substrate. The material for forming the anode 110 may be selected from materials with a high work function to facilitate hole injection.

The anode 110 may be a reflective electrode, a semi-transmissive electrode, or a transmissive electrode. When the anode 110 is a transmissive electrode, a material for forming the anode 110 may be selected from indium tin oxide (ITO), indium zinc oxide (IZO), tin oxide ($SnO_2$), zinc oxide (ZnO), and any combinations thereof, but embodiments of the present disclosure are not limited thereto. In one or more embodiments, when the anode 110 is a semi-transmissive electrode or a reflective electrode, a material for forming the anode 110 may be selected from magnesium (Mg), silver (Ag), aluminum (Al), aluminum-lithium (Al—Li), calcium (Ca), magnesium-indium (Mg—In), magnesium-silver (Mg—Ag), and any combinations thereof, but embodiments of the present disclosure are not limited thereto.

The anode 110 may have a single-layered structure, or a multi-layered structure including two or more layers. For example, the anode 110 may have a three-layered structure of ITO/Ag/ITO, but the structure of the first electrode is not limited thereto.

Organic Layer 120

The organic layer 120 may be on the anode 110. The organic layer 120 may include the emission layer 150 as described above, The organic layer 120 may further include a hole transport region between the anode 110 and the emission layer, and an electron transport region between the emission layer and the cathode 190.

Hole Transport Region 130

The hole transport region 130 may have i) a single-layered structure including a single layer including a single material, ii) a single-layered structure including a single layer including a plurality of different materials, or iii) a multi-layered structure having a plurality of layers including a plurality of different materials.

The hole transport region 130 may include at least one layer selected from a hole injection layer, a hole transport layer, an emission auxiliary layer, and an electron blocking layer.

For example, the hole transport region 130 may have a single-layered structure including a single layer including a plurality of different materials, or a multi-layered structure having a hole injection layer/hole transport layer structure/ electron blocking layer, a hole injection layer/hole transport layer/emission auxiliary layer structure/electron blocking layer, a hole injection layer/emission auxiliary layer structure/electron blocking layer, or a hole transport layer/emission auxiliary layer structure/electron blocking layer structure, wherein for each structure, constituting layers are sequentially stacked from the anode 110 in this stated order, but the structure of the hole transport region is not limited thereto.

The hole transport region 130 may include at least one selected from m-MTDATA, TDATA, 2-TNATA, NPB (NPD), β-NPB, TPD, Spiro-TPD, Spiro-NPB, methylated-NPB, TAPC, HMTPD, 4,4',4"-tris(N-carbazolyl)triph-enylamine (TCTA), polyaniline/dodecylbenzenesulfonic acid (PANI/DBSA), poly(3,4-ethylenedioxythiophene)/poly (4-styrenesulfonate) (PEDOT/PSS), polyaniline/camphor sulfonic acid (PANI/CSA), polyaniline/poly(4-styrene-sulfonate) (PANI/PSS), CzSi, TCTA, a compound represented by Formula 201, and a compound represented by Formula 202:

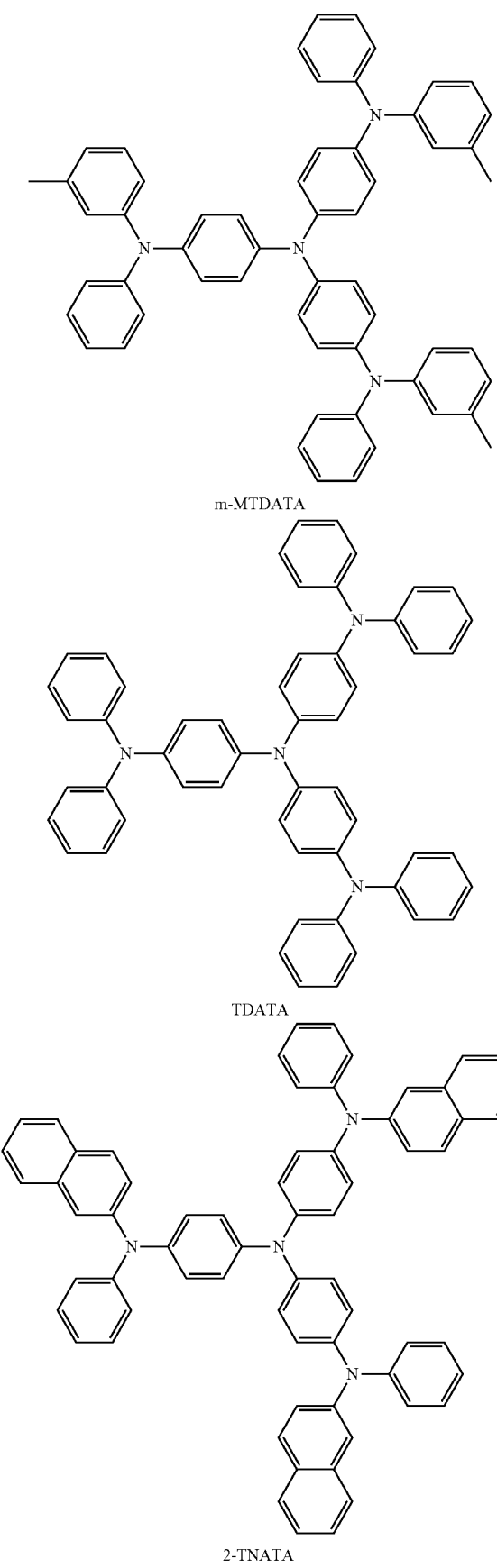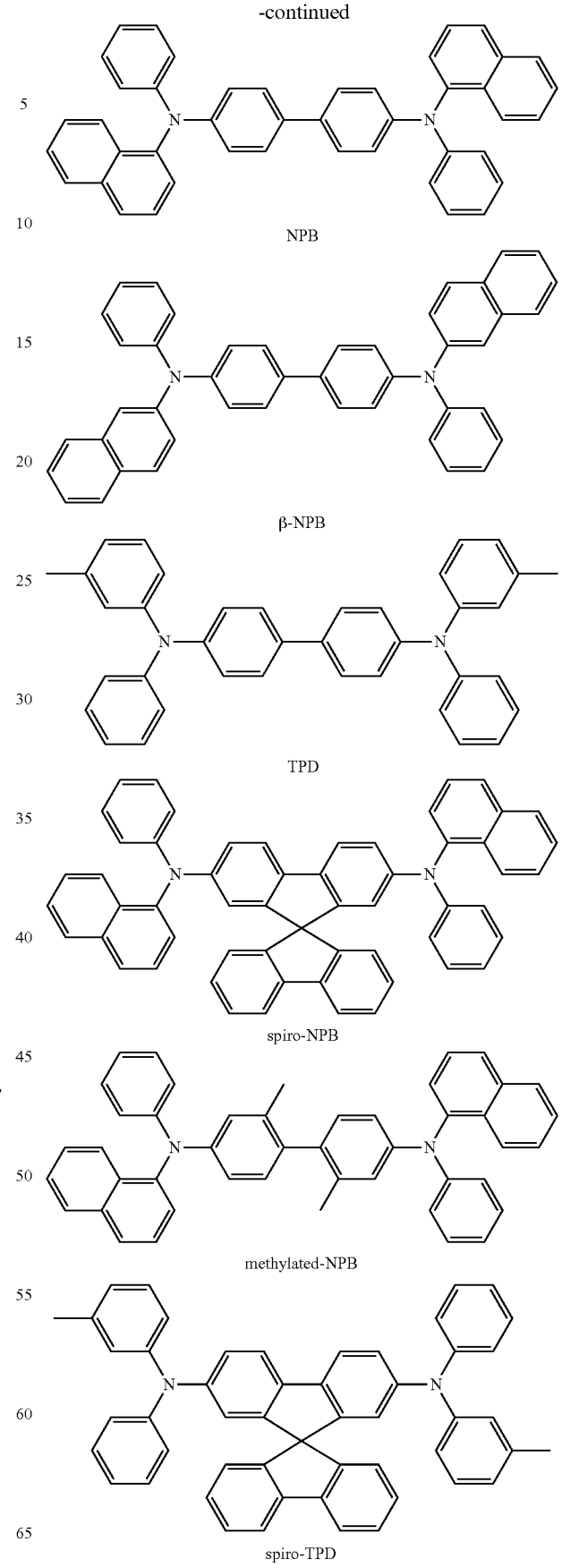

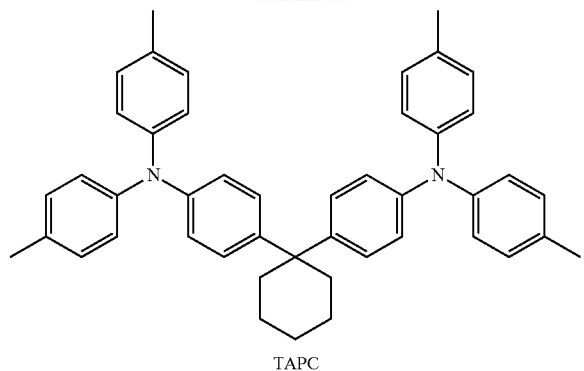

TAPC

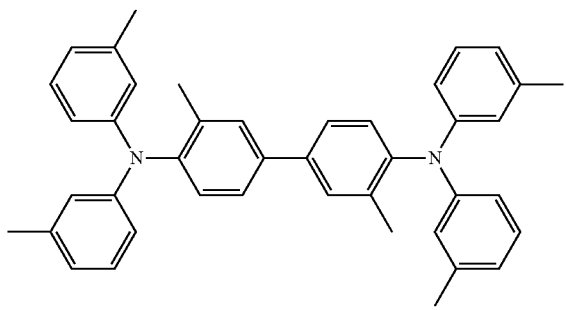

HMTPD

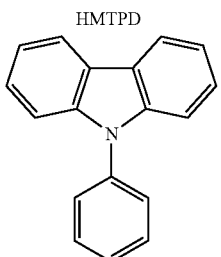

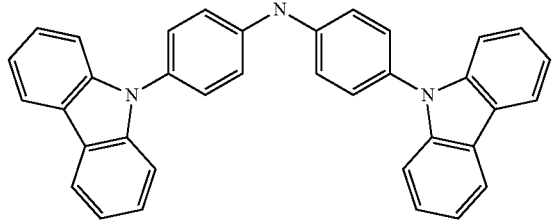

TCTA

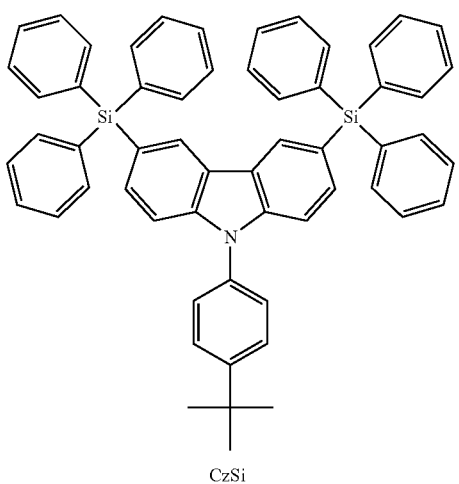

CzSi

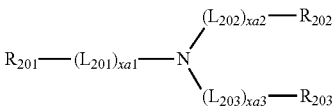

Formula 201

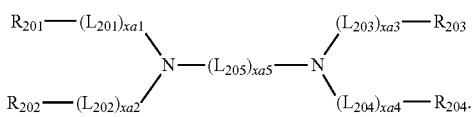

Formula 202

In Formulae 201 and 202, $L_{201}$ to $L_{204}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, $L_{205}$ may be selected from *—O—*', *—S—*', *—N($Q_{201}$)—*', a substituted or unsubstituted $C_1$-$C_{20}$ alkylene group, a substituted or unsubstituted $C_2$-$C_{20}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xa1 to xa4 may each independently be an integer from 0 to 3, xa5 may be an integer from 1 to 10, and $R_{201}$ to $R_{204}$ and $Q_{201}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

For example, in Formula 202, $R_{201}$ and $R_{202}$ may optionally be linked via a single bond, a dimethyl-methylene group, or a diphenyl-methylene group, and $R_{203}$ and $R_{204}$ may optionally be linked via a single bond, a dimethyl-methylene group, or a diphenyl-methylene group.

In one embodiment, in Formulae 201 and 202, $L_{201}$ to $L_{205}$ may each independently be selected from:
a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$), and —N($Q_{31}$)($Q_{32}$), and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In one or more embodiments, xa1 to xa4 may each independently be 0, 1, or 2.

In one or more embodiments, xa5 may be 1, 2, 3, or 4.

In one or more embodiments, $R_{201}$ to $R_{204}$ and $Q_{201}$ may each independently be selected from a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$), and —N($Q_{31}$)($Q_{32}$), $Q_{31}$ to $Q_{33}$ are the same as described above.

In one or more embodiments, at least one selected from $R_{201}$ to $R_{203}$ in Formula 201 may each independently be selected from:

a fluorenyl group, a spiro-bifluorenyl group, a carbazolyl group, a dibenzofuranyl group, and a dibenzothiophenyl group; and a fluorenyl group, a spiro-bifluorenyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but embodiments of the present disclosure are not limited thereto.

In one or more embodiments, in Formula 202, i) $R_{201}$ and $R_{202}$ may be linked via a single bond, and/or ii) $R_{203}$ and $R_{204}$ may be linked via a single bond.

In one or more embodiments, at least one selected from $R_{201}$ to $R_{204}$ in Formula 202 may be selected from:

a carbazolyl group; and a carbazolyl group substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but embodiments of the present disclosure are not limited thereto.

The compound represented by Formula 201 may be represented by Formula 201A:

Formula 201A

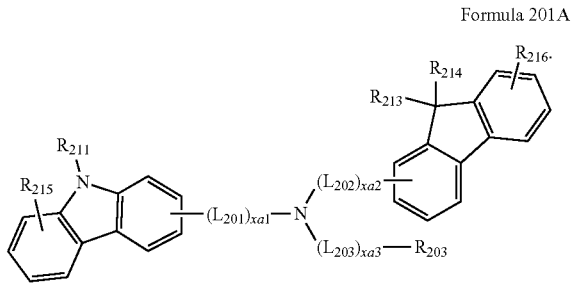

In one embodiment, the compound represented by Formula 201 may be represented by Formula 201A(1) below, but embodiments of the present disclosure are not limited thereto:

Formula 201A(1)

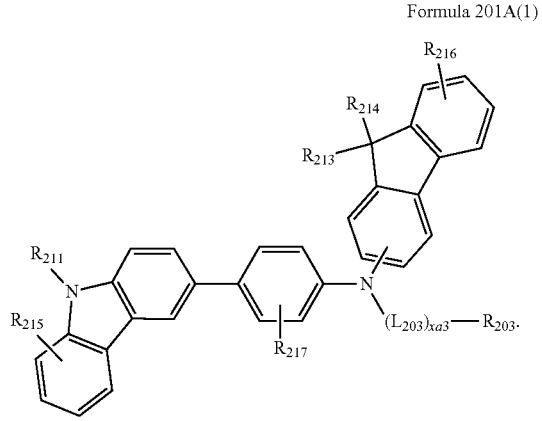

In one embodiment, the compound represented by Formula 201 may be represented by Formula 201A-1 below, but embodiments of the present disclosure are not limited thereto:

Formula 201A-1

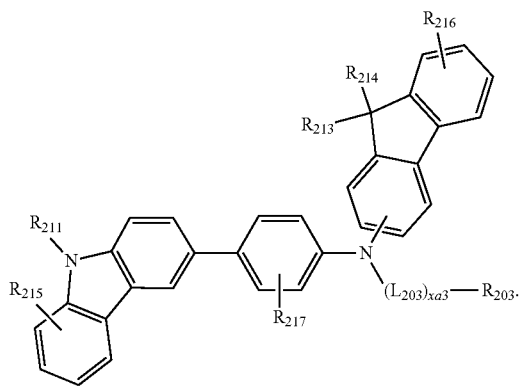

In one embodiment, the compound represented by Formula 202 may be represented by Formula 202A:

Formula 202A

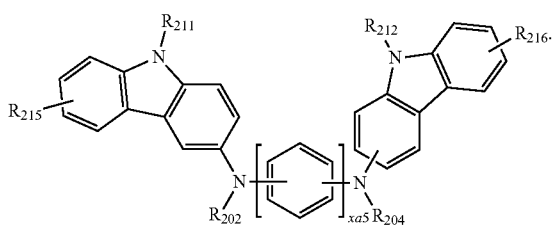

In one embodiment, the compound represented by Formula 202 may be represented by Formula 202A-1:

Formula 202A-1

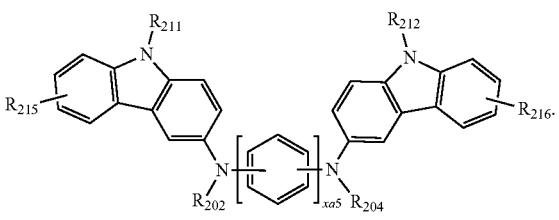

In Formulae 201A, 201A(1), 201A-1, 202A, and 202A-1, $L_{201}$ to $L_{203}$, xa1 to xa3, xa5, and $R_{202}$ to $R_{204}$ are the same as described above, $R_{211}$ and $R_{212}$ may each independently be the same as defined in connection with $R_{203}$, and $R_{213}$ to $R_{217}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

The hole transport region 130 may include at least one compound selected from Compounds HT1 to HT39, but embodiments of the present disclosure are not limited thereto:

HT1

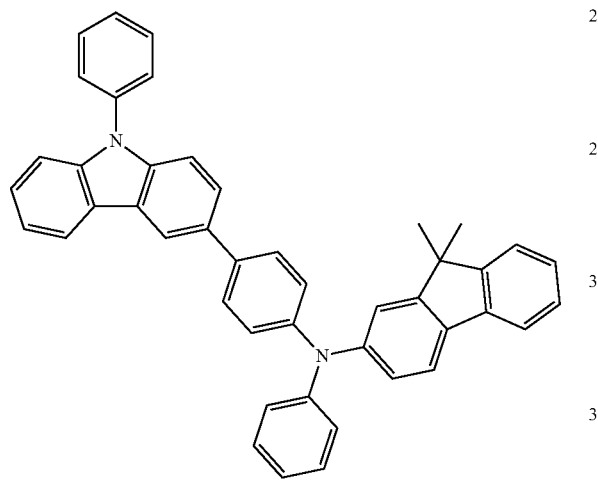

HT2

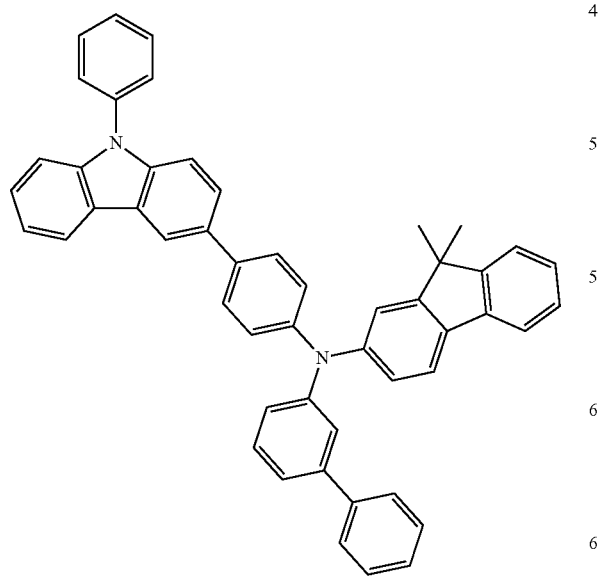

-continued

HT3

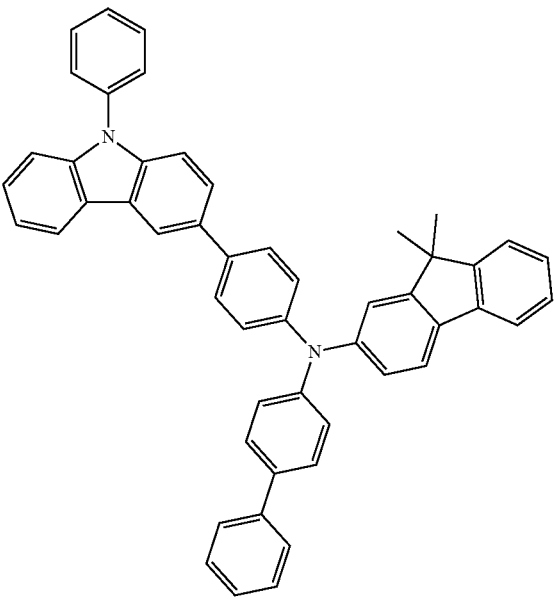

HT4

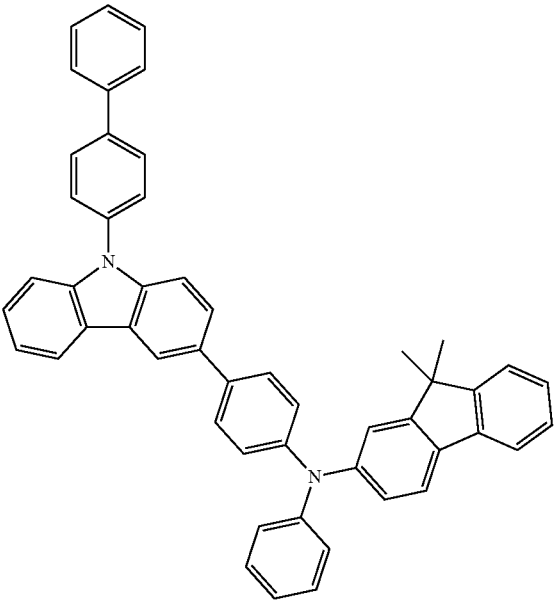

HT5
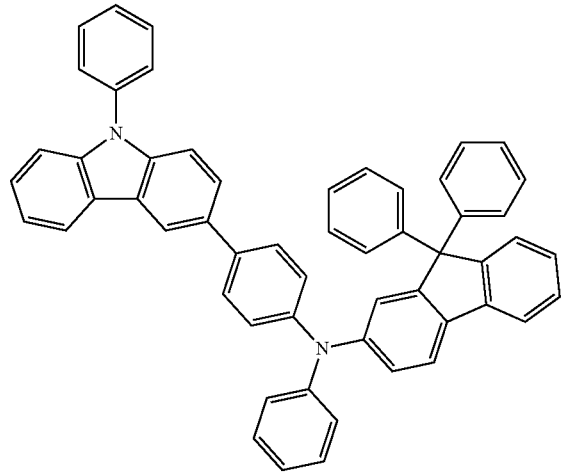
HT6
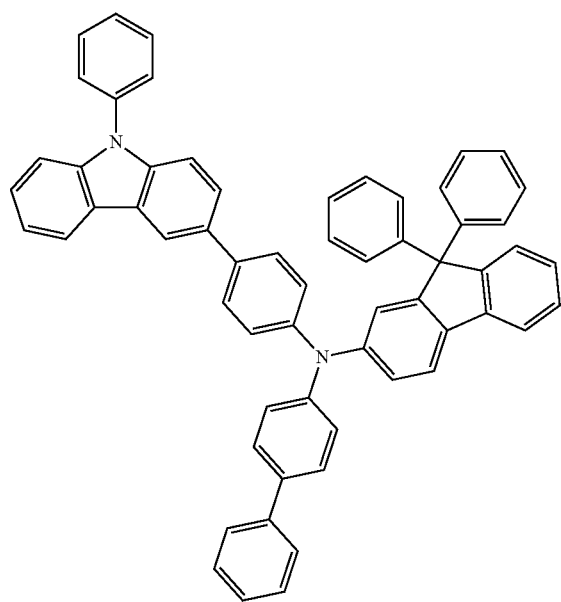
HT7
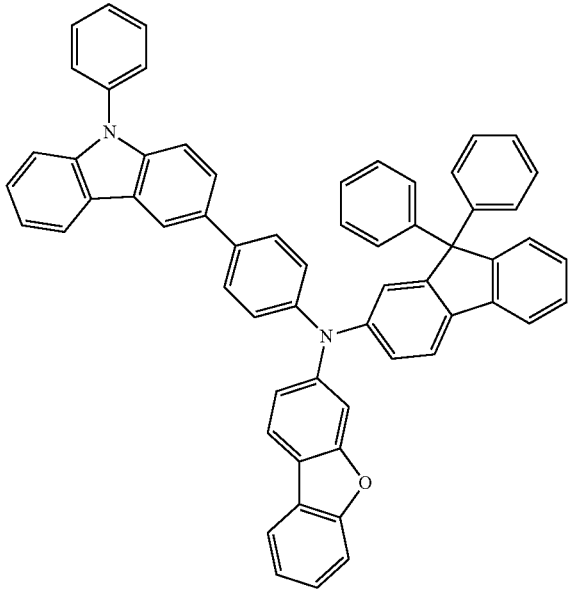
HT8
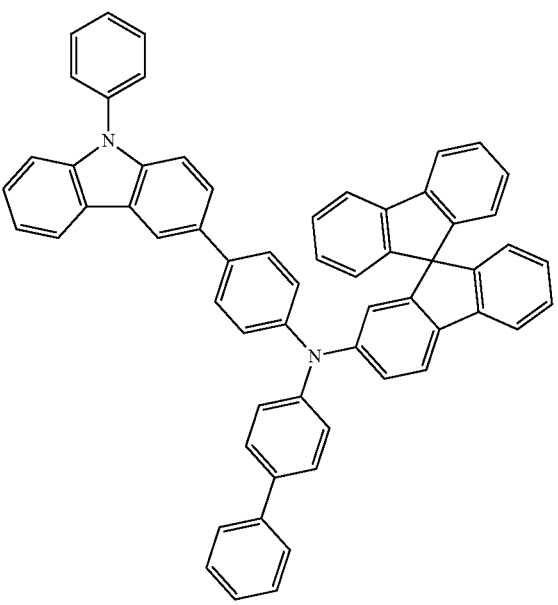

HT9
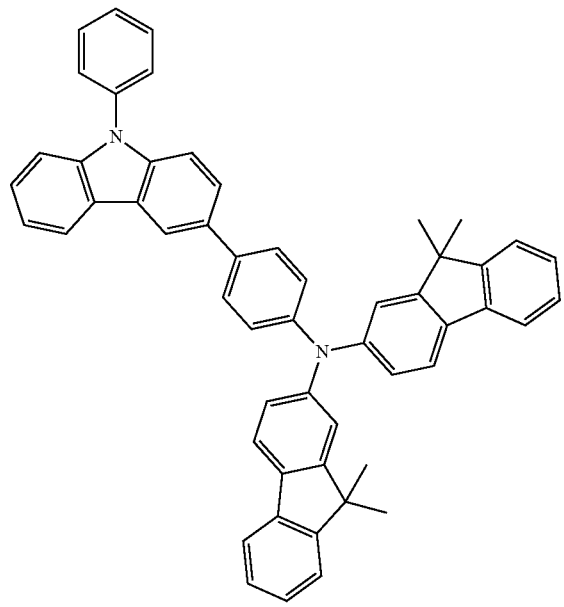
HT10
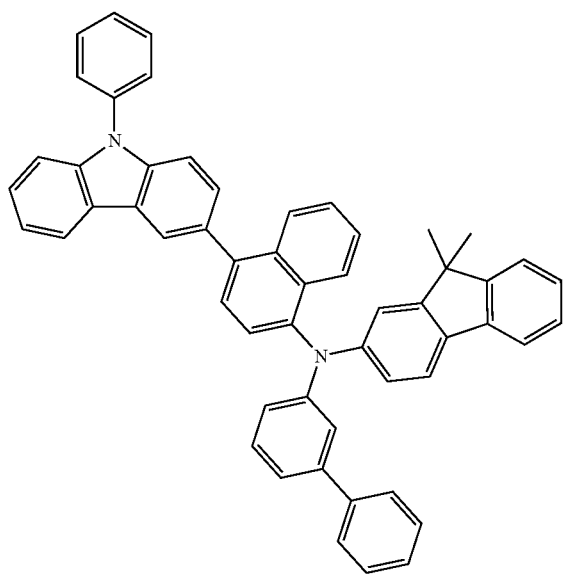
HT11
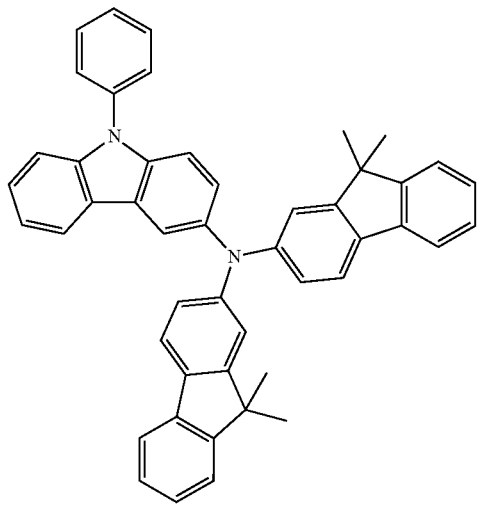
HT12
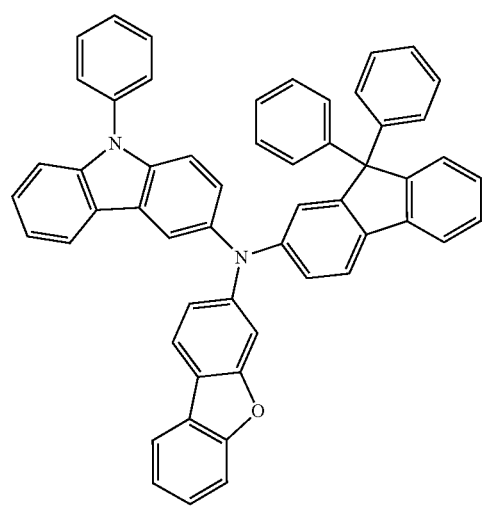
HT13
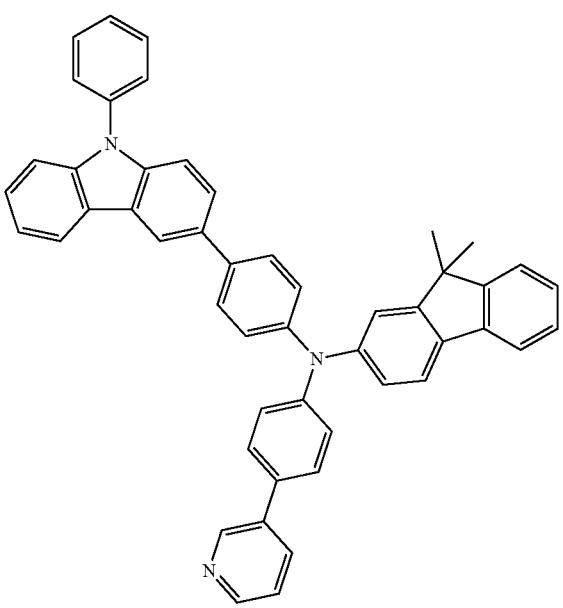

HT14
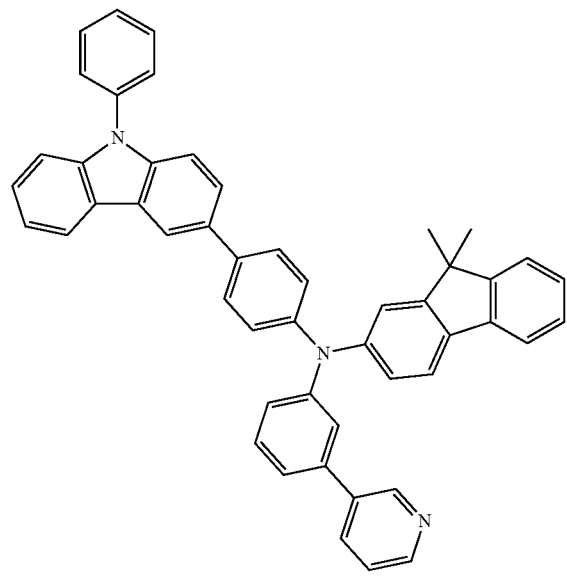
HT15
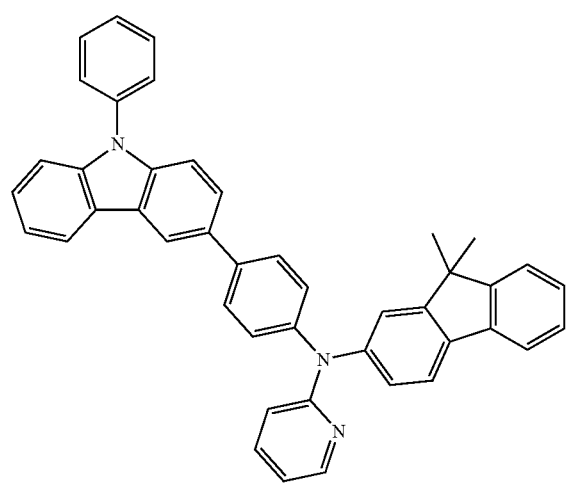
HT16
HT17
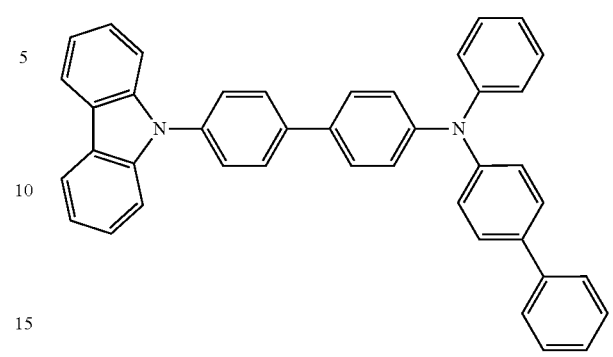
HT18
HT19
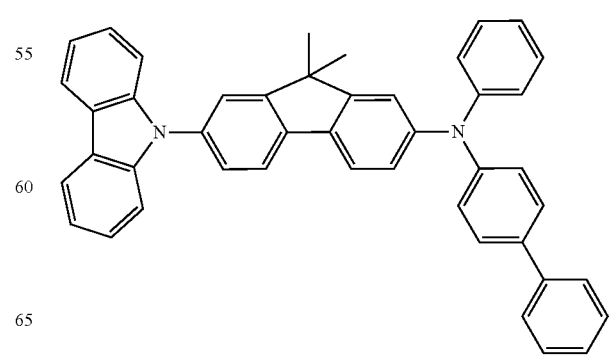

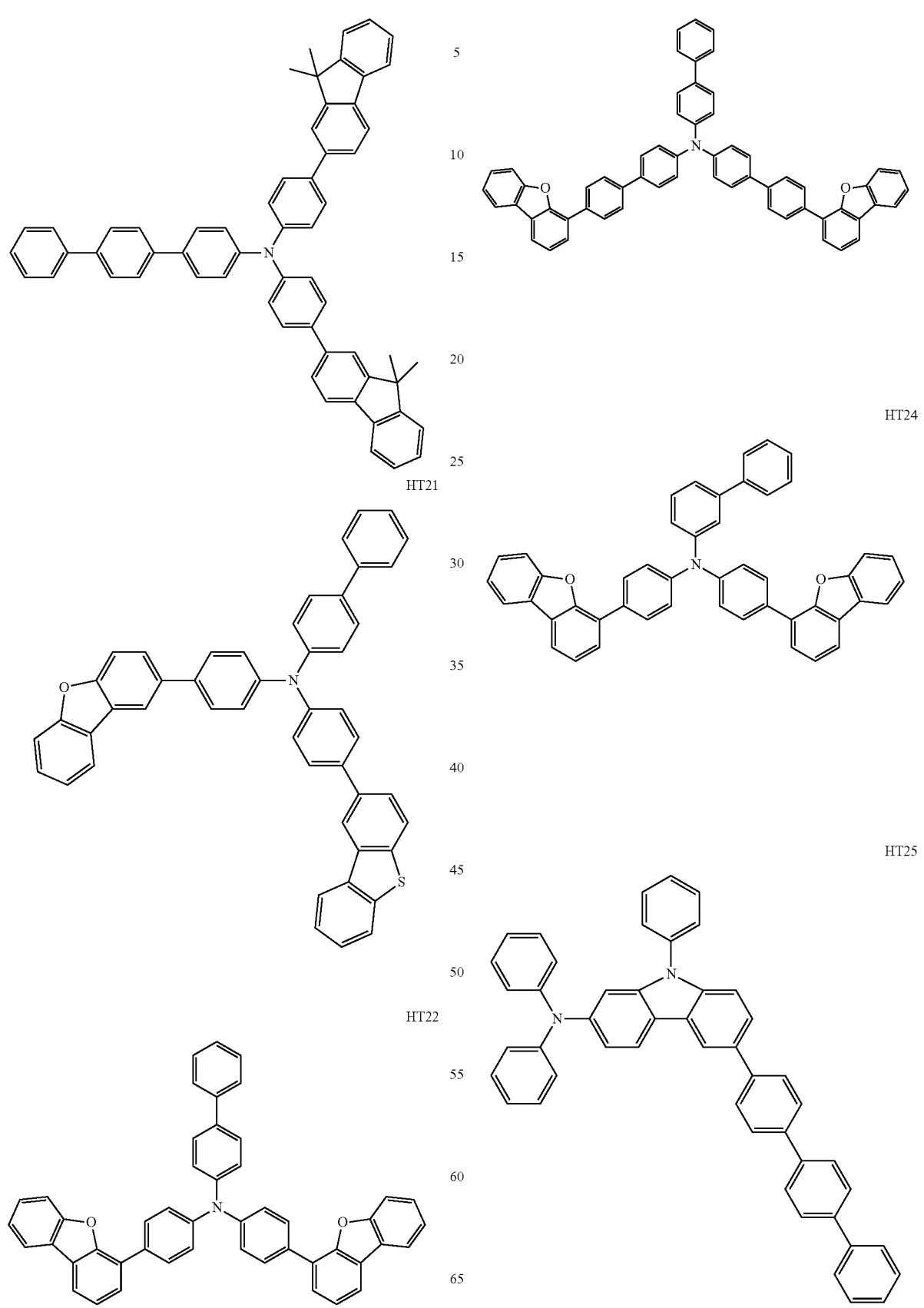

HT26
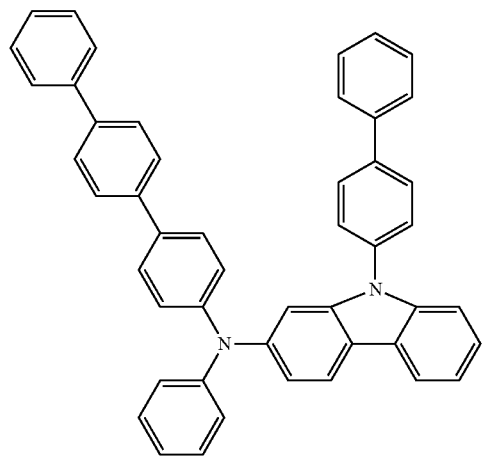
HT29
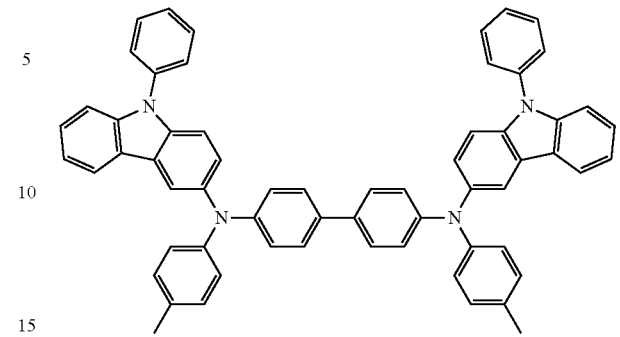
HT30
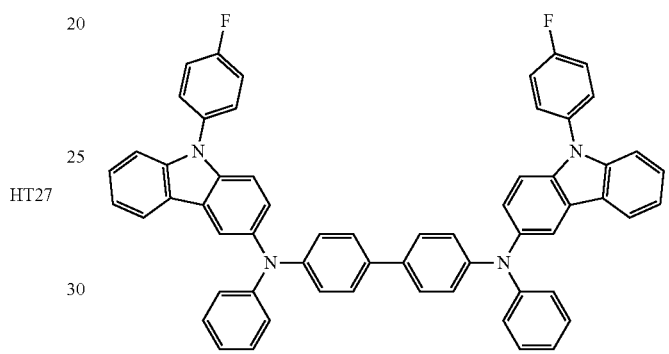
HT27
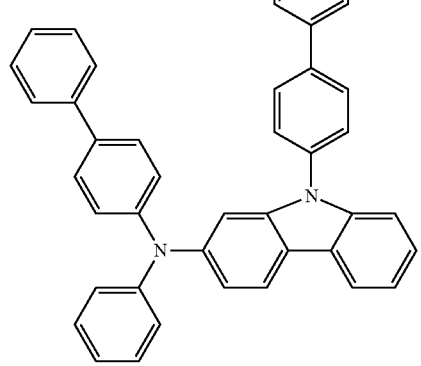
HT31
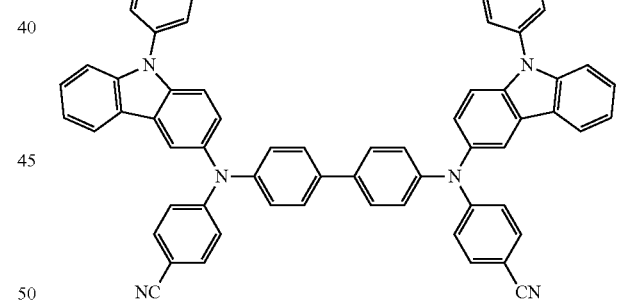
HT28
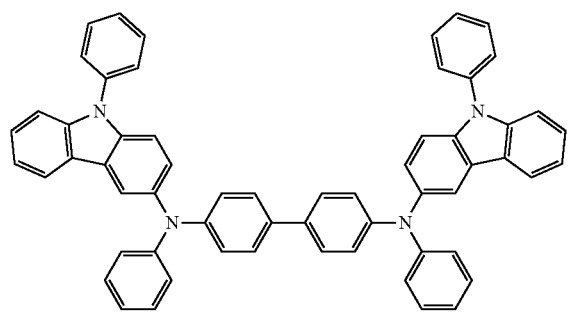
HT32
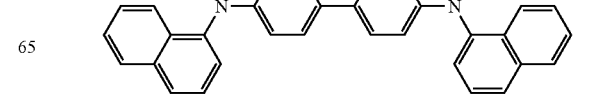

-continued
HT33
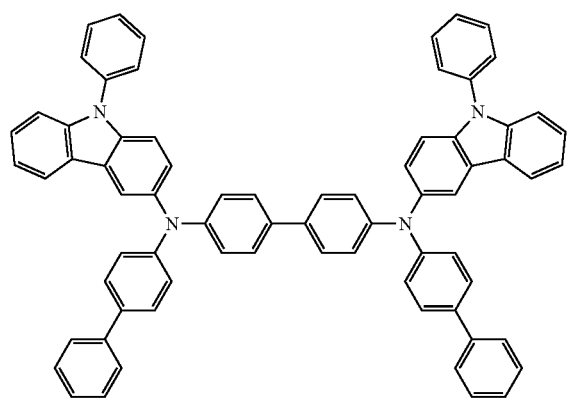
HT36
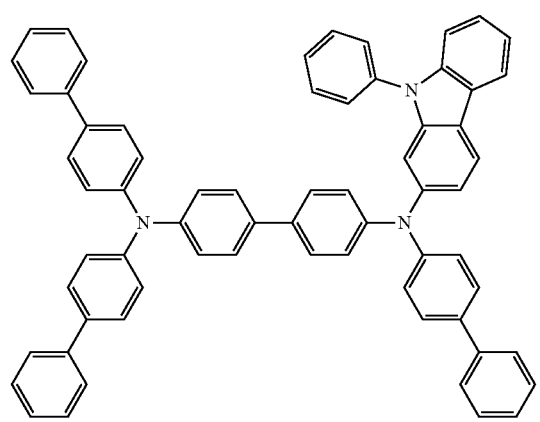
HT34
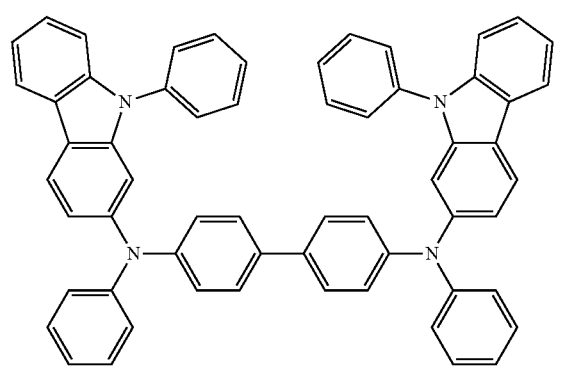
HT37
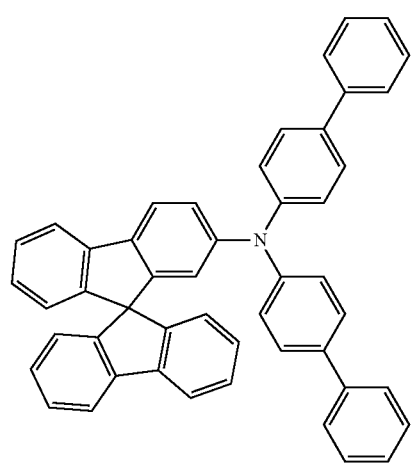
HT35
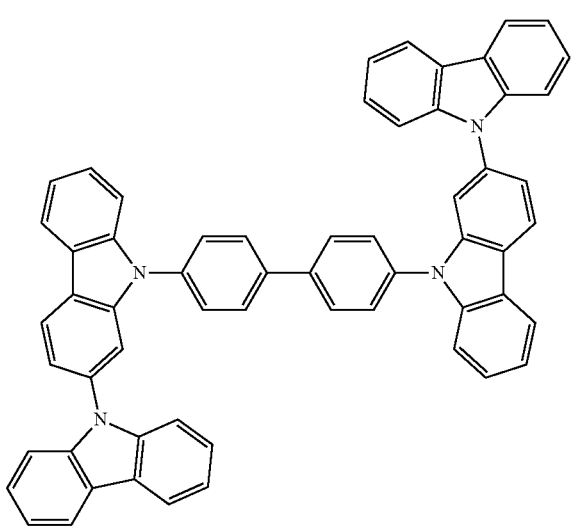
HT38
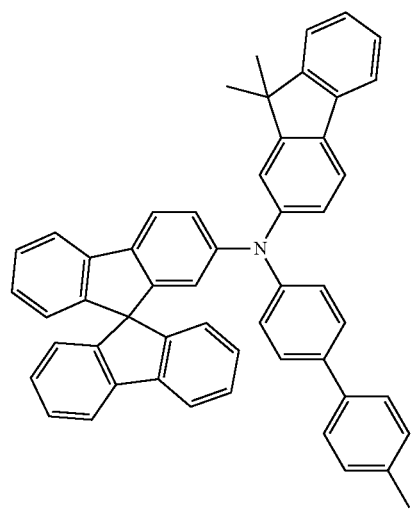

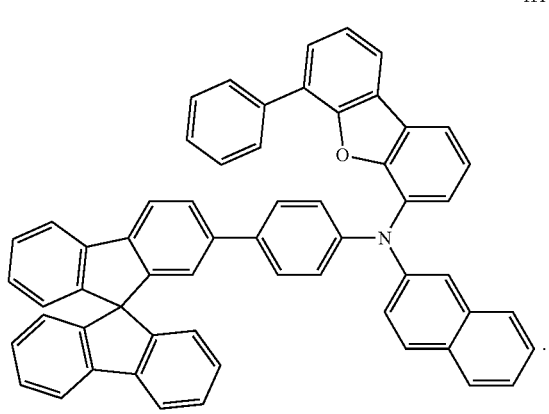

HT39

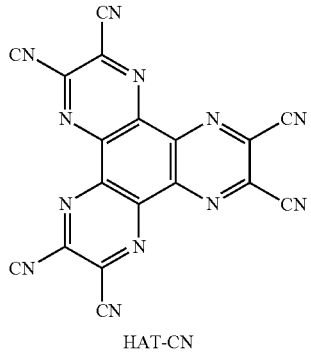

HAT-CN

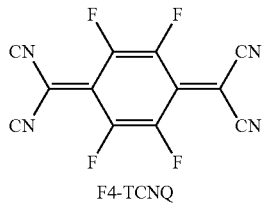

F4-TCNQ

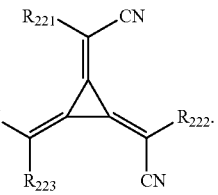

Formula 221

A thickness of the hole transport region 130 may be in a range of about 100 Å to about 10,000 Å, for example, about 100 Å to about 1,000 Å. When the hole transport region 130 includes at least one of a hole injection layer and a hole transport layer, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example about 100 Å to about 1,500 Å. When the thicknesses of the hole transport region 130, the hole injection layer, and the hole transport layer are within these ranges, suitable or satisfactory hole transporting characteristics may be obtained without a substantial increase in driving voltage.

The hole transport region 130 may further include, in addition to these materials, a charge-generation material for the improvement of conductive properties. The charge-generation material may be homogeneously or non-homogeneously dispersed in the hole transport region 130.

The charge-generation material may be, for example, a p-dopant.

In one embodiment, the p-dopant may have a lowest unoccupied molecular orbital (LUMO) energy level of −3.5 eV or less.

The p-dopant may include at least one selected from a quinone derivative, a metal oxide, and a cyano group-containing compound, but embodiments of the present disclosure are not limited thereto.

For example, the p-dopant may include at least one selected from:

a quinone derivative, such as tetracyanoquinodimethane (TCNQ) and 2,3,5,6-tetrafluoro-7,7,8,8-tetracyanoquinodimethane (F4-TCNQ);

a metal oxide, such as tungsten oxide or molybdenum oxide;

1,4,5,8,9,11-hexaazatriphenylene-hexacarbonitrile (HAT-CN); and a compound represented by Formula 221, but embodiments of the present disclosure are not limited thereto:

In Formula 221, $R_{221}$ to $R_{223}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, wherein at least one selected from $R_{221}$ to $R_{223}$ may have at least one substituent selected from a cyano group, —F, —Cl, —Br, —I, a $C_1$-$C_{20}$ alkyl group substituted with —F, a $C_1$-$C_{20}$ alkyl group substituted with —Cl, a $C_1$-$C_{20}$ alkyl group substituted with —Br, and a $C_1$-$C_{20}$ alkyl group substituted with —I.

The hole transport region may include a buffer layer. Also, the buffer layer may compensate for an optical resonance distance according to a wavelength of light emitted from the emission layer, and thus, efficiency of a formed organic light-emitting device may be improved.

The electron transport region may further include an electron blocking layer. The electron blocking layer may include, for example, mCP, but a material therefor is not limited thereto.

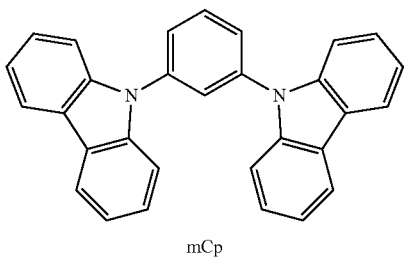 [SMILES: c1cc(-n2c3ccccc3c3ccccc32)cc(-n2c3ccccc3c3ccccc32)c1]

mCp

Emission Layer 150

The emission layer 150 may include a first emission layer 151 and a second emission layer 152. The emission layer 150 may be understood by referring to the description provided above.

Dopant in Emission Layer 150

An amount of the dopant in the emission layer 150 may be in a range of about 0.01 vol % to about 50 vol %, but embodiments of the present disclosure are not limited thereto. For example, the amount of the dopant in the emission layer 150 may be in a range of about 0.1 vol % to about 30 vol %, but embodiments of the present disclosure are not limited thereto.

Phosphorescent Dopant in Emission Layer of Organic Layer 120

The phosphorescent dopant may include an organometallic complex represented by Formula 401 below:

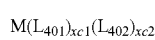  Formula 401

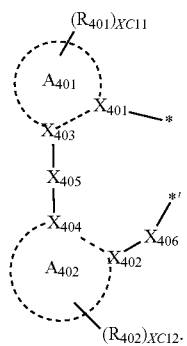  Formula 402

In Formulae 401 and 402,

M may be selected from iridium (Ir), platinum (Pt), palladium (Pd), osmium (Os), titanium (Ti), zirconium (Zr), hafnium (Hf), europium (Eu), terbium (Tb), rhodium (Rh), and thulium (Tm), $L_{401}$ may be selected from ligands represented by Formula 402, and xc1 may be 1, 2, or 3, wherein, when xc1 is two or more, two or more $L_{401}$(s) may be identical to or different from each other, $L_{402}$ may be an organic ligand, and xc2 may be an integer from 0 to 4, wherein, when xc2 is two or more, two or more $L_{402}$(s) may be identical to or different from each other, $X_{401}$ to $X_{404}$ may each independently be nitrogen or carbon, $X_{401}$ and $X_{403}$ may be linked via a single bond or a double bond, and $X_{402}$ and $X_{404}$ may be linked via a single bond or a double bond, $A_{401}$ and $A_{402}$ may each independently be a $C_5$-$C_{60}$ cyclic group or a $C_1$-$C_{60}$ heterocyclic group, $X_{405}$ may be a single bond, *—O—*', *—C(=O)—*', *—N($Q_{411}$)—*', *—C($Q_{411}$)($Q_{412}$)—*', *—C($Q_{411}$)=C($Q_{412}$)—*', *—C($Q_{411}$)=*', or *=C($Q_{411}$)=*', wherein $Q_{411}$ and $Q_{412}$ may be hydrogen, deuterium, a $C_1$-$C_{20}$ alkyl group, a $C_1$-$C_{20}$ alkoxy group, a phenyl group, a biphenyl group, a terphenyl group, or a naphthyl group, $X_{406}$ may be a single bond, O, or S, $R_{401}$ and $R_{402}$ may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{20}$ alkyl group, a substituted or unsubstituted $C_1$-$C_{20}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), and —P(=O)($Q_{401}$)($Q_{402}$), wherein $Q_{401}$ to $Q_{403}$ may each independently be selected from a $C_1$-$C_{10}$ alkyl group, a $C_1$-$C_{10}$ alkoxy group, a $C_6$-$C_{20}$ aryl group, and a $C_1$-$C_{20}$ heteroaryl group, xc11 and xc12 may each independently be an integer from 0 to 10, and

* and *' in Formula 402 each indicate a binding site to M in Formula 401.

In one embodiment, $A_{401}$ and $A_{402}$ in Formula 402 may each independently be selected from a benzene group, a naphthalene group, a fluorene group, a spiro-bifluorene group, an indene group, a pyrrole group, a thiophene group, a furan group, an imidazole group, a pyrazole group, a thiazole group, an isothiazole group, an oxazole group, an isoxazole group, a pyridine group, a pyrazine group, a pyrimidine group, a pyridazine group, a quinoline group, an isoquinoline group, a benzoquinoline group, a quinoxaline group, a quinazoline group, a carbazole group, a benzimidazole group, a benzofuran group, a benzothiophene group, an isobenzothiophene group, a benzoxazole group, an isobenzoxazole group, a triazole group, a tetrazole group, an oxadiazole group, a triazine group, a dibenzofuran group, and a dibenzothiophene group.

In one or more embodiments, in Formula 402, i) $X_{401}$ may be nitrogen, and $X_{402}$ may be carbon, or ii) $X_{401}$ and $X_{402}$ may each be nitrogen concurrently (e.g., at the same time).

In one or more embodiments, $R_{401}$ and $R_{402}$ in Formula 402 may each independently be selected from:

hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amidino group, a hydrazino group, a hydrazono group, a phenyl group, a naphthyl group, a cyclopentyl group, a cyclohexyl group, an adamantly group, a norbornanyl group, and a norbornenyl group;

a cyclopentyl group, a cyclohexyl group, an adamantly group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group;

a cyclopentyl group, a cyclohexyl group, an adamantly group, a norbornanyl group, a norbornenyl group a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, an adamantly group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group; and —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), and —P(=O)($Q_{401}$)($Q_{402}$), and $Q_{401}$ to $Q_{403}$ may each independently be selected from a $C_1$-$C_{10}$ alkyl group, a $C_1$-$C_{10}$ alkoxy group, a phenyl group, a biphenyl group, and a naphthyl group, but embodiments of the present disclosure are not limited thereto.

In one or more embodiments, when xc1 in Formula 401 is two or more, two $A_{401}$(s) in two or more $L_{401}$(s) may optionally be linked via $X_{407}$, which is a linking group, or two $A_{402}$(s) in two or more $L_{401}$(s) may optionally be linked via $X_{408}$, which is a linking group (see Compounds PD1 to PD4 and PD7). $X_{407}$ and $X_{408}$ may each independently be a single bond, *—O—*', *—C(=O)—*', *—N($Q_{413}$)—*', *—C($Q_{413}$)($Q_{414}$)—*' or *—C($Q_{413}$)=C($Q_{414}$)—*' (wherein $Q_{413}$ and $Q_{414}$ may each independently be hydrogen, deuterium, a $C_1$-$C_{20}$ alkyl group, a $C_1$-$C_{20}$ alkoxy group, a phenyl group, a biphenyl group, a terphenyl group, or a naphthyl group), but embodiments of the present disclosure are not limited thereto.

$L_{402}$ in Formula 401 may be a monovalent, divalent, or trivalent organic ligand. For example, $L_{402}$ may be selected from halogen, diketone (for example, acetylacetonate), carboxylic acid (for example, picolinate), —C(=O), isonitrile, —CN, and phosphorus (for example, phosphine or phosphite), but embodiments of the present disclosure are not limited thereto.

In one or more embodiments, the phosphorescent dopant may be selected from, for example, Compounds PD1 to PD25, but embodiments of the present disclosure are not limited thereto:

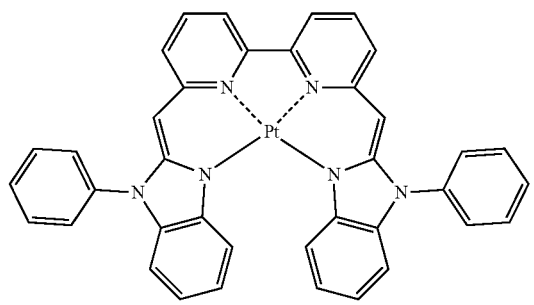

PD1

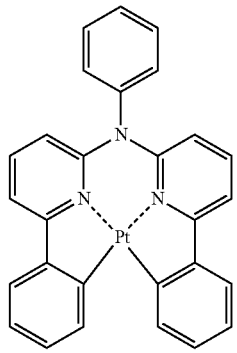

PD2

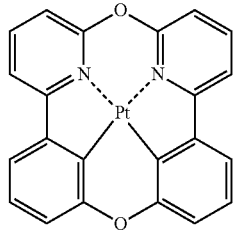

PD3

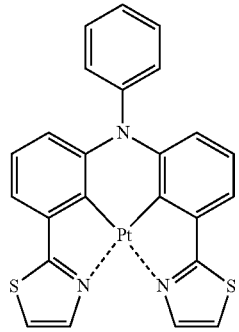

PD4

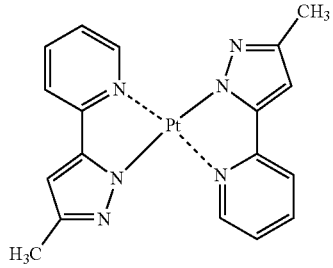

PD5

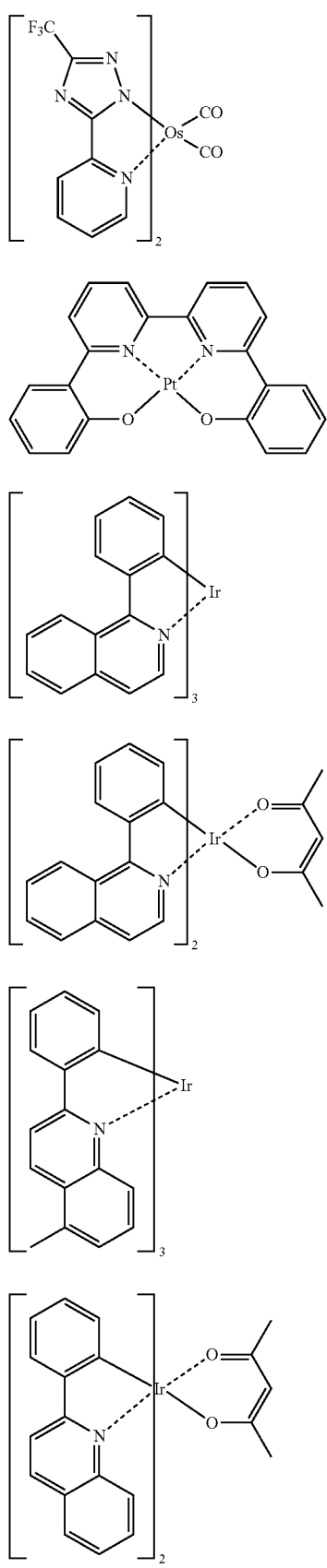
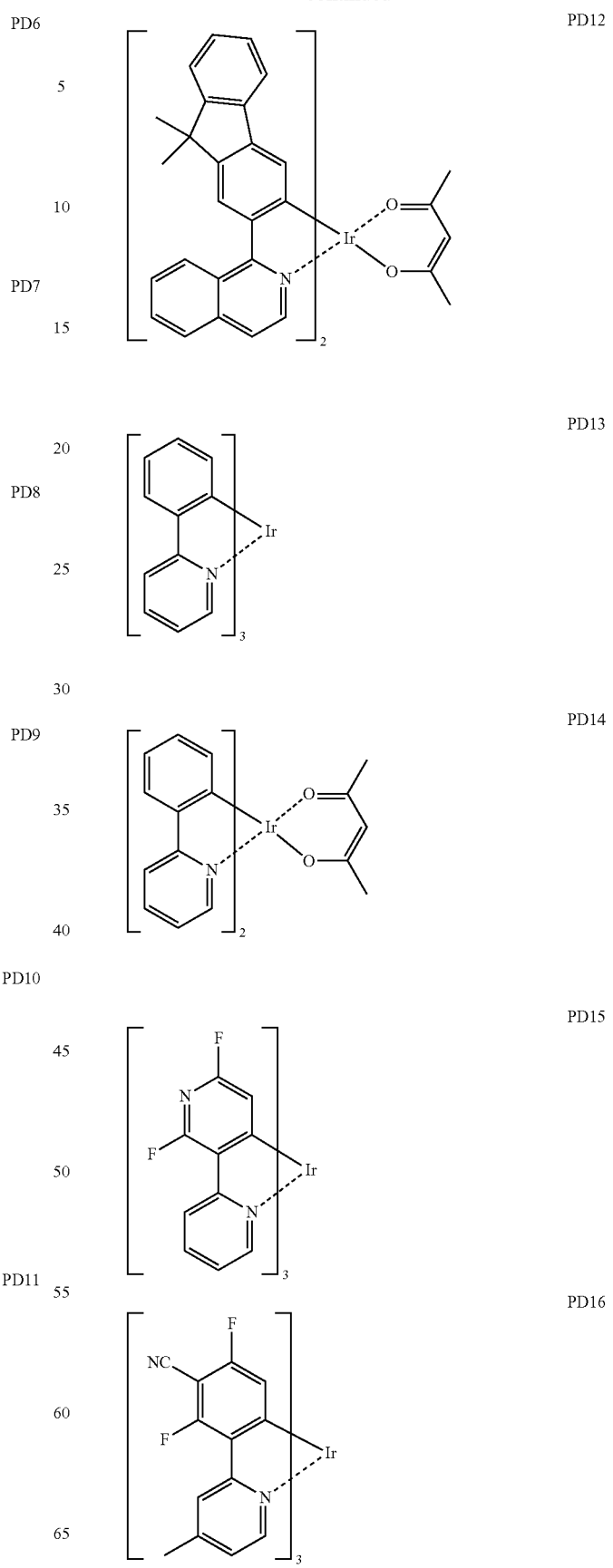

PD17 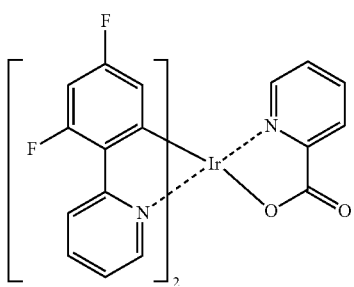
PD18 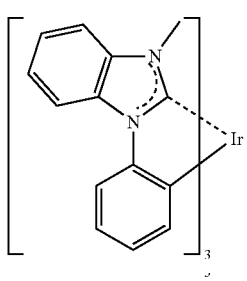
PD19 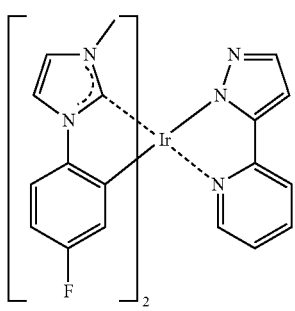
PD20 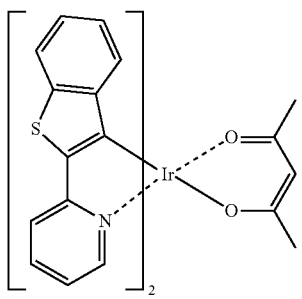
PD21 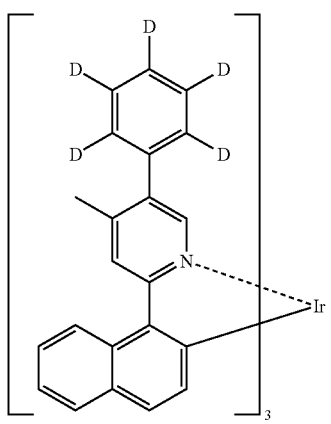
PD22 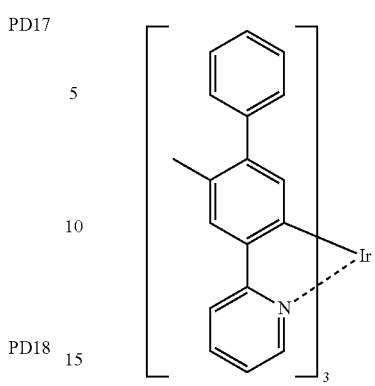
PD23 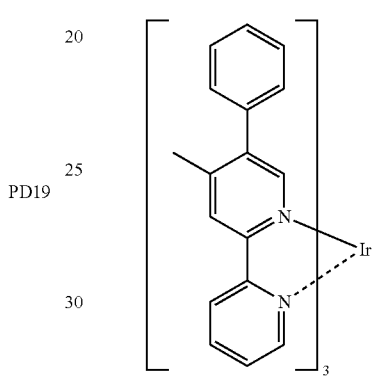
PD24 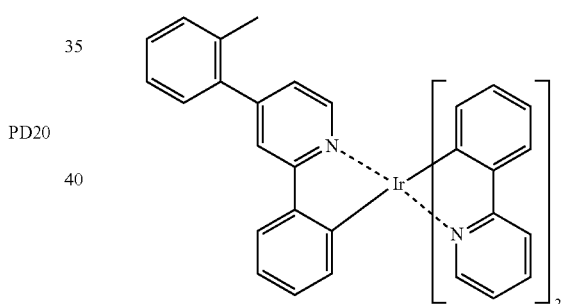
PD25 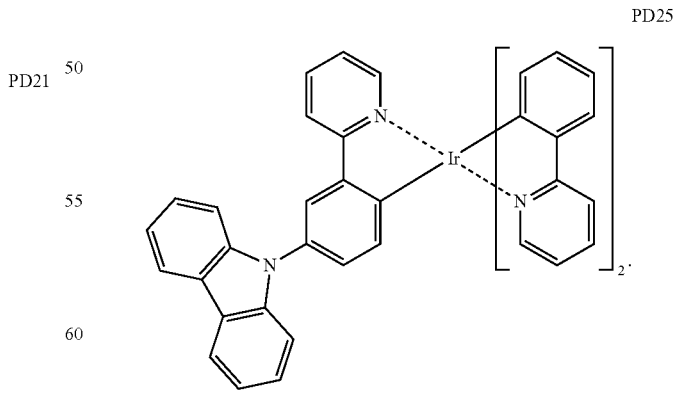
Fluorescent Dopant in Emission Layer
The fluorescent dopant may include an arylamine compound or a styrylamine compound.

The fluorescent dopant may include a compound represented by Formula 501 below:

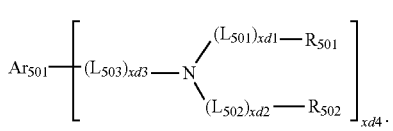

Formula 501

In Formula 501, $Ar_{501}$ may be a substituted or unsubstituted $C_5$-$C_{60}$ carbocyclic group or a substituted or unsubstituted $C_1$-$C_{60}$ heterocyclic group, $L_{501}$ to $L_{503}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xd1 to xd3 may each independently be an integer from 0 to 3, $R_{501}$ and $R_{502}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, and xd4 may be an integer from 1 to 6.

In one embodiment, $Ar_{501}$ in Formula 501 may be selected from:

a naphthalene group, a heptalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, and an indenophenanthrene group; and a naphthalene group, a heptalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, and an indenophenanthrene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In one or more embodiments, $L_{501}$ to $L_{503}$ in Formula 501 may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

In one or more embodiments, $R_{501}$ and $R_{502}$ in Formula 501 may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, and —Si($Q_{31}$)($Q_{32}$)($Q_{33}$), and $Q_{31}$ to $Q_{33}$ may each independently be selected from a $C_1$-$C_{10}$ alkyl group, a alkoxy group, a phenyl group, a biphenyl group, a terphenyl group, and a naphthyl group.

In one or more embodiments, xd4 in Formula 501 may be 2, but embodiments of the present disclosure are not limited thereto.

For example, the fluorescent dopant may be selected from Compounds FD1 to FD22:

FD1
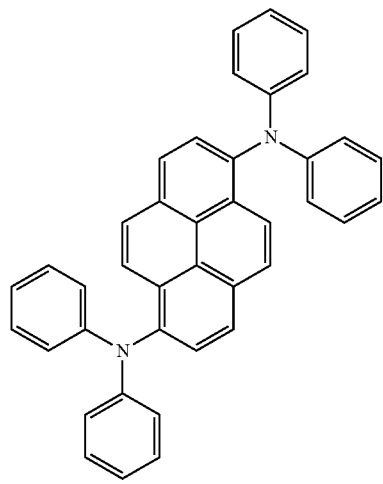

FD2
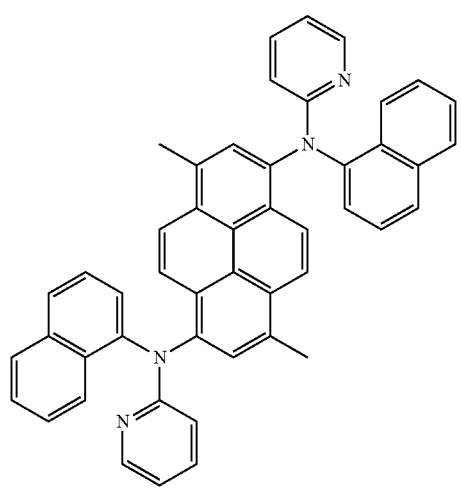

FD3
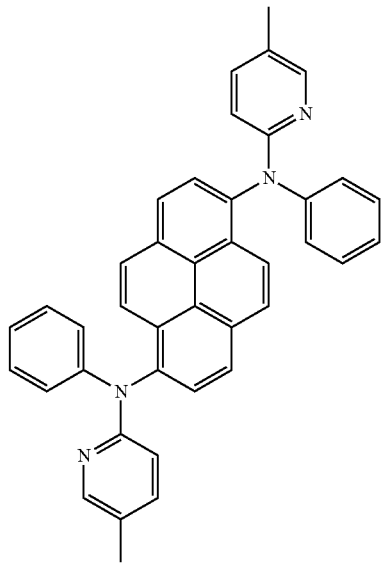

FD4
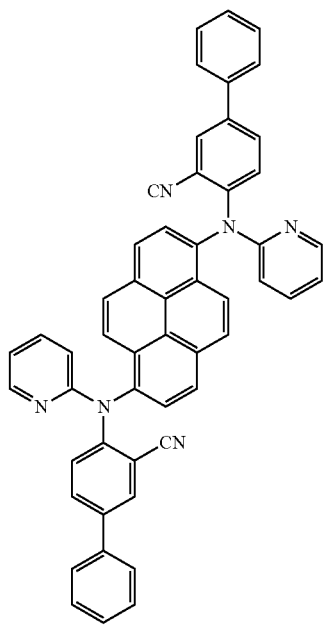

FD5
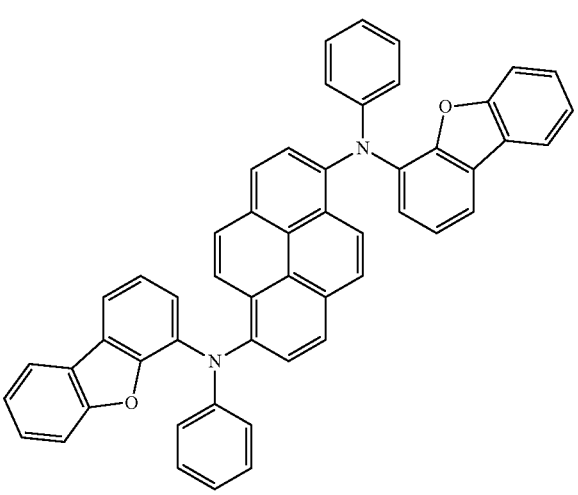

FD6
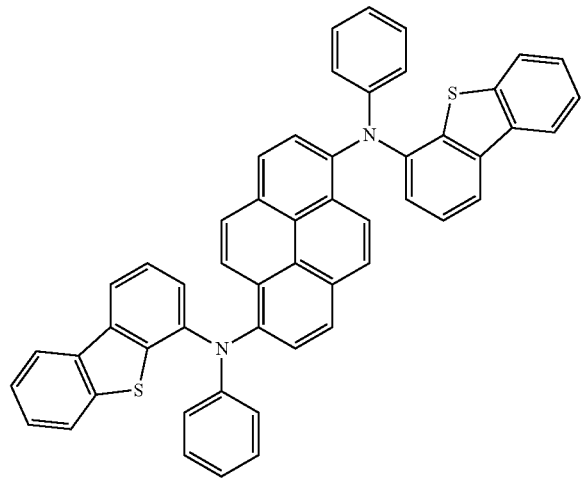
FD9
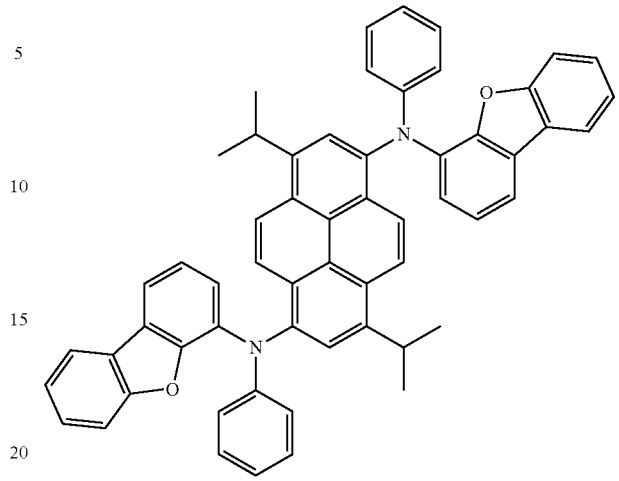
FD7
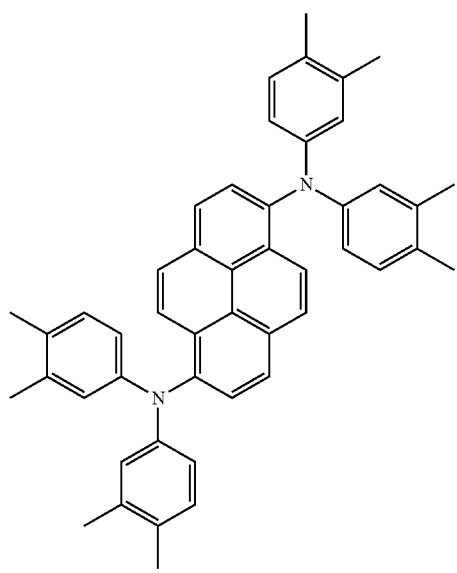
FD10
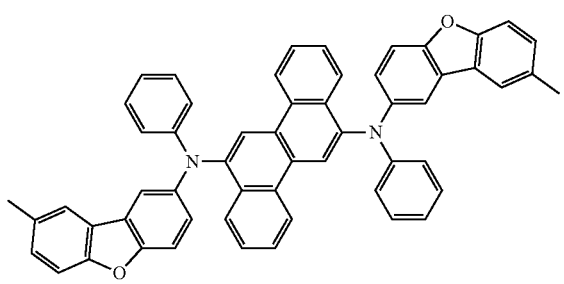
FD8
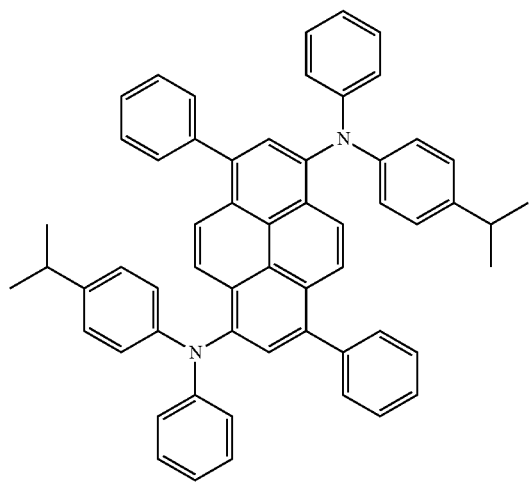
FD11
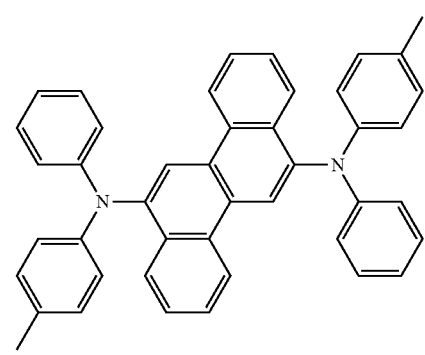
FD12

FD13
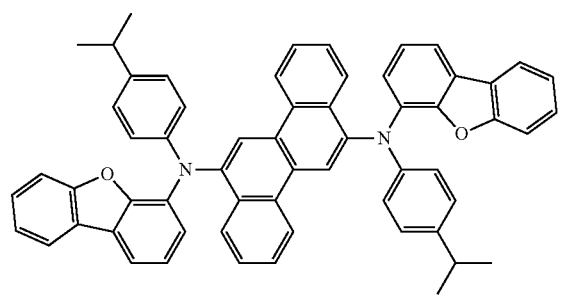
FD18
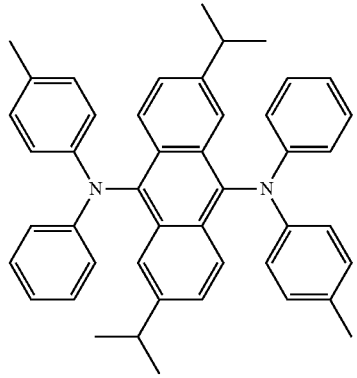
FD14
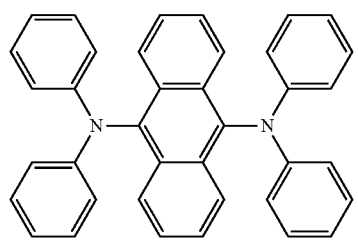
FD19
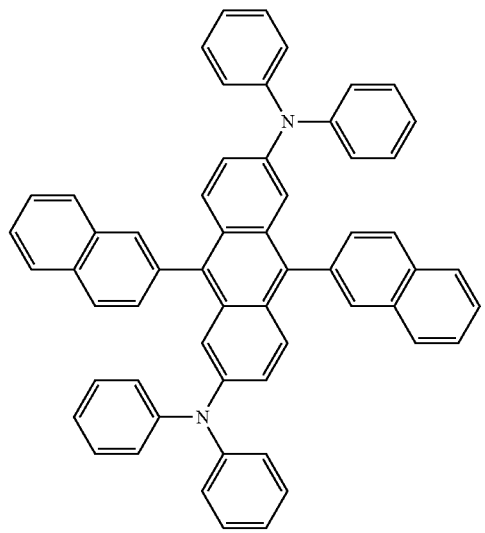
FD15
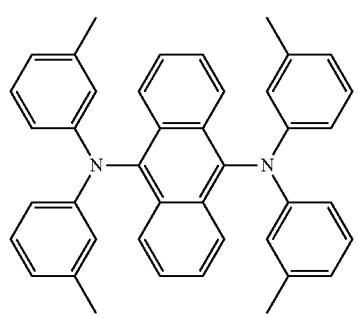
FD16
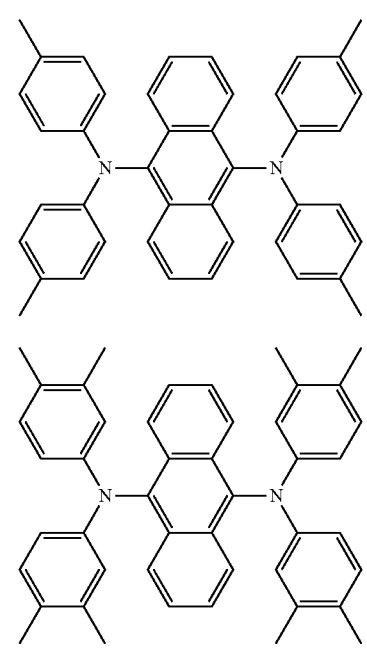
FD20
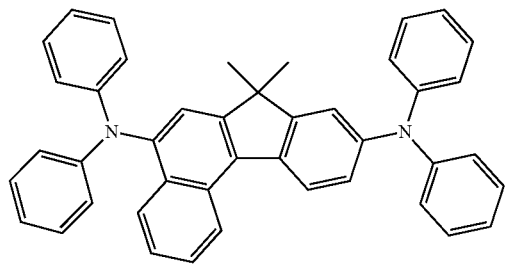
FD17
FD21
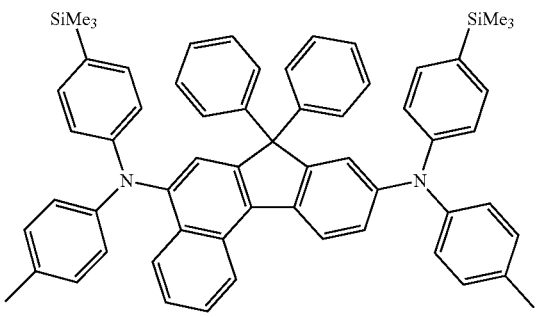

-continued
FD22
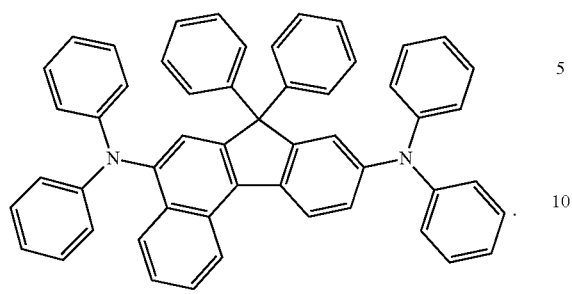
In one or more embodiments, the fluorescent dopant may be selected from the following compounds, but embodiments of the present disclosure are not limited thereto:
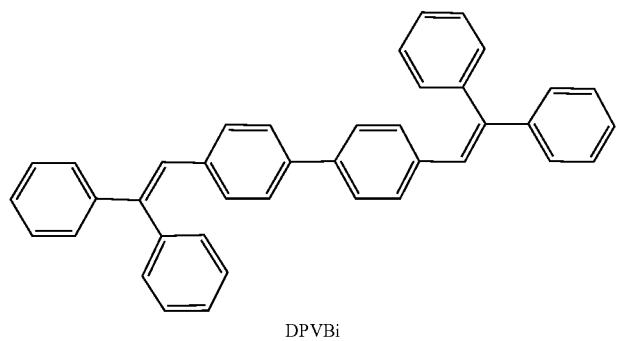
DPVBi
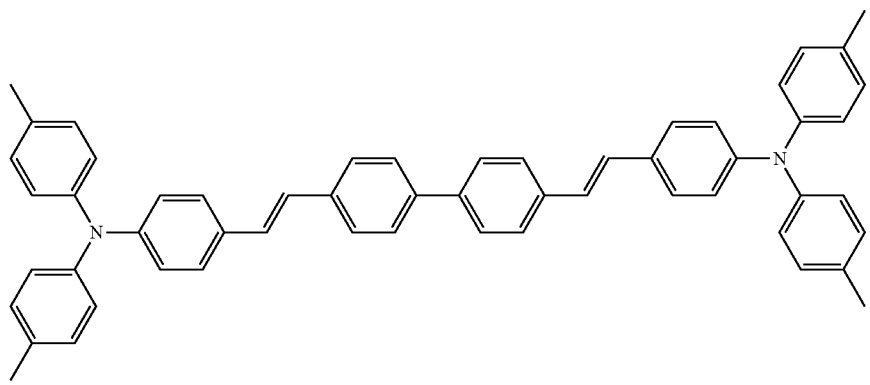
DPAVBi
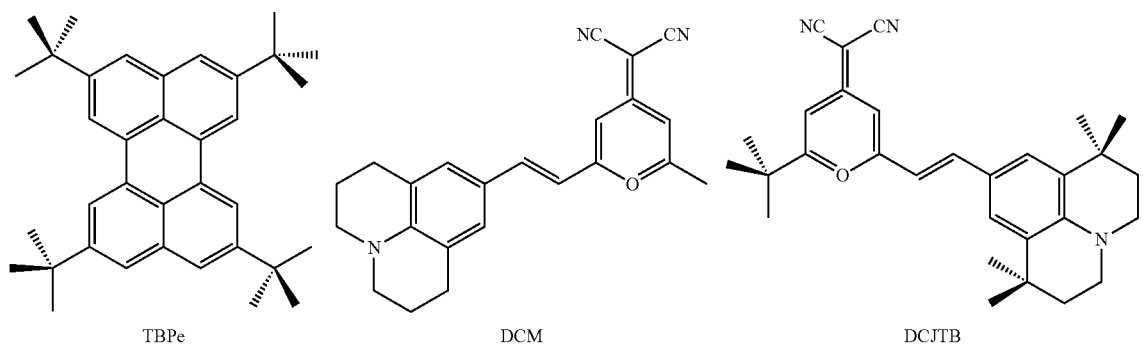
TBPe        DCM        DCJTB

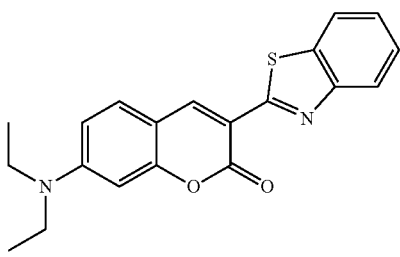
Coumarin 6

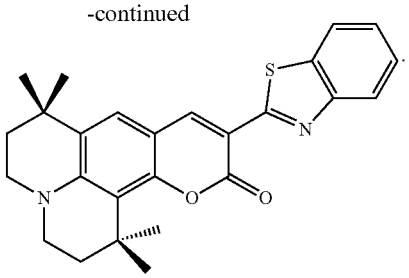
C545T

Electron Transport Region 170

The electron transport region 170 may have i) a single-layered structure including a single layer including a single material, ii) a single-layered structure including a single layer including a plurality of different materials, or iii) a multi-layered structure having a plurality of layers including a plurality of different materials.

The electron transport region 170 may include at least one selected from a buffer layer, a hole blocking layer, an electron control layer, an electron transport layer, and an electron injection layer, but embodiments of the present disclosure are not limited thereto.

For example, the electron transport region 170 may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein for each structure, constituting layers are sequentially stacked from an emission layer. However, embodiments of the structure of the electron transport region are not limited thereto.

The electron transport region 170 (for example, a buffer layer, a hole blocking layer, an electron control layer, or an electron transport layer in the electron transport region) may include a metal-free compound containing at least one 7 electron-depleted nitrogen-containing ring.

The term "π electron-depleted nitrogen-containing ring," as used herein, refers to a $C_1$-$C_{60}$ heterocyclic group having at least one *—N=*' moiety as a ring-forming moiety.

For example, the "π electron-depleted nitrogen-containing ring" may be i) a 5-membered to 7-membered heteromonocyclic group having at least one *—N=*' moiety, ii) a heteropolycyclic group in which two or more 5-membered to 7-membered heteromonocyclic groups each having at least one *—N=*' moiety are condensed with each other, or iii) a heteropolycyclic group in which at least one of 5-membered to 7-membered heteromonocyclic groups, each having at least one *—N=*' moiety, is condensed with at least one $C_5$-$C_{60}$ carbocyclic group.

Examples of the π electron-depleted nitrogen-containing ring include an imidazole, a pyrazole, a thiazole, an isothiazole, an oxazole, an isoxazole, a pyridine, a pyrazine, a pyrimidine, a pyridazine, an indazole, a purine, a quinoline, an isoquinoline, a benzoquinoline, a phthalazine, a naphthyridine, a quinoxaline, a quinazoline, a cinnoline, a phenanthridine, an acridine, a phenanthroline, a phenazine, a benzimidazole, an isobenzothiazole, a benzoxazole, an isobenzoxazole, a triazole, a tetrazole, an oxadiazole, a triazine, a thiadiazole, an imidazopyridine, an imidazopyrimidine, and an azacarbazole, but are not limited thereto.

For example, the electron transport region may include a compound represented by Formula 601:

$$[Ar_{601}]_{xe11}-[(L_{601})_{xe1}-R_{601}]_{xe21} \quad \text{Formula 601}$$

In Formula 601, $Ar_{601}$ may be a substituted or unsubstituted $C_5$-$C_{60}$ carbocyclic group or a substituted or unsubstituted $C_1$-$C_{60}$ heterocyclic group, xe11 may be 1, 2, or 3, $L_{601}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xe1 may be an integer from 0 to 5, $R_{601}$ may be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{601}$)($Q_{602}$)($Q_{603}$), —C(=O)($Q_{601}$), —S(=O)$_2$($Q_{601}$), and —P(=O)($Q_{601}$)($Q_{602}$), and $Q_{601}$ to $Q_{603}$ may each independently be a $C_1$-$C_{10}$ alkyl group, a $C_1$-$C_{10}$ alkoxy group, a phenyl group, a biphenyl group, a terphenyl group, or a naphthyl group, and xe21 may be an integer from 1 to 5.

In one embodiment, at least one of $Ar_{601}$(s) in the number of xe11 and $R_{601}$(s) in the number of xe21 may include the π electron-depleted nitrogen-containing ring.

In one embodiment, ring $Ar_{601}$ in Formula 601 may be selected from:

a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group; and a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —S(=O)$_2$($Q_{31}$), and —P(=O)($Q_{31}$)($Q_{32}$), and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

When xe11 in Formula 601 is two or more, two or more Ar$_{601}$(s) may be linked via a single bond.

In one or more embodiments, Ar$_{601}$ in Formula 601 may be an anthracene group.

In one or more embodiments, the compound represented by Formula 601 may be represented by Formula 601-1 below:

Formula 601-1

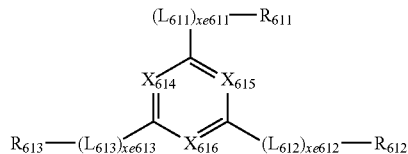

In Formula 601-1, $X_{614}$ may be N or C($R_{614}$), $X_{615}$ may be N or C($R_{615}$), and $X_{616}$ may be N or C($R_{616}$), wherein at least one selected from $X_{614}$ to $X_{616}$ may be N, $L_{611}$ to $L_{613}$ may each independently be the same as defined in connection with $L_{601}$, xe611 to xe613 may each independently be the same as defined in connection with xe1, $R_{611}$ to $R_{613}$ may each independently be the same as defined in connection with $R_{601}$, and $R_{614}$ to $R_{616}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In one embodiment, $L_{601}$ and $L_{611}$ to $L_{613}$ in Formulae 601 and 601-1 may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, but embodiments of the present disclosure are not limited thereto.

In one or more embodiments, xe1 and xe611 to xe613 in Formulae 601 and 601-1 may each independently be 0, 1, or 2.

In one or more embodiments, $R_{601}$ and $R_{611}$ to $R_{613}$ in Formulae 601 and 601-1 may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group;

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and —S(=O)$_2$(Q$_{601}$) and —P(=O)(Q$_{601}$)(Q$_{602}$), and Q$_{601}$ and Q$_{602}$ are the same as described above.

The electron transport region 170 may include at least one compound selected from Compounds ET1 to ET36, but embodiments of the present disclosure are not limited thereto:

ET1
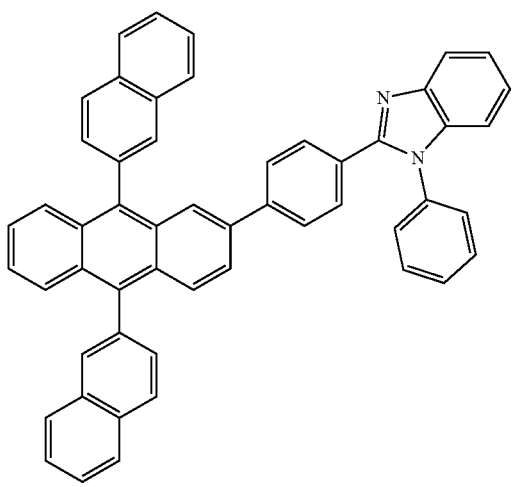
ET2
ET3
ET4
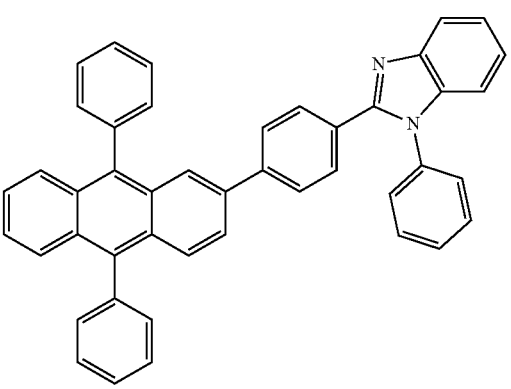
ET5
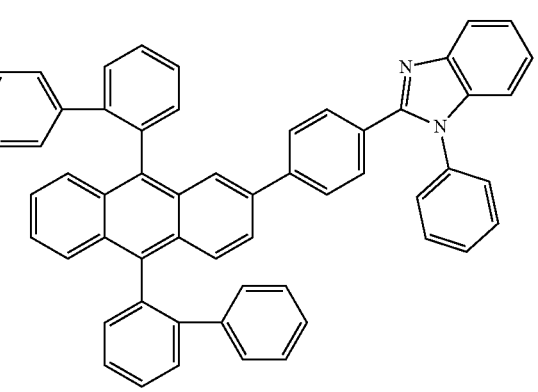
ET6
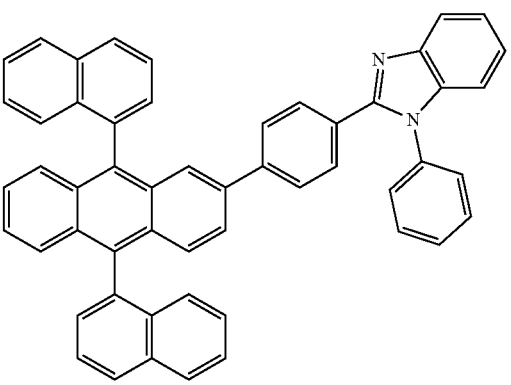

ET7
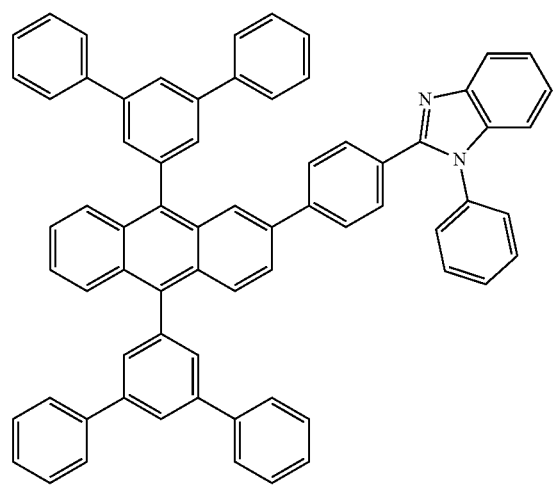
ET8
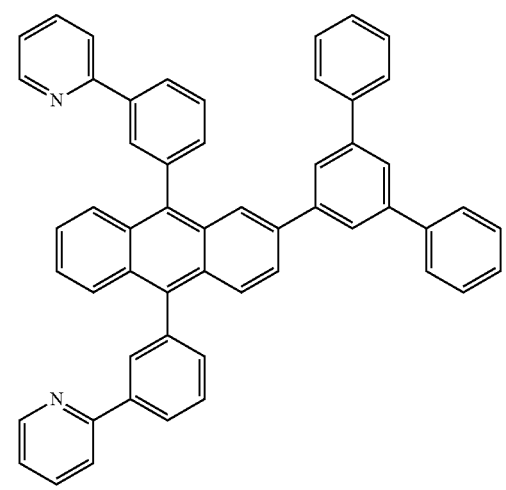
ET9
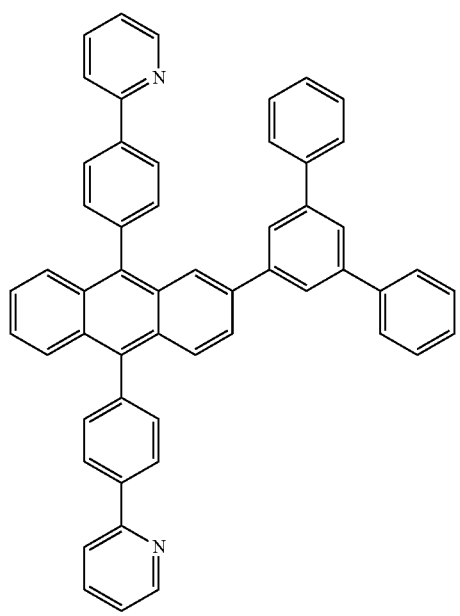
ET10
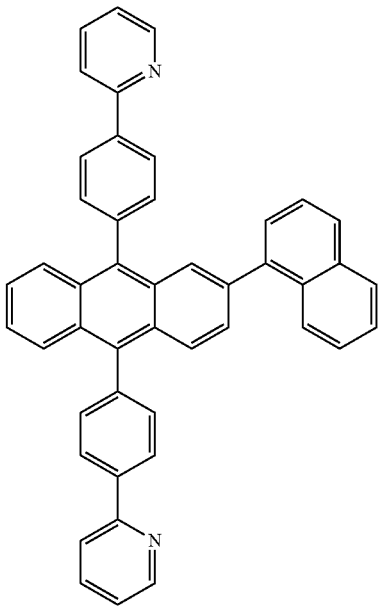
ET11
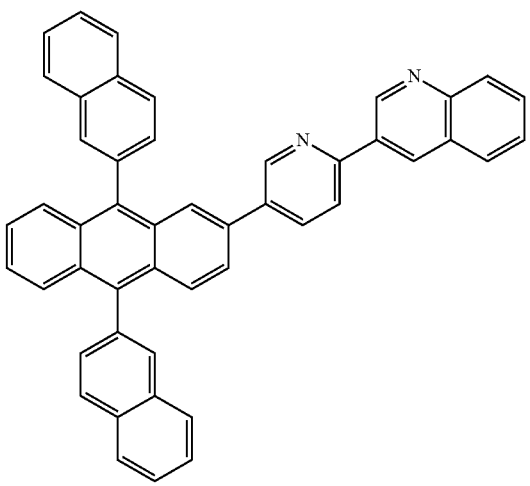
ET12
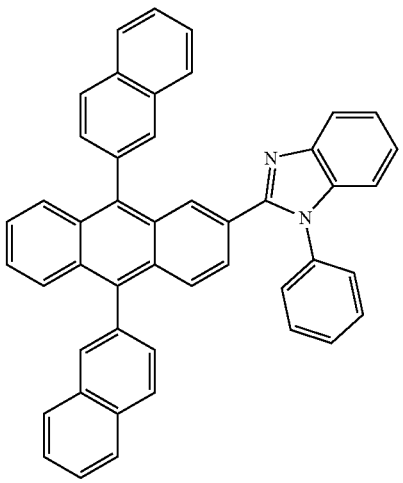

ET13
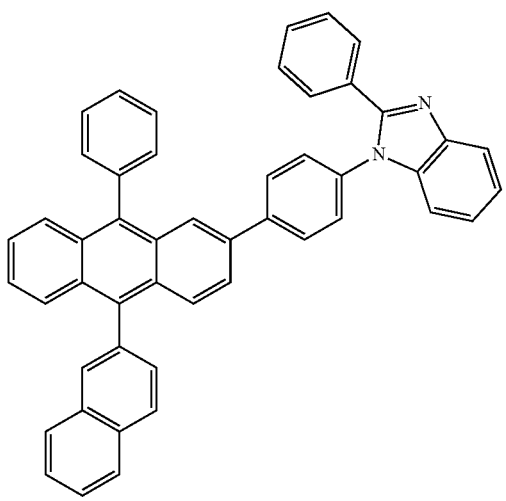
ET14
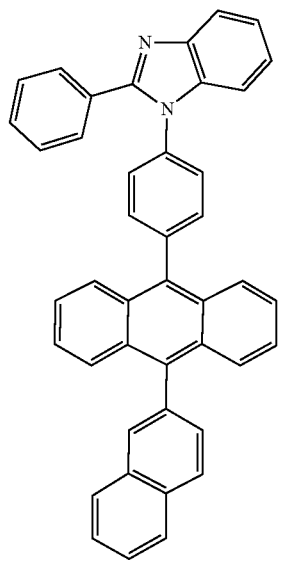
ET15
ET16
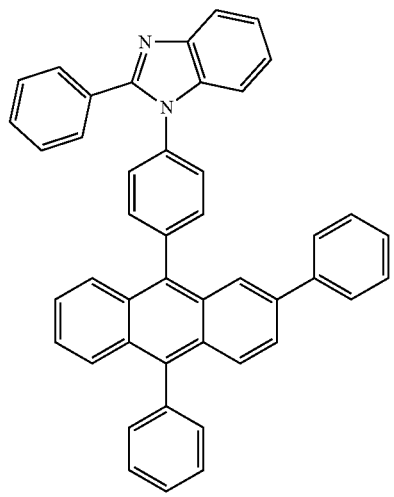
ET17
ET18
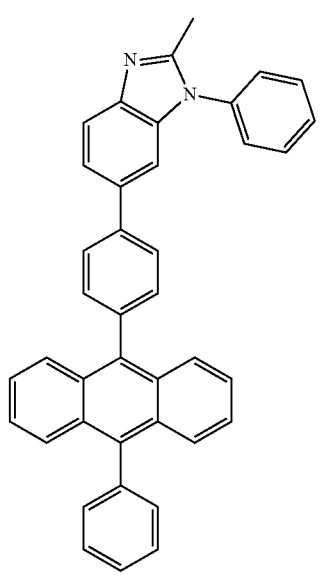

ET19
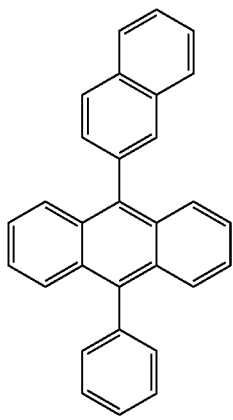
ET20
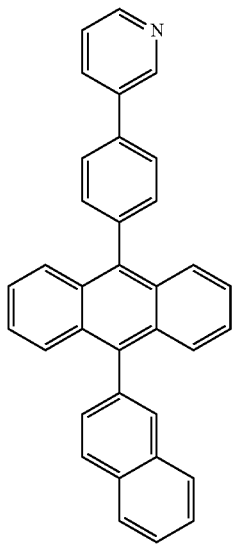
ET21
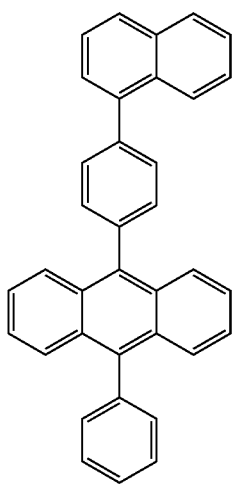
ET22
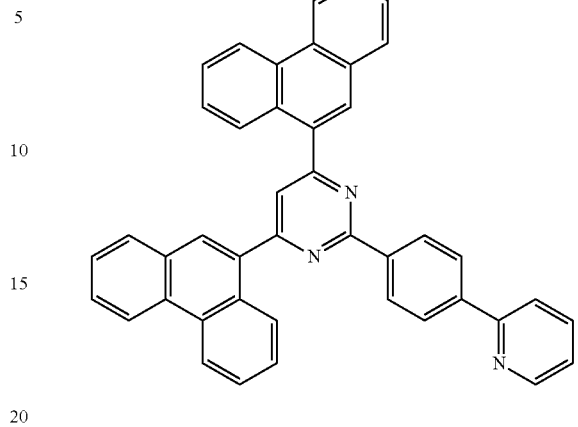
ET23
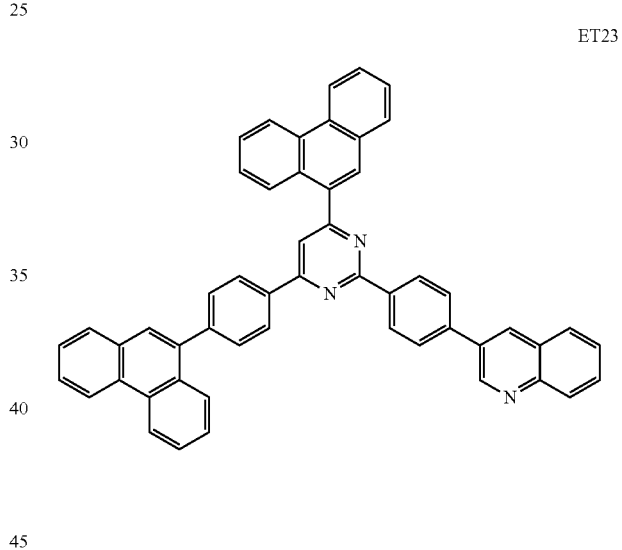
ET24
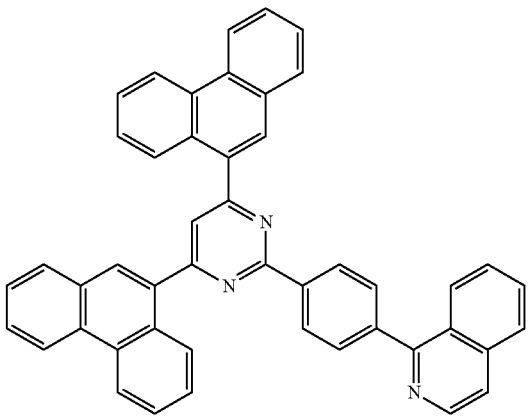

ET25
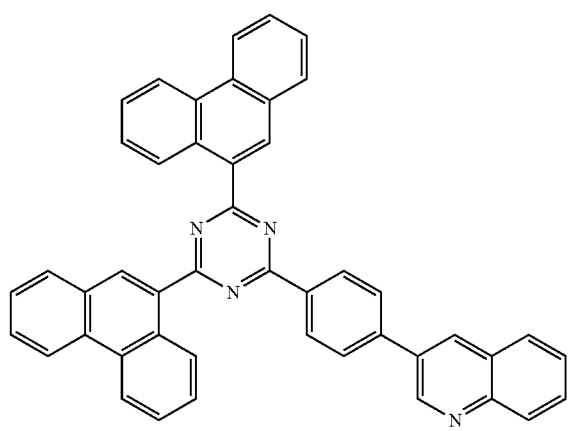
ET28
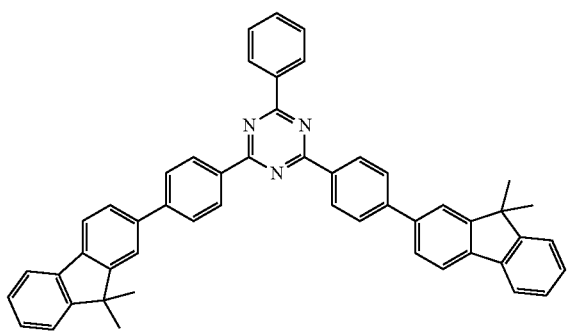
ET26
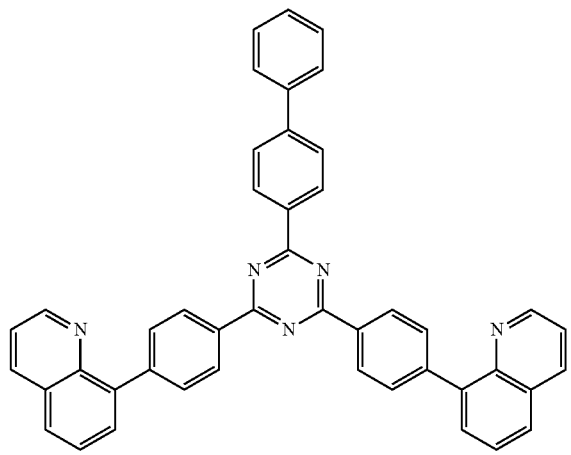
ET29
ET27
ET30
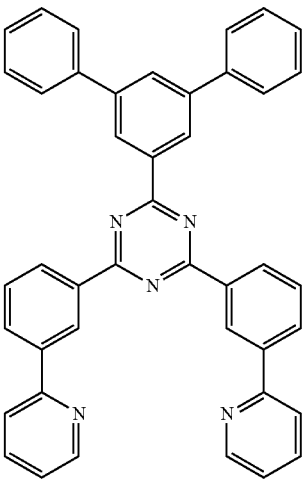

ET31
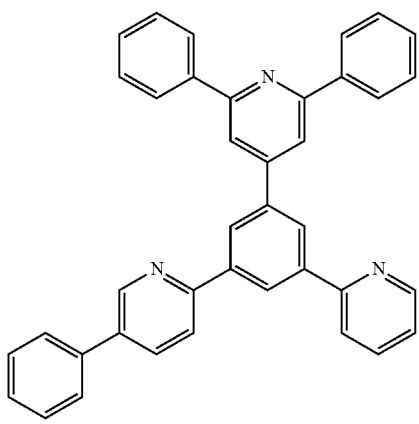
ET32
ET33
ET34
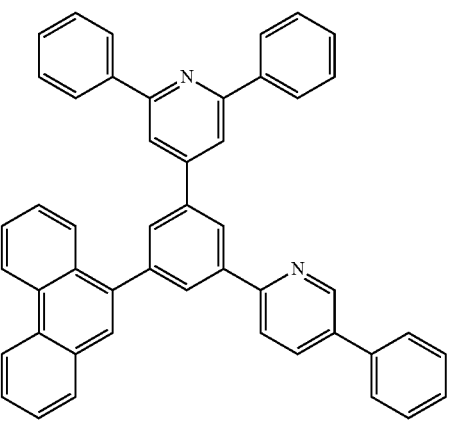
ET35
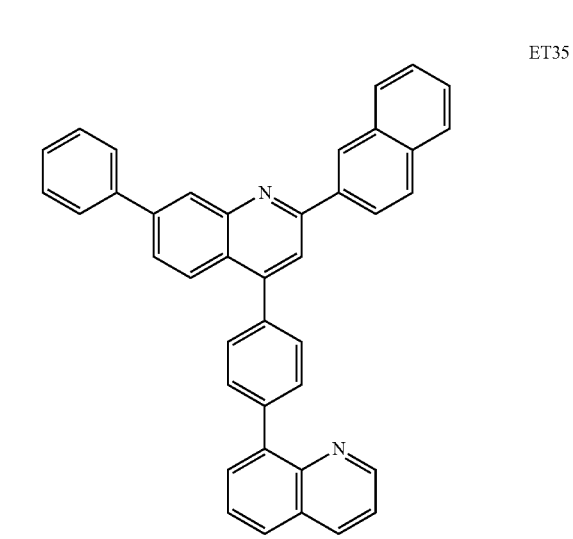
ET36
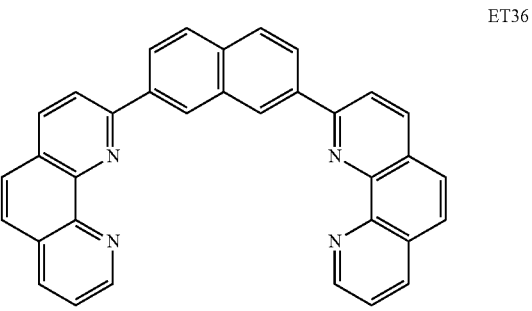
In one or more embodiments, the electron transport region 170 may include at least one compound selected from 2,9-dimethyl-4,7-diphenyl-1,10-phenanthroline (BCP), 4,7-diphenyl-1,10-phenanthroline (Bphen), Alq$_3$, BAlq, 3-(biphenyl-4-yl)-5-(4-tert-butylphenyl)-4-phenyl-4H-1,2,4-triazole (TAZ), NTAZ, diphenyl(4-(triphenylsilyl)phenyl)-phosphine oxide (TSPO1), TPBI, and DPEPO:

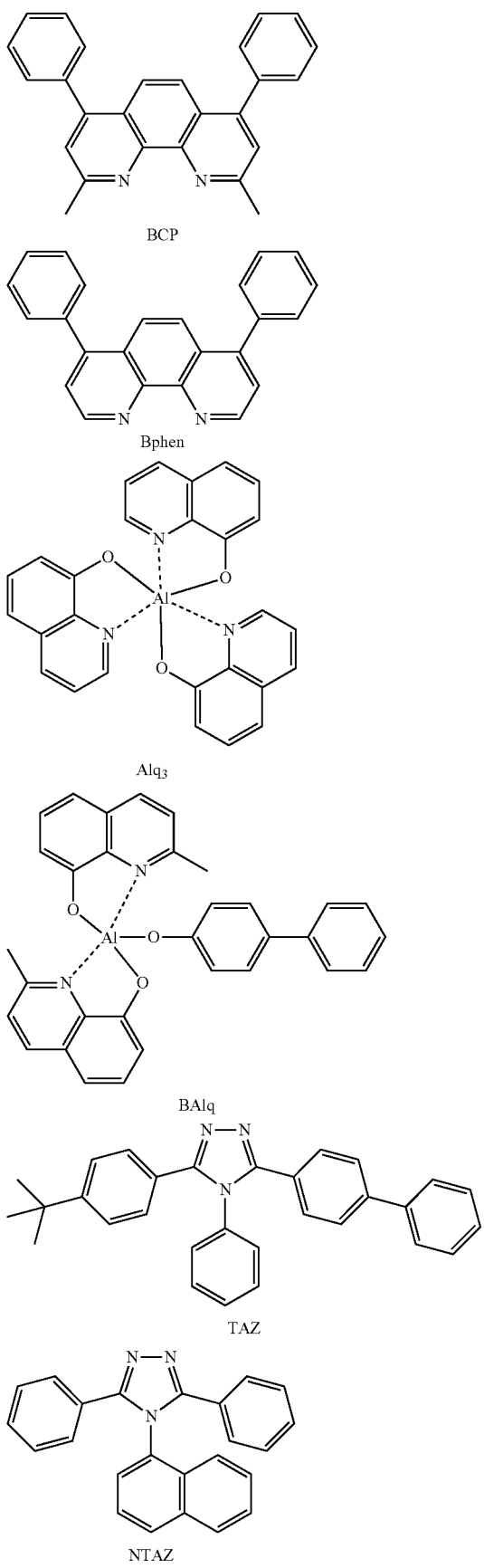
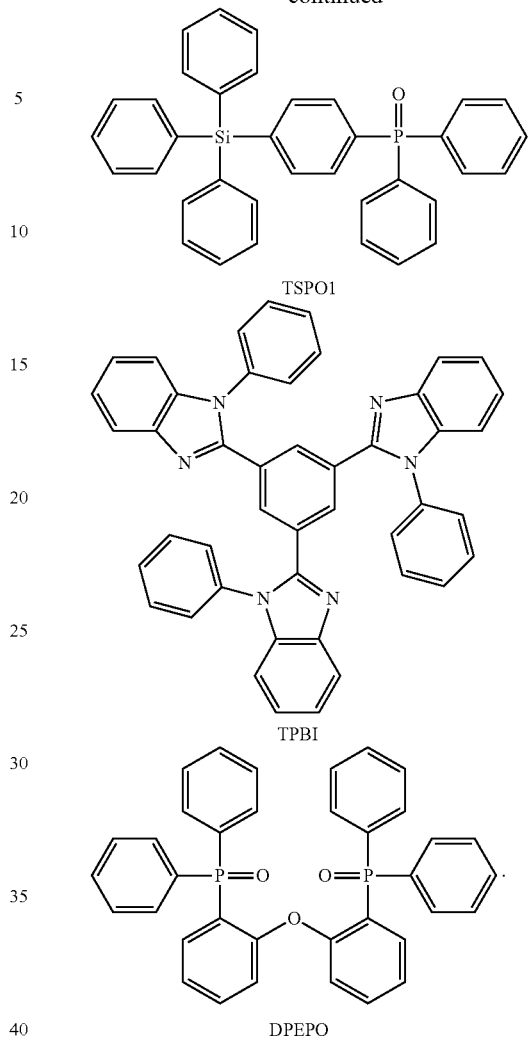

A thickness of the buffer layer, the hole blocking layer, or the electron control layer may be in a range of about 20 Å to about 1,000 Å, for example, about 30 Å to about 300 Å. When the thicknesses of the buffer layer, the hole blocking layer, and the electron control layer are within these ranges, the electron blocking layer may have excellent electron blocking characteristics or electron control characteristics without a substantial increase in driving voltage.

A thickness of the electron transport layer may be from about 100 Å to about 1,000 Å, for example, about 150 Å to about 500 Å. When the thickness of the electron transport layer is within the range described above, suitable or satisfactory electron transport characteristics may be obtained without a substantial increase in driving voltage.

The electron transport region (for example, the electron transport layer in the electron transport region) may further include, in addition to the materials described above, a metal-containing material.

The metal-containing material may include at least one selected from alkali metal complex and alkaline earth-metal complex. The alkali metal complex may include a metal ion selected from a Li ion, a Na ion, a K ion, a Rb ion, and a Cs ion, and the alkaline earth-metal complex may include a metal ion selected from a Be ion, a Mg ion, a Ca ion, a Sr ion, and a Ba ion. A ligand coordinated with the metal ion of the alkali metal complex or the alkaline earth-metal complex may be selected from a hydroxy quinoline, a hydroxy isoquinoline, a hydroxy benzoquinoline, a hydroxy acridine, a hydroxy phenanthridine, a hydroxy phenyl oxazole, a hydroxy phenylthiazole, a hydroxy diphenyl oxadiazole, a hydroxy diphenylthiadiazole, a hydroxy phenylpyridine, a hydroxy phenylbenzimidazole, a hydroxy phenylbenzothiazole, a bipyridine, a phenanthroline, and a cyclopentadiene, but embodiments of the present disclosure are not limited thereto.

For example, the metal-containing material may include a Li complex. The Li complex may include, for example, Compound ET-D1 (lithium quinolate, LiQ) or ET-D2:

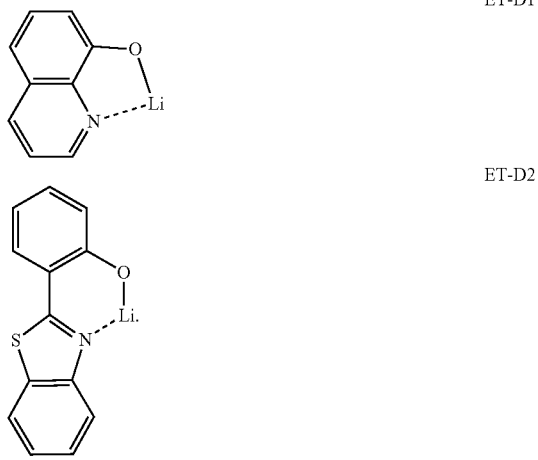

ET-D1

ET-D2

The electron transport region 170 may include an electron injection layer that facilitates injection of electrons from the cathode 190. The electron injection layer may directly contact (e.g., physically contact) the cathode 190.

The electron injection layer may have i) a single-layered structure including a single layer including a single material, ii) a single-layered structure including a single layer including a plurality of different materials, or iii) a multi-layered structure having a plurality of layers including a plurality of different materials.

The electron injection layer may include an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof.

The alkali metal may be selected from Li, Na, K, Rb, and Cs. In one embodiment, the alkali metal may be Li, Na, or Cs. In one or more embodiments, the alkali metal may be Li or Cs, but embodiments of the present disclosure are not limited thereto.

The alkaline earth metal may be selected from Mg, Ca, Sr, and Ba.

The rare earth metal may be selected from Sc, Y, Ce, Tb, Yb, and Gd.

The alkali metal compound, the alkaline earth-metal compound, and the rare earth metal compound may be selected from oxides and halides (for example, fluorides, chlorides, bromides, or iodides) of the alkali metal, the alkaline earth-metal, and the rare earth metal.

The alkali metal compound may be selected from alkali metal oxides, such as $Li_2O$, $Cs_2O$, or $K_2O$, and alkali metal halides, such as LiF, NaF, CsF, KF, LiI, NaI, CsI, KI, or RbI. In one embodiment, the alkali metal compound may be selected from LiF, $Li_2O$, NaF, LiI, NaI, CsI, and KI, but embodiments of the present disclosure are not limited thereto.

The alkaline earth-metal compound may be selected from alkaline earth-metal oxides, such as BaO, SrO, CaO, $Ba_xSr_{1-x}O$ ($0<x<1$), or $Ba_xCa_{1-x}O$ ($0<x<1$). In one embodiment, the alkaline earth-metal compound may be selected from BaO, SrO, and CaO, but embodiments of the present disclosure are not limited thereto.

The rare earth metal compound may be selected from $YbF_3$, $ScF_3$, $ScO_3$, $Y_2O_3$, $Ce_2O_3$, $GdF_3$, and $TbF_3$. In one embodiment, the rare earth metal compound may be selected from $YbF_3$, $ScF_3$, $TbF_3$, $YbI_3$, $ScI_3$, and $TbI_3$, but embodiments of the present disclosure are not limited thereto.

The alkali metal complex, the alkaline earth-metal complex, and the rare earth metal complex may include an ion of alkali metal, alkaline earth-metal, and rare earth metal as described above, and a ligand coordinated with a metal ion of the alkali metal complex, the alkaline earth-metal complex, or the rare earth metal complex may be selected from hydroxy quinoline, hydroxy isoquinoline, hydroxy benzoquinoline, hydroxy acridine, hydroxy phenanthridine, hydroxy phenyl oxazole, hydroxy phenylthiazole, hydroxy diphenyl oxadiazole, hydroxy diphenylthiadiazole, hydroxy phenylpyridine, hydroxy phenylbenzimidazole, hydroxy phenylbenzothiazole, bipyridine, phenanthroline, and cyclopentadiene, but embodiments of the present disclosure are not limited thereto.

The electron injection layer may include (or consist of) an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof, as described above. In one or more embodiments, the electron injection layer may further include an organic material. When the electron injection layer further includes an organic material, an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof may be homogeneously or non-homogeneously dispersed in a matrix including the organic material.

A thickness of the electron injection layer may be in a range of about 1 Å to about 100 Å, for example, about 3 Å to about 90 Å. When a thickness of the electron injection layer is within these ranges, suitable or satisfactory electron injection characteristics may be obtained without substantial increase in driving voltage.

Cathode 190

The cathode 190 may be on the organic layer 120 having a structure as described herein. A material for forming the cathode 190 may be metal, an alloy, an electrically conductive compound, and a combination thereof, which have a low work function.

The cathode 190 may include at least one selected from lithium (Li), silver (Ag), magnesium (Mg), aluminum (Al), aluminum-lithium (Al—Li), calcium (Ca), magnesium-indium (Mg—In), magnesium-silver (Mg—Ag), ITO, and IZO, but embodiments of the present disclosure are not limited thereto. The cathode 190 may be a transmissive electrode, a semi-transmissive electrode, or a reflective electrode.

The cathode 190 may have a single-layered structure, or a multi-layered structure including two or more layers.

In FIG. 1, a substrate may be additionally under the anode 110 (i.e., a surface not in contact (e.g., physical contact) with the organic layer) or above the cathode 190 (e.g., a surface not in contact (e.g., physical contact) with the organic layer). The substrate may be a glass substrate or a plastic substrate, each having excellent mechanical strength, thermal stability, transparency, surface smoothness, ease of handling, and water resistance.

In one or more embodiments, when the organic light-emitting device is a full-color organic light-emitting device, the emission layer may be patterned into a red emission layer, a green emission layer, and a blue emission layer according to an individual sub-pixel. In one or more embodiments, the light-emitting device may have a stacked structure of two or more layers selected from a red emission layer, a green emission layer, and a blue emission layer, in which the two or more layers contact (e.g., physically contact) each other or are separated from each other. In one or more embodiments, the emission layer may include two or more materials selected from a red light-emitting material, a green light-emitting material, and a blue light-emitting material, in which the two or more materials are mixed with each other in a single layer to emit white light.

The emission layer of the present disclosure may be applied to, not only the organic light-emitting device having the structure of FIG. 1, but also organic light-emitting device having various suitable structures.

In one embodiment, the organic light-emitting device 100 may further include a capping layer in a direction in which light is extracted. The capping layer may increase external luminescent efficiency according to the principle of constructive interference.

The capping layer may be an organic capping layer including an organic material, an inorganic capping layer including an inorganic material, or a composite capping layer including an organic material and an inorganic material.

The capping layer may include at least one material selected from carbocyclic compounds, heterocyclic compounds, amine-based compounds, porphyrine derivatives, phthalocyanine derivatives, a naphthalocyanine derivatives, alkali metal complexes, and alkaline earth-based complexes. The carbocyclic compound, the heterocyclic compound, and the amine-based compound may be optionally substituted with a substituent containing at least one element selected from O, N, S, Se, Si, F, Cl, Br, and I.

In one embodiment, the capping layer may include the amine-based compound.

In one or more embodiments, the capping layer may include a compound represented by Formula 201 or Formula 202.

In one or more embodiments, the capping layer may include a compound selected from Compounds HT28 to HT33 and Compounds CP1 to CP5, but embodiments of the present disclosure are not limited thereto:

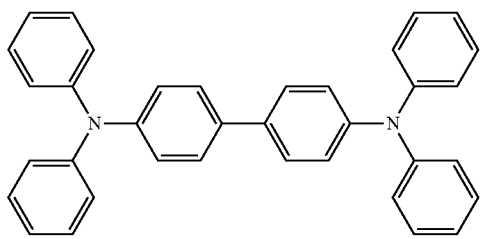

CP1

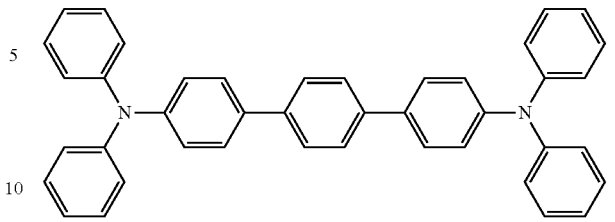

CP2

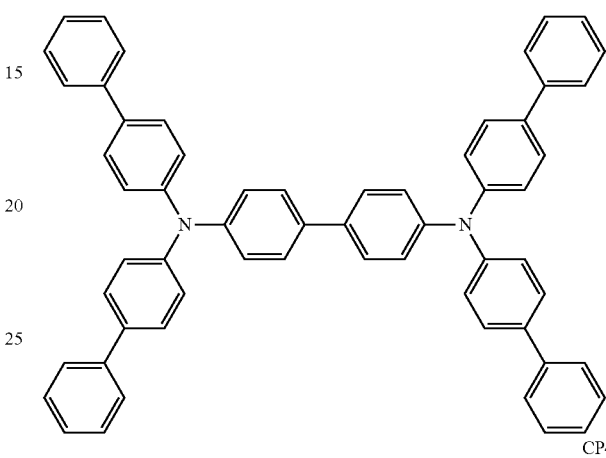

CP3

CP4

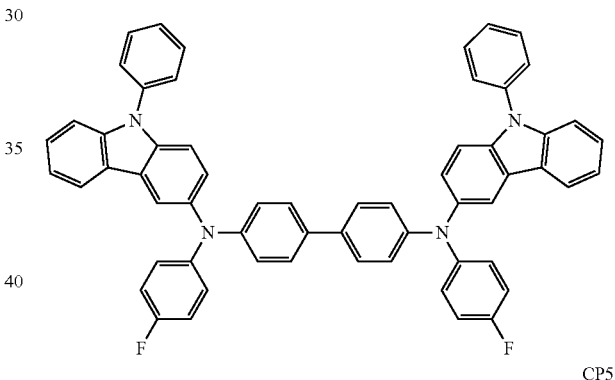

CP5

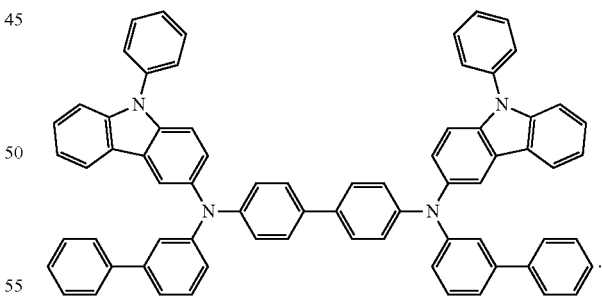

Hereinbefore, the organic light-emitting device according to an embodiment has been described in connection with FIG. 1, but embodiments of the present disclosure are not limited thereto.

Layers constituting the hole transport region, an emission layer, and layers constituting the electron transport region may be formed in a certain region by using one or more suitable methods selected from vacuum deposition, spin coating, casting, Langmuir-Blodgett (LB) deposition, ink-jet printing, laser-printing, and laser-induced thermal imaging.

When layers constituting the hole transport region, an emission layer, and layers constituting the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec by taking into account a material to be included in a layer to be formed, and the structure of a layer to be formed.

When the emission layer is formed, the first host and the second host of the first emission layer may be deposited in a state of being mixed at a set or predetermined ratio, and the third host and the fourth host of the second emission layer may also be deposited in a state of being mixed at a set or predetermined ratio. Therefore, when the first emission layer is formed, a mixture of the first host material and the second host material may be supplied from one crucible of a deposition apparatus and deposited, and when the second emission layer is formed, a mixture of the third host material and the fourth host material may be supplied from one crucible of a deposition apparatus and deposited.

When layers constituting the hole transport region, an emission layer, and layers constituting the electron transport region are formed by spin coating, the spin coating may be performed at a coating speed of about 2,000 rpm to about 5,000 rpm and at a heat treatment temperature of about 80° C. to about 200° C. by taking into account a material to be included in a layer to be formed, and the structure of a layer to be formed.

Apparatus

The organic light-emitting device may be included in various suitable apparatuses. For example, a light-emitting apparatus, an authentication apparatus, or an electronic apparatus, which includes the organic light-emitting device, may be provided.

The light-emitting apparatus may further include, in addition to the organic light-emitting device, a thin-film transistor including a source electrode and a drain electrode. One of the source electrode and the drain electrode of the thin-film transistor may be electrically coupled to one of the first electrode and the second electrode of the organic light-emitting device. The light-emitting apparatus may be used as various suitable displays, light sources, and/or the like.

The authentication apparatus may be, for example, a biometric authentication apparatus for authenticating an individual by using biometric information of a biometric body (for example, a finger tip, a pupil, or the like).

The authentication apparatus may further include, in addition to the organic light-emitting device, a biometric information collector.

The electronic apparatus may be applied to personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram (ECG) displays, ultrasonic diagnostic devices, or endoscope displays), fish finders, various suitable measuring instruments, meters (for example, meters for a vehicle, an aircraft, and a vessel), projectors, and the like, but embodiments of the present disclosure are not limited thereto.

General Definition of at Least Some of the Substituents

The term "$C_1$-$C_{60}$ alkyl group," as used herein, refers to a linear or branched aliphatic saturated hydrocarbon monovalent group having 1 to 60 carbon atoms, and examples thereof include a methyl group, an ethyl group, a propyl group, an isobutyl group, a sec-butyl group, a tert-butyl group, a pentyl group, an isoamyl group, and a hexyl group. The term "$C_1$-$C_{60}$ alkylene group," as used herein, refers to a divalent group having substantially the same structure as the $C_1$-$C_{60}$ alkyl group.

The term "$C_2$-$C_{60}$ alkenyl group," as used herein, refers to a hydrocarbon group having at least one carbon-carbon double bond at a main chain (e.g., in the middle) or at a terminal end (e.g., at the terminus) of the $C_2$-$C_{60}$ alkyl group, and examples thereof include an ethenyl group, a propenyl group, and a butenyl group. The term "$C_2$-$C_{60}$ alkenylene group," as used herein, refers to a divalent group having substantially the same structure as the $C_2$-$C_{60}$ alkenyl group.

The term "$C_2$-$C_{60}$ alkynyl group," as used herein, refers to a hydrocarbon group having at least one carbon-carbon triple bond at a main chain (e.g., in the middle) or at a terminal end (e.g., at the terminus) of the $C_2$-$C_{60}$ alkyl group, and examples thereof include an ethynyl group, and a propynyl group. The term "$C_2$-$C_{60}$ alkynylene group," as used herein, refers to a divalent group having substantially the same structure as the $C_2$-$C_{60}$ alkynyl group.

The term "$C_1$-$C_{60}$ alkoxy group," as used herein, refers to a monovalent group represented by —$OA_{101}$ (wherein $A_{101}$ is the $C_1$-$C_{60}$ alkyl group), and examples thereof include a methoxy group, an ethoxy group, and an isopropyloxy group.

The term "$C_3$-$C_{10}$ cycloalkyl group," as used herein, refers to a monovalent saturated hydrocarbon monocyclic group having 3 to 10 carbon atoms, and examples thereof include a cyclopropyl group, a cyclobutyl group, a cyclopentyl group, a cyclohexyl group, and a cycloheptyl group. The term "$C_3$-$C_{10}$ cycloalkylene group," as used herein, refers to a divalent group having substantially the same structure as the $C_3$-$C_{10}$ cycloalkyl group.

The term "$C_1$-$C_{10}$ heterocycloalkyl group," as used herein, refers to a monovalent monocyclic group having at least one heteroatom selected from N, O, Si, P, and S as a ring-forming atom and 1 to 10 carbon atoms, and examples thereof include a 1,2,3,4-oxatriazolidinyl group, a tetrahydrofuranyl group, and a tetrahydrothiophenyl group. The term "$C_1$-$C_{10}$ heterocycloalkylene group," as used herein, refers to a divalent group having substantially the same structure as the $C_1$-$C_{10}$ heterocycloalkyl group.

The term "$C_3$-$C_{10}$ cycloalkenyl group," as used herein, refers to a monovalent monocyclic group that has 3 to 10 carbon atoms and at least one carbon-carbon double bond in the ring thereof and no aromaticity (e.g., the ring and/or group is not aromatic), and examples thereof include a cyclopentenyl group, a cyclohexenyl group, and a cycloheptenyl group. The term "$C_3$-$C_{10}$ cycloalkenylene group," as used herein, refers to a divalent group having substantially the same structure as the $C_3$-$C_{10}$ cycloalkenyl group.

The term "$C_1$-$C_{10}$ heterocycloalkenyl group," as used herein, refers to a monovalent monocyclic group that has at least one heteroatom selected from N, O, Si, P, and S as a ring-forming atom, 1 to 10 carbon atoms, and at least one carbon-carbon double bond in its ring. Non-limiting examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group," as used herein, refers to a divalent group having substantially the same structure as the $C_1$-$C_{10}$ heterocycloalkenyl group.

The term "$C_6$-$C_{60}$ aryl group," as used herein, refers to a monovalent group having a carbocyclic aromatic system having 6 to 60 carbon atoms, and the term "$C_6$-$C_{60}$ arylene group," as used herein, refers to a divalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other (e.g., combined together).

The term "$C_1$-$C_{60}$ heteroaryl group," as used herein, refers to a monovalent group having a carbocyclic aromatic system that has at least one heteroatom selected from N, O, Si, P, and S as a ring-forming atom, in addition to 1 to 60 carbon atoms. The term "$C_1$-$C_{60}$ heteroarylene group," as used herein, refers to a divalent group having a carbocyclic aromatic system that has at least one heteroatom selected from N, O, Si, P, and S as a ring-forming atom, in addition to 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be condensed with each other (e.g., combined together).

The term "$C_6$-$C_{60}$ aryloxy group," as used herein, refers to —$OA_{102}$ (wherein $A_{102}$ is the $C_6$-$C_{60}$ aryl group), and the term "$C_6$-$C_{60}$ arylthio group," as used herein, indicates —$SA_{103}$ (wherein $A_{103}$ is the $C_6$-$C_{60}$ aryl group).

The term "$C_1$-$C_{60}$ heteroaryloxy group," as used herein, refers to —$OA_{104}$ (wherein $A_{104}$ is the $C_1$-$C_{60}$ heteroaryl group), and a $C_1$-$C_{60}$ arylthio group used herein indicates —$SA_{105}$ (wherein $A_{105}$ is the $C_1$-$C_{60}$ heteroaryl group).

The term "monovalent non-aromatic condensed polycyclic group," as used herein, refers to a monovalent group (for example, having 8 to 60 carbon atoms) having two or more rings condensed with each other (e.g., combined together), only carbon atoms as ring-forming atoms, and no aromaticity in its entire molecular structure (e.g., the entire molecular structure is not aromatic). An example of the monovalent non-aromatic condensed polycyclic group is a fluorenyl group. The term "divalent non-aromatic condensed polycyclic group," as used herein, refers to a divalent group having substantially the same structure as the monovalent non-aromatic condensed polycyclic group.

The term "monovalent non-aromatic condensed heteropolycyclic group," as used herein, refers to a monovalent group (for example, having 1 to 60 carbon atoms) having two or more rings condensed to each other (e.g., combined together), at least one heteroatom selected from N, O, Si, P, and S, other than carbon atoms, as a ring-forming atom, and no aromaticity in its entire molecular structure (e.g., the entire molecular structure is not aromatic). An example of the monovalent non-aromatic condensed heteropolycyclic group is a carbazolyl group. The term "divalent non-aromatic condensed heteropolycyclic group," as used herein, refers to a divalent group having substantially the same structure as the monovalent non-aromatic condensed heteropolycyclic group.

The term "$C_5$-$C_{60}$ carbocyclic group," as used herein, refers to a monocyclic or polycyclic group having 5 to 60 carbon atoms in which a ring-forming atom is a carbon atom only. The term "$C_5$-$C_{60}$ carbocyclic group," as used herein, refers to an aromatic carbocyclic group or a non-aromatic carbocyclic group. The $C_5$-$C_{60}$ carbocyclic group may be a ring, such as benzene, a monovalent group, such as a phenyl group, or a divalent group, such as a phenylene group. In one or more embodiments, depending on the number of substituents connected to the $C_5$-$C_{60}$ carbocyclic group, the $C_5$-$C_{60}$ carbocyclic group may be a trivalent group or a quadrivalent group.

The term "$C_1$-$C_{60}$ heterocyclic group," as used herein, refers to a group having substantially the same structure as the $C_5$-$C_{60}$ carbocyclic group, except that as a ring-forming atom, at least one heteroatom selected from N, O, Si, P, and S is used in addition to carbon (the number of carbon atoms may be in a range of 1 to 60).

In the present specification, at least one substituent of the substituted $C_5$-$C_{60}$ carbocyclic group, the substituted $C_1$-$C_{60}$ heterocyclic group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted $C_1$-$C_{60}$ hetero aryloxy group, the substituted $C_1$-$C_{60}$ hetero arylthio group, the substituted monovalent non-aromatic condensed polycyclic group, and the substituted monovalent non-aromatic condensed heteropolycyclic group may have at least one substituent selected from:

deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ hetero aryloxy group, a $C_1$-$C_{60}$ hetero arylthio group, a monovalent non-aromatic condensed polycyclic group, a monovalent non-aromatic condensed heteropolycyclic group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, and —$P(=O)(Q_{11})(Q_{12})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ hetero aryloxy group, a $C_1$-$C_{60}$ hetero arylthio group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ hetero aryloxy group, a $C_1$-$C_{60}$ hetero arylthio group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ hetero aryloxy group, a $C_1$-$C_{60}$ hetero arylthio group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), and —P(=O)($Q_{21}$)($Q_{22}$); and
—Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), and $Q_{11}$ to $Q_{13}$, $Q_{21}$ to $Q_{23}$, and $Q_{31}$ to $Q_{33}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a $C_1$-$C_{60}$ hetero aryloxy group, a $C_1$-$C_{60}$ hetero arylthio group, a monovalent non-aromatic condensed polycyclic group, a monovalent non-aromatic condensed heteropolycyclic group, a $C_1$-$C_{60}$ alkyl group substituted with at least one selected from deuterium, —F, and a cyano group, a $C_6$-$C_{60}$ aryl group substituted with at least one selected from deuterium, —F, and a cyano group, a biphenyl group, and a terphenyl group.

The term "Ph," as used herein, refers to a phenyl group, the term "Me," as used herein, refers to a methyl group, the term "Et," as used herein, refers to an ethyl group, the term "ter-Bu" or "Bu$^t$," as used herein, refers to a tert-butyl group, and the term "OMe," as used herein, refers to a methoxy group.

The term "biphenyl group," as used herein, refers to "a phenyl group substituted with a phenyl group." In other words, the "biphenyl group" is a substituted phenyl group having a $C_6$-$C_{60}$ aryl group as a substituent.

The term "terphenyl group," as used herein, refers to "a phenyl group substituted with a biphenyl group." In other words, the "terphenyl group" is a phenyl group having, as a substituent, a $C_6$-$C_{60}$ aryl group substituted with a $C_6$-$C_{60}$ aryl group.

* and *' used herein, unless defined otherwise, each refer to a binding site to a neighboring atom in a corresponding formula.

Hereinafter, an organic light-emitting device according to an embodiment will be described in more detail with reference to Examples.

EXAMPLES

In order to confirm charge balance characteristics and compare electron current characteristics in an organic light-emitting device, a hole only device (HOD) and an electron only device (EOD) were manufactured.

Experimental Example 1 (First Experimental Example): HOD for First Emission Layer (Host)

A Corning 15 Ω/cm$^2$ (1,200 Å) ITO glass substrate (anode) was cut to a size of 50 mm×50 mm×0.7 mm, sonicated with isopropyl alcohol and pure water each for 5 minutes, and then cleaned by exposure to ultraviolet rays and ozone for 30 minutes. Then, the ITO glass substrate was provided to a vacuum deposition apparatus.

Compound HT13 was vacuum-deposited on the ITO glass substrate to form a hole injection layer having a thickness of 700 Å, and Compound HT3 was vacuum-deposited on the hole injection layer to form a hole transport layer having a thickness of 800 Å.

A mixture of Compounds HT28 and H4 (mixed molar ratio of 6:4) was vacuum-deposited on the hole transfer layer to form an emission layer having a thickness of 400 Å.

Compound HT2 was vacuum-deposited on the emission layer to form an electron blocking layer having a thickness of 50 Å.

Al was vacuum-deposited on the electron blocking layer to form a cathode having a thickness of 120 Å, thereby completing the manufacture of an organic light-emitting device having the following structure.

ITO 1,200 Å/Compound HT13 700 Å/Compound HT3 800 Å/Compounds HT28:H4 (mixed molar ratio of 6:4) 400 Å/Compound HT2 50 Å/Al 120 Å

Experimental Example 2 (Second Experimental Example): HOD for Second Emission Layer (Host)

An organic light-emitting device was manufactured in substantially the same manner as in Experimental Example 1, except that a mixture of Compounds HT35 and ET28 (mixed molar ratio of 6:4) was used instead of the mixture of Compounds HT28 and H4 in forming an emission layer.

ITO 1,200 Å/Compound HT13 700 Å/Compound HT3 800 Å/Compounds HT35:ET28 (mixed molar ratio of 6:4) 400 Å/Compound HT2 50 Å/Al 120 Å

Experimental Example 3 (Third Experimental Example): HOD for First Emission Layer (Host+Dopant)

An organic light-emitting device was manufactured in substantially the same manner as in Experimental Example 1, except that 10 wt % of Compound PD23 was added as a dopant in forming an emission layer.

ITO 1,200 Å/Compound HT13 700 Å/Compound HT3 800 Å/Compounds HT28:H4 (mixed molar ratio of 6:4)+ Compound PD23 (10 weight %) 400 Å/Compound HT2 50 Å/Al 120 Å

Experimental Example 4 (Fourth Experimental Example): HOD for Second Emission Layer (Host+Dopant)

An organic light-emitting device was manufactured in substantially the same manner as in Experimental Example 2, except that 10 wt % of PD23 was added as a dopant in forming an emission layer.

ITO 1,200 Å/Compound HT13 700 Å/Compound HT3 800 Å/Compounds HT35:ET28 (mixed molar ratio of 6:4)+ Compound PD23 (10 weight %) 400 Å/Compound HT2 50 Å/Al 120 Å

Experimental Example 5 (Fifth Experimental Example): EOD for First Emission Layer (Host)

A Corning 15 Ω/cm$^2$ (1,200 Å) ITO glass substrate (anode) was cut to a size of 50 mm×50 mm×0.7 mm, sonicated with isopropyl alcohol and pure water each for 5 minutes, and then cleaned by exposure to ultraviolet rays and ozone for 30 minutes. Then, the ITO glass substrate was provided to a vacuum deposition apparatus.

LiQ was vacuum-deposited on the ITO glass substrate to form a hole blocking layer having a thickness of 50 Å.

A mixture of Compounds HT28 and H4 (mixed molar ratio of 6:4) was vacuum-deposited on the hole blocking layer to form an emission layer having a thickness of 400 Å and including a mixed host.

Compound ET1 and LiQ were co-deposited on the emission layer at a weight ratio of 1:1 to form an electron transport layer having a thickness of 300 Å.

LIQ was vacuum-deposited on the electron transport layer to form an electron injection layer having a thickness of 10 Å.

Al was vacuum-deposited on the electron injection layer to form a cathode having a thickness of 120 Å, thereby completing the manufacture of an organic light-emitting device having the following structure.

ITO 1,200 Å/LiQ 50 Å/Compounds HT28:H4 (mixed molar ratio of 6:4) 400 Å/Compound ET1:LiQ (weight ratio of 1:1) 300 Å/LiQ 10 Å/Al 120 Å

Experimental Example 6 (Sixth Experimental Example): EOD for Second Emission Layer (Host)

An organic light-emitting device was manufactured in substantially the same manner as in Experimental Example 5, except that a mixture of Compounds HT35 and ET28 (mixed molar ratio of 6:4) was used instead of the mixture of Compounds HT28 and H4 in forming an emission layer.

ITO 1,200 Å/LiQ 50 Å/Compounds HT35:ET28 (mixed molar ratio of 6:4) 400 Å/Compound ET1:LiQ (weight ratio of 1:1) 300 Å/LiQ 10 Å/Al 120 Å

Experimental Example 7 (Seventh Experimental Example): EOD for First Emission Layer (Host+Dopant)

An organic light-emitting device was manufactured in substantially the same manner as in Experimental Example 5, except that 10 wt % of Compound PD23 was added as a dopant in forming an emission layer.

ITO 1,200 Å/LiQ 50 Å/Compounds HT28:H4 (mixed molar ratio of 6:4)+Compound PD23 (10 weight %) 400 Å/Compound ET1:LiQ (weight ratio of 1:1) 300 Å/LiQ 10 Å/Al 120 Å

Experimental Example 8 (Eighth Experimental Example): EOD for Second Emission Layer (Host+Dopant)

An organic light-emitting device was manufactured in substantially the same manner as in Experimental Example 6, except that 10 wt % of Compound PD23 was added as a dopant in forming an emission layer.

ITO 1,200 Å/LiQ 50 Å/Compounds HT35:ET28 (mixed molar ratio of 6:4)+Compound PD23 (10 weight %) 400 Å/Compound ET1:LiQ (weight ratio of 1:1) 300 Å/LiQ 10 Å/Al 120 Å

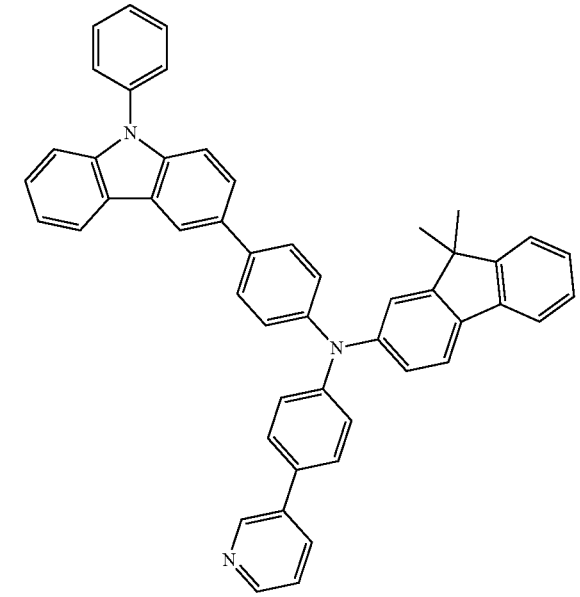

HT13

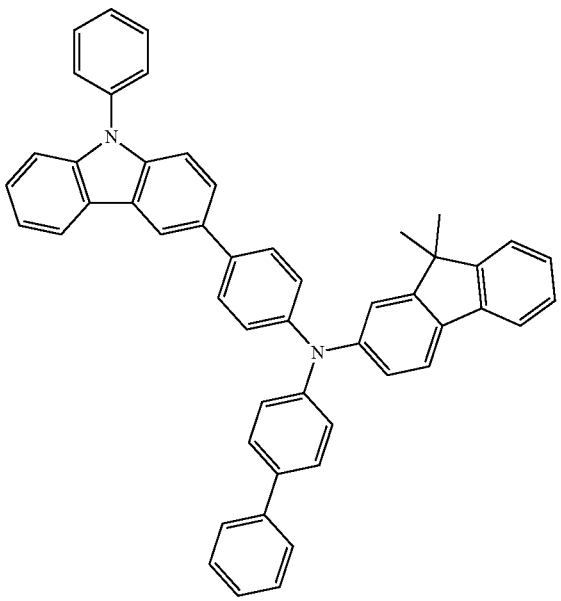

HT3

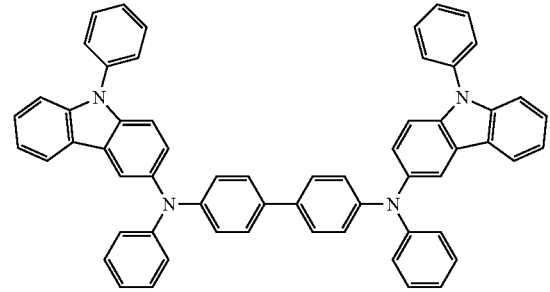

HT28

H4

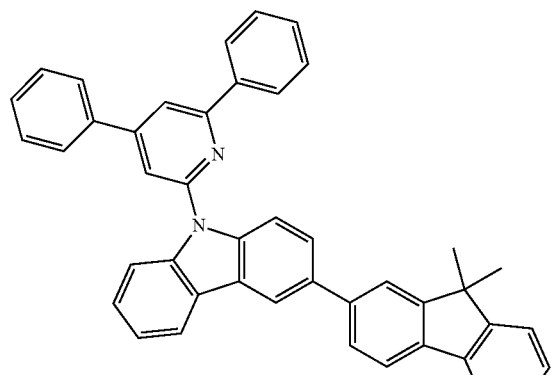

HT2

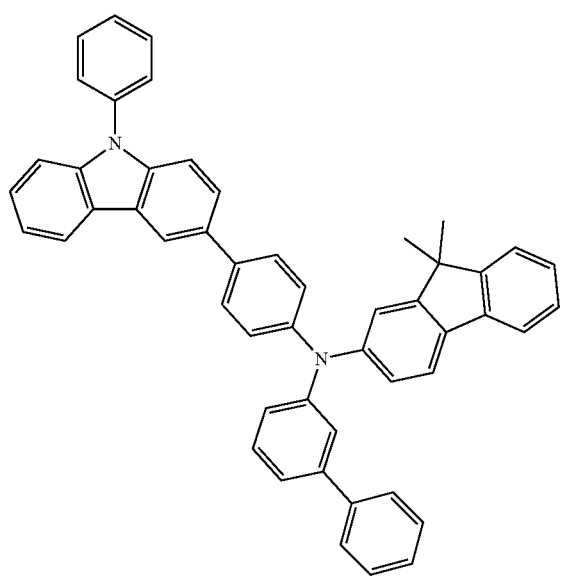

HT35

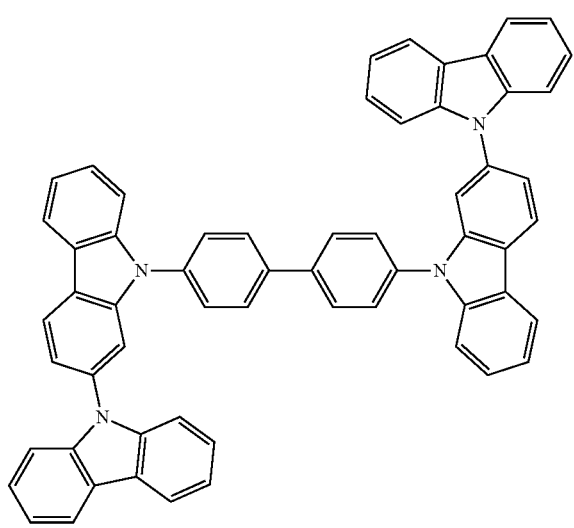

ET1

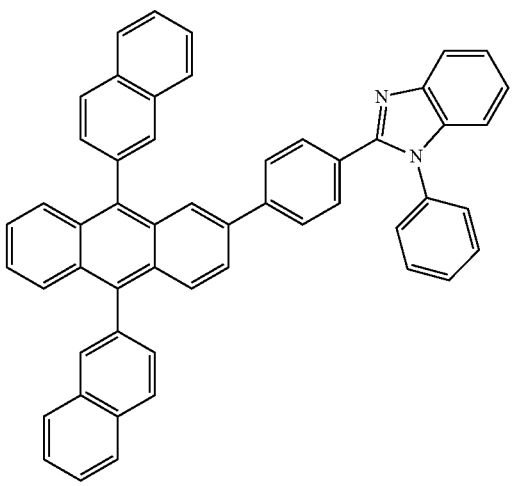

PD23

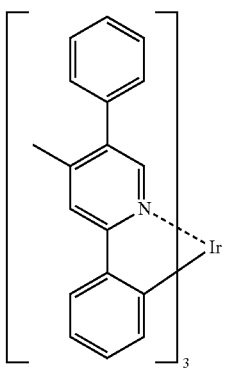

Evaluation Example 1: Evaluation of Hole Transport Capability and Electron Transport Capability The driving voltage and current density of the HOD and the EOD were measured by using a Keithley SMU 236.

Figure 2:
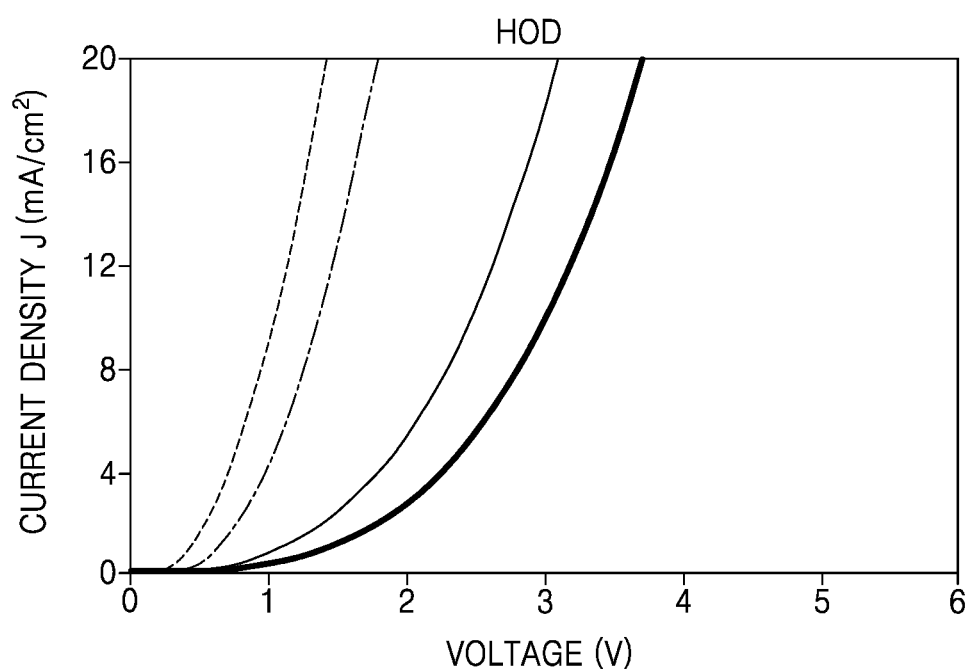
FIG. 2 is a current density-voltage graph in hole-only devices (HODs) manufactured according to Experimental Examples 1 to 4.

FIG. 2 is a current density-voltage graph in HODs manufactured according to Experimental Examples 1 to 4. The current densities measured in the HODs manufactured according to Experimental Examples 1 to 4 are current densities made by movements of holes.

Referring to the graph of FIG. 2, the driving voltages of Experimental Examples 1 and 2 in which only the host is included in the emission layer and no dopant is added are lower at the same current density than the driving voltages of Experimental Examples 3 and 4 in which both the host and the dopant are included in the emission layer.

When only the host is included in the emission layer, the driving voltage of Experimental Example 1 in which the host of the first emission layer is used is lower at the same current density than the driving voltage of Experimental Example 2 in which the host of the second emission layer is used.

In addition, when both the host and the dopant are included in the emission layer, the driving voltage of Experimental Example 3 in which the host and the dopant of the first emission layer are used is lower at the same current density than the driving voltage of Experimental Example 4 in which the host and the dopant of the second emission layer are used.

It is confirmed that the hole mobility of the emission layer in the case where the dopant is added is lower than the hole mobility of the emission layer in the case where only the host is used, and the hole mobility of the host of the first emission layer is higher than the hole mobility of the host of the second emission layer.

Figure 3:
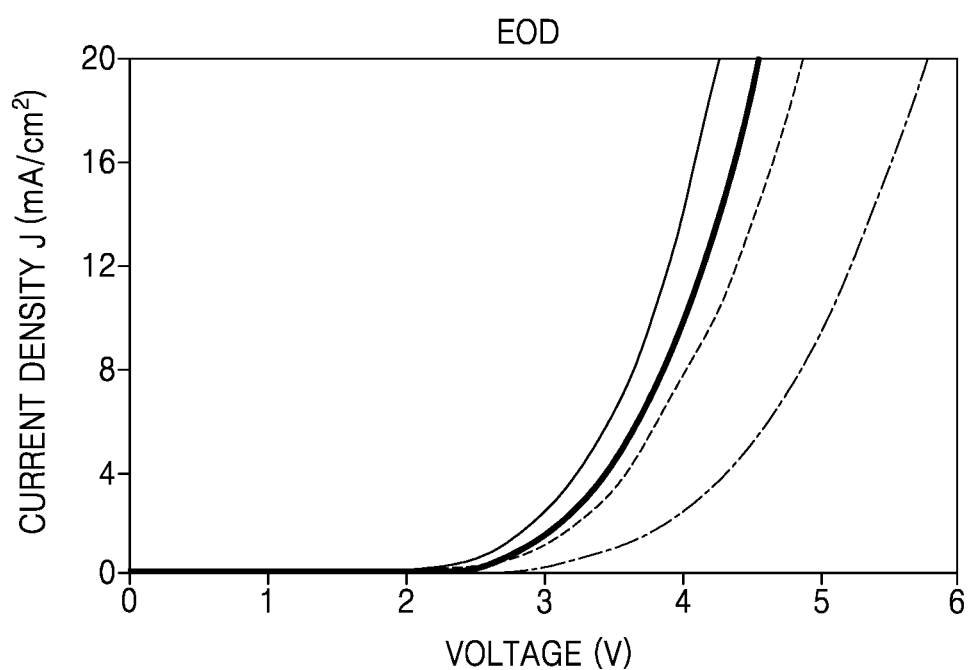
FIG. 3 is a current density-voltage graph in electron-only devices (EODs) manufactured according to Experimental Examples 5 to 8.

FIG. 3 is a current density-voltage graph in EODs manufactured according to Experimental Examples 5 to 8. The current densities measured in the EODs manufactured according to Experimental Examples 5 to 8 are current densities made by movements of electrons.

Referring to the graph of FIG. 3, in both the case where only the host is included in the emission layer and the case where the host and the dopant are included in the emission layer, the driving voltages of Experimental Examples 6 and 8 in which the host of the second emission layer is used are lower at the same current density than the driving voltages of Experimental Examples 5 and 7 in which the host of the first emission layer is used. For the same host material of the first emission layer, the driving voltage of Experimental Example 5 in which no dopant is used is lower at the same current density than the driving voltage of Experimental Example 7 in which the dopant is used. Similarly, for the same host material of the second emission layer, the driving voltage of Experimental Example 6 in which no dopant is used is lower at the same current density than the driving voltage of Experimental Example 8 in which the dopant is used.

It is confirmed that the electron mobility of the host of the second emission layer is higher than the electron mobility of the host of the first emission layer, and when the dopant is added to the same host material, the electron mobility is reduced.

From the current density-voltage graphs of FIGS. 2 and 3, it is confirmed that the first emission layer has more excellent hole transport capability, as compared with the second emission layer, and the second emission layer has more excellent electron transport capability, as compared with the first emission layer.

Experimental Example 9 (Ninth Experimental Example): First Emission Layer (400 Å)

A Corning 15 Ω/cm² (1,200 Å) ITO glass substrate (anode) was cut to a size of 50 mm×50 mm×0.7 mm, sonicated with isopropyl alcohol and pure water each for 5 minutes, and then cleaned by exposure to ultraviolet rays and ozone for 30 minutes. Then, the ITO glass substrate was provided to a vacuum deposition apparatus.

Compound HT13 was vacuum-deposited on the ITO glass substrate to form a hole injection layer having a thickness of 700 Å, and Compound HT3 was vacuum-deposited on the hole injection layer to form a hole transport layer having a thickness of 800 Å.

A mixture of Compounds HT28 and H4 (mixed molar ratio of 6:4) and 10 wt % of Compound PD23 were vacuum-deposited on the hole transport layer to form a single emission layer having a thickness of 400 Å.

Compound ET1 and LiQ (weight ratio of 1:1) were co-deposited on the emission layer to form an electron transport layer having a thickness of 300 Å.

LiQ was vacuum-deposited on the electron transport layer to form an electron injection layer having a thickness of 10 Å.

Al was vacuum-deposited on the electron injection layer to form a cathode having a thickness of 120 Å, thereby completing the manufacture of an organic light-emitting device having the following structure.

ITO 1,200 Å/Compound HT13 700 Å/Compound HT3 800 Å/Compounds HT28:H4 (mixed molar ratio of 6:4)+ Compound PD23 (10 weight %) 400 Å/Compound ET1:LiQ (weight ratio of 1:1) 300 Å/LiQ 10 Å/Al 120 Å

Experimental Example 10 (Tenth Experimental Example): Second Emission Layer (400 Å)

An organic light-emitting device was manufactured in substantially the same manner as in Experimental Example 9, except that a mixture of Compounds HT35 and ET28 (mixed molar ratio of 6:4) was used instead of the mixture of Compounds HT28 and H4 as a host of an emission layer.

Experimental Example 11 (Eleventh Experimental Example): First Emission Layer and Second Emission Layer (Thickness Ratio of 1:3)

An organic light-emitting device was manufactured in substantially the same manner as in Experimental Example 9, except that, as an emission layer, a first emission layer according to Experimental Example 9 was formed to a thickness of 100 Å and a second emission layer according to Experimental Example 10 was formed on the first emission layer to a thickness of 300 Å. Therefore, the emission layer was formed such that a thickness ratio of the first emission layer to the second emission layer was 1:3.

Experimental Example 12 (Twelfth Experimental Example): First Emission Layer and Second Emission Layer (Thickness Ratio of 1:1)

An organic light-emitting device was manufactured in substantially the same manner as in Experimental Example 11, except that, as an emission layer, a first emission layer was formed to a thickness of 200 Å and a second emission layer was formed on the first emission layer to a thickness of 200 Å. Therefore, the emission layer was formed such that a thickness ratio of the first emission layer to the second emission layer was 1:1.

Experimental Example 13 (Thirteenth Experimental Example): First Emission Layer and Second Emission Layer (Thickness Ratio of 3:1)

An organic light-emitting device was manufactured in substantially the same manner as in Experimental Example 11, except that, as an emission layer, a first emission layer was formed to a thickness of 300 Å and a second emission layer was formed on the first emission layer to a thickness of 100 Å. Therefore, the emission layer was formed such that a thickness ratio of the first emission layer to the second emission layer was 3:1.

Evaluation Example: Evaluation of Lifespan and Efficiency

The driving voltage, current efficiency, and lifespan ($LT_{50}$) of the organic light-emitting devices manufactured according to Experimental Examples 9 to 13 were measured by using a Keithley SMU 236 and a luminance meter PR650 (Spectroscan Source Measurement Unit, PhotoResearch).

Figure 4:
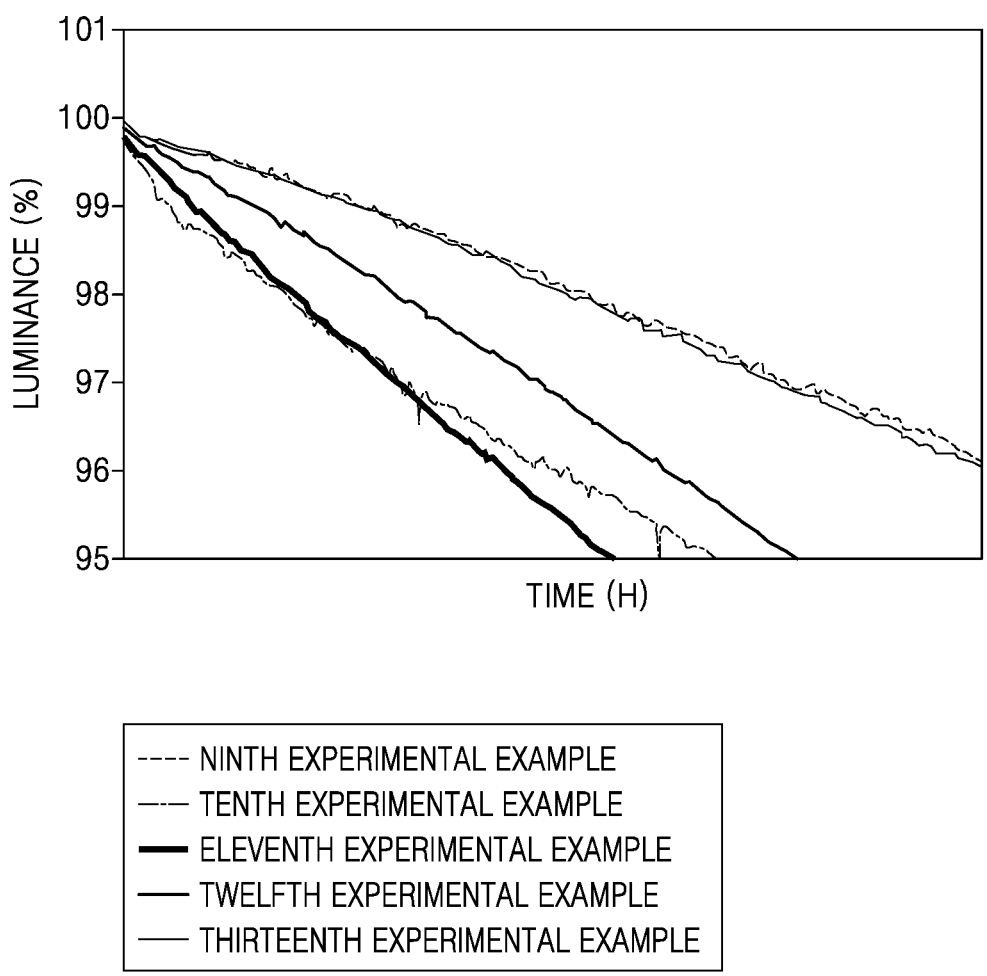
FIG. 4 is a graph showing the lifespan of organic light-emitting devices of Experimental Examples 9 to 13.

The lifespan of the organic light-emitting devices of Experimental Examples 9 to 13 is shown in the graph of FIG. 4. In the graph of FIG. 4, Y axis represents percent from the initial luminance (%), and the initial luminance was 30,000 cd/m$^2$.

Referring to the graph of FIG. 4, when the first emission layer was used solely as the emission layer (Experimental Example 9), the lifespan appeared to be long, and when the second emission layer was used solely as the emission layer (Experimental Example 10), the lifespan appeared to be short. When the first emission layer was used solely as the emission layer (Experimental Example 9), the luminescent efficiency appeared to be low, and when the second emission layer was used solely as the emission layer (Experimental Example 10), the luminescent efficiency appeared to be high. Therefore, the experiments have been performed on the expectation that the lifespan and the luminescent efficiency of the device may be increased at the same time when the first emission layer and the second emission layer are used together. From the graph of FIG. 4, it is confirmed that the lifespan is increased when the thickness ratio of the first emission layer to the second emission layer is changed to 1:3 (Experimental Example 11), 2:2 (Experimental Example 12), and 3:1 (Experimental Example 13).

The lifespan and the efficiency of the organic light-emitting devices of Experimental Examples 9 to 13 are shown in Table 1. The lifespan (97%) indicates the time that lapsed when luminance was 97% of initial luminance (100%).

TABLE 1

|  | Efficiency (cd/A) | CIE_x | Lifespan (97% (hr)) |
|---|---|---|---|
| Experimental Example 9 | 153 | 0.250 | 230 |
| Experimental Example 10 | 164 | 0.250 | 90 |
| Experimental Example 11 | 154 | 0.250 | 90 |
| Experimental Example 12 | 159 | 0.250 | 150 |
| Experimental Example 13 | 164 | 0.250 | 230 |

Referring to the efficiency of Table 1, in the case where the dual emission layer including the first emission layer and the second emission layer is used, the efficiency is increased by 7% or more, as compared with the case where only the first emission layer is used, and, the lifespan was equal or better. In addition, as compared with the case where only the second emission layer is used, the lifespan was increased 2.5 times, and the efficiency was equal. Thus, it is confirmed that the organic light-emitting device of Experimental Example 13 has high efficiency and a long lifespan.

The organic light-emitting device including the first emission layer and the second emission layer may improve the efficiency and lifespan.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, acts, operations, elements, and/or components, but do not preclude the presence or addition of one or more other features, integers, acts, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

What is claimed is:

1. An organic light-emitting device comprising:
   an anode;
   a cathode; and
   an organic layer between the anode and the cathode and comprising an emission layer,
   wherein the emission layer comprises:
      a first emission single layer comprising a first host, a second host, and a first dopant, and
      a second emission single layer comprising a third host, a fourth host, and a second dopant, and
   the organic light-emitting device satisfies Equations 1 and 2:

$$E_{HOMO1} - E_{HOMO2} \leq 0.2\ eV \qquad \text{Equation 1}$$

$$E_{HOMO3} - E_{HOMO4} \geq 0.3 eV \qquad \text{Equation 2,}$$

wherein, in Equations 1 and 2,
   $E_{HOMO1}$ is a highest occupied molecular orbital (HOMO) energy level of the first host,
   $E_{HOMO2}$ is a HOMO energy level of the second host,
   $E_{HOMO3}$ is a HOMO energy level of the third host, and
   $E_{HOMO4}$ is a HOMO energy level of the fourth host, and
   wherein the first emission single layer is in physical contact with the second emission single layer.

2. The organic light-emitting device of claim 1, wherein: the organic layer further comprises a hole transport region between the anode and the emission layer and an electron transport region between the emission layer and the cathode.

3. The organic light-emitting device of claim 2, wherein: the hole transport region comprises a hole injection layer, a hole transport layer, an emission auxiliary layer, an electron blocking layer, or any combination thereof.

4. The organic light-emitting device of claim 2, wherein: the electron transport region comprises a hole blocking layer, an electron transport layer, an electron injection layer, or any combination thereof.

5. The organic light-emitting device of claim 2, wherein: the first emission single layer is in contact with the hole transport region, and the second emission single layer is in contact with the electron transport region.

6. The organic light-emitting device of claim 1, wherein: a molar ratio of the first host to the second host in the first emission single layer is in a range of about 3:7 to about 9:1.

7. The organic light-emitting device of claim 1, wherein: a molar ratio of the third host to the fourth host in the second emission single layer is in a range of about 3:7 to about 9:1.

8. The organic light-emitting device of claim 1, wherein: the organic light-emitting device further satisfies Equations 1-1 and 2-1:

$$0 eV \leq E_{HOMO1} - E_{HOMO2} \leq 0.2 eV \qquad \text{Equation 1-1}$$

$$0.3 eV \leq E_{HOMO3} - E_{HOMO4} \leq 0.8 eV \qquad \text{Equation 2-1.}$$

9. The organic light-emitting device of claim 1, wherein: the first host is a hole transport host, and the second host is an electron transport host.

10. The organic light-emitting device of claim 1, wherein: the third host is a hole transport host, and the fourth host is an electron transport host.

11. The organic light-emitting device of claim 1, wherein: the first host and the third host are each independently a fluorene-based compound, a carbazole-based compound, a triarylamine-based compound, a dibenzofuran-based compound, a dibenzothiophene-based compound, or a dibenzosilole-based compound.

12. The organic light-emitting device of claim 1, wherein: the second host and the fourth host are each independently a triazine-based compound, a triazole-based compound, an imidazole-based compound, or an oxazine-based compound.

13. The organic light-emitting device of claim 1, wherein: the second host is a bipolar material capable of transporting both electrons and holes.

14. The organic light-emitting device of claim 1, wherein: the fourth host is a unipolar material capable of transporting electrons.

15. The organic light-emitting device of claim 1, wherein: the first dopant and the second dopant emit fluorescence, phosphorescence, or delayed fluorescence.

16. The organic light-emitting device of claim 1, wherein: the first emission single layer and the second emission single layer emit light having the same color.

17. An electronic apparatus comprising:
    the organic light-emitting device of claim 1; and
    a thin-film transistor,
    wherein the anode of the organic light-emitting device is electrically coupled to one of a source electrode and a drain electrode of the thin-film transistor.

18. The organic light-emitting device of claim 1, wherein a ratio $D_1:D_2$ of a thickness ($D_1$) of the first emission layer to a thickness ($D_2$) of the second emission layer is in a range of about 2:1 to about 5:1.

* * * * *